(12) United States Patent
Kimura

(10) Patent No.: US 8,710,749 B2
(45) Date of Patent: Apr. 29, 2014

(54) SEMICONDUCTOR DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/603,908

(22) Filed: Sep. 5, 2012

(65) Prior Publication Data

US 2013/0063041 A1    Mar. 14, 2013

(30) Foreign Application Priority Data

Sep. 9, 2011    (JP) .................................. 2011-196863

(51) Int. Cl.
*G09G 3/10*     (2006.01)

(52) U.S. Cl.
USPC ........... 315/169.3; 315/291; 345/76; 345/211

(58) Field of Classification Search
None
See application file for complete search history.

(56) References Cited

U.S. PATENT DOCUMENTS

| | | | |
|---|---|---|---|
| 4,417,162 A * | 11/1983 | Keller et al. .................... | 326/57 |
| 5,684,365 A | 11/1997 | Tang et al. | |
| 5,956,011 A | 9/1999 | Koyama et al. | |
| 6,037,924 A | 3/2000 | Koyama et al. | |
| 6,310,598 B1 | 10/2001 | Koyama et al. | |
| 6,518,945 B1 | 2/2003 | Pinkham | |
| 6,608,613 B2 | 8/2003 | Koyama et al. | |
| 6,709,901 B1 | 3/2004 | Yamazaki et al. | |
| 6,768,348 B2 | 7/2004 | Shionoiri et al. | |
| 6,774,577 B2 * | 8/2004 | Choi ........................... | 315/169.3 |
| 6,858,989 B2 | 2/2005 | Howard | |
| 6,873,116 B2 * | 3/2005 | Kimura et al. ............. | 315/169.1 |
| 7,015,884 B2 | 3/2006 | Kwon | |
| 7,057,588 B2 | 6/2006 | Asano et al. | |
| 7,068,246 B2 | 6/2006 | Yamazaki et al. | |
| 7,091,750 B2 | 8/2006 | Shionoiri et al. | |
| 7,129,917 B2 | 10/2006 | Yamazaki et al. | |
| 7,187,351 B2 * | 3/2007 | Kwon ............................. | 345/82 |
| 7,423,638 B2 | 9/2008 | Kwon | |
| 7,462,897 B2 | 12/2008 | Endo | |
| 7,518,580 B2 | 4/2009 | Kwon | |

(Continued)

FOREIGN PATENT DOCUMENTS

| | | |
|---|---|---|
| EP | 0 717 446 A2 | 6/1996 |
| EP | 1 220 191 A2 | 7/2002 |

(Continued)

OTHER PUBLICATIONS

J.H. Jung et al.; "A 14.1 inch Full color AMOLED Display With Top Emission Structure and a-Si TFT Backplane"; SID Digest '05 : SID International Symposium Digest of Technical Papers; 2005; pp. 1538-1541; vol. 36.

*Primary Examiner* — Crystal L Hammond
(74) *Attorney, Agent, or Firm* — Fish & Richardson P.C.

(57) ABSTRACT

A semiconductor device includes a transistor, a light-emitting element, a first wiring, a driver circuit having a function of controlling the potential of the first wiring, a second wiring, a first switch, a second switch, a third switch, a fourth switch, a first capacitor, and a second capacitor. One of a source and a drain of the transistor is connected to the light-emitting element. With this structure, voltage applied between the source and the gate of the transistor can be corrected in anticipation of variations in threshold voltage, so that the current supplied to the light-emitting element can be corrected.

20 Claims, 53 Drawing Sheets

(56) References Cited

U.S. PATENT DOCUMENTS

| | | | |
|---|---|---|---|
| 7,649,515 B2 | 1/2010 | Ozawa et al. | |
| 7,674,650 B2 | 3/2010 | Akimoto et al. | |
| 7,679,587 B2 | 3/2010 | Kwak | |
| 7,710,368 B2 | 5/2010 | Chung | |
| 7,714,813 B2 | 5/2010 | Uchino et al. | |
| 7,724,245 B2 | 5/2010 | Miyazawa | |
| 7,843,442 B2 | 11/2010 | Choi | |
| 7,889,159 B2 * | 2/2011 | Nathan et al. | 345/82 |
| 8,120,556 B2 * | 2/2012 | Kim | 345/82 |
| 8,159,449 B2 * | 4/2012 | Kimura et al. | 345/102 |
| 8,395,604 B2 * | 3/2013 | Kimura | 345/204 |
| 2001/0043168 A1 | 11/2001 | Koyama et al. | |
| 2003/0103022 A1 | 6/2003 | Noguchi et al. | |
| 2003/0112208 A1 | 6/2003 | Okabe et al. | |
| 2003/0117352 A1 | 6/2003 | Kimura | |
| 2003/0132931 A1 | 7/2003 | Kimura et al. | |
| 2003/0137503 A1 | 7/2003 | Kimura et al. | |
| 2003/0201729 A1 * | 10/2003 | Kimura et al. | 315/169.3 |
| 2004/0017161 A1 * | 1/2004 | Choi | 315/169.3 |
| 2004/0070557 A1 | 4/2004 | Asano et al. | |
| 2004/0080474 A1 | 4/2004 | Kimura | |
| 2004/0174349 A1 | 9/2004 | Libsch et al. | |
| 2004/0174354 A1 | 9/2004 | Ono et al. | |
| 2004/0207614 A1 | 10/2004 | Yamashita et al. | |
| 2005/0057459 A1 | 3/2005 | Miyazawa | |
| 2005/0083270 A1 | 4/2005 | Miyazawa | |
| 2005/0140600 A1 | 6/2005 | Kim | |
| 2005/0200618 A1 * | 9/2005 | Kim et al. | 345/204 |
| 2005/0206593 A1 | 9/2005 | Kwon | |
| 2005/0237273 A1 | 10/2005 | Ozawa et al. | |
| 2005/0259051 A1 | 11/2005 | Lee et al. | |
| 2005/0269959 A1 | 12/2005 | Uchino et al. | |
| 2006/0066532 A1 | 3/2006 | Jeong | |
| 2006/0125408 A1 * | 6/2006 | Nathan et al. | 315/169.3 |
| 2006/0156121 A1 | 7/2006 | Chung | |
| 2006/0221005 A1 | 10/2006 | Omata et al. | |
| 2006/0238461 A1 | 10/2006 | Goh et al. | |
| 2006/0255837 A1 | 11/2006 | Shionoiri et al. | |
| 2006/0279499 A1 | 12/2006 | Park et al. | |
| 2007/0001958 A1 | 1/2007 | Lee | |
| 2007/0002084 A1 | 1/2007 | Kimura et al. | |
| 2007/0040772 A1 | 2/2007 | Kim | |
| 2007/0063993 A1 | 3/2007 | Shishido | |
| 2007/0064469 A1 | 3/2007 | Umezaki | |
| 2007/0085847 A1 | 4/2007 | Shishido | |
| 2007/0103419 A1 | 5/2007 | Uchino et al. | |
| 2007/0120785 A1 | 5/2007 | Kimura | |
| 2007/0120795 A1 | 5/2007 | Uchino et al. | |
| 2007/0126665 A1 | 6/2007 | Kimura | |
| 2007/0200793 A1 | 8/2007 | Kwon | |
| 2007/0242031 A1 * | 10/2007 | Kimura et al. | 345/102 |
| 2007/0273618 A1 * | 11/2007 | Hsieh et al. | 345/76 |
| 2008/0225061 A1 | 9/2008 | Kimura et al. | |
| 2009/0051674 A1 * | 2/2009 | Kimura et al. | 345/204 |
| 2010/0079357 A1 | 4/2010 | Ozawa et al. | |
| 2010/0156877 A1 * | 6/2010 | Kimura | 345/211 |
| 2013/0063041 A1 * | 3/2013 | Kimura | 315/291 |

FOREIGN PATENT DOCUMENTS

| | | |
|---|---|---|
| EP | 1 632 930 A1 | 3/2006 |
| JP | 08-234683 A | 9/1996 |
| JP | 2002-215096 A | 7/2002 |
| JP | 2003-195810 A | 7/2003 |
| JP | 2004-133240 A | 4/2004 |
| JP | 2004-280059 A | 10/2004 |
| JP | 2004-295131 A | 10/2004 |
| JP | 2004-361640 A | 12/2004 |
| JP | 2005-189381 A | 7/2005 |
| JP | 2005-189387 A | 7/2005 |
| JP | 2005-189643 A | 7/2005 |
| JP | 2005-227625 A | 8/2005 |
| JP | 2005-309150 A | 11/2005 |
| JP | 2005-326754 A | 11/2005 |
| JP | 2006-215275 A | 8/2006 |
| JP | 2006-235609 A | 9/2006 |

* cited by examiner

| cell(i, j)   | T11 | T12 | T13 | T14 |     |
|--------------|-----|-----|-----|-----|-----|
| cell(i+1, j) |     | T11 | T12 | T13 | T14 |

| cell(i, j) | T11 | T12 | T13 | T14 | |
|---|---|---|---|---|---|
| cell(i+1, j) | | T11 | T12 | T13 | T14 |

| cell(i, j) | T11 | T12 | T13 | T14 | |
|---|---|---|---|---|---|
| cell(i+1, j) | | T11 | T12 | T13 | T14 |

T11

T12

T13

T14

T11

T12

T13

T14

SEMICONDUCTOR DEVICE

BACKGROUND OF THE INVENTION

1. Field of the Invention

The present invention relates to semiconductor devices, light-emitting devices, and display devices. The present invention relates to methods for driving such devices and methods for manufacturing such devices. Examples of semiconductor devices are semiconductor devices including active elements such as transistors. Examples of light-emitting devices are light-emitting devices including light-emitting elements such as electroluminescence elements (hereinafter referred to as EL elements). Examples of display devices are display devices including display elements or light-emitting elements such as EL elements. In particular, the present invention relates to semiconductor devices, light-emitting devices, and display devices that are less influenced by variations in characteristics of transistors.

2. Description of the Related Art

Since light-emitting devices including light-emitting elements have high visibility, are suitable for reduction in thickness, and do not have limitations on viewing angles, the light-emitting devices have attracted attention as display devices that are alternatives to cathode ray tubes (CRTs) or liquid crystal display devices. Specifically proposed structures of active matrix display devices including light-emitting elements differ depending on manufacturers. In general, at least a light-emitting element, a transistor (a switching transistor) that controls input of video signals to pixels, and a transistor (a driving transistor) that controls the amount of current supplied to the light-emitting element are provided in each pixel.

When all the transistors in the pixels have the same polarity, it is possible to omit some of steps of forming the transistors, e.g., a step of adding an impurity element imparting conductivity to a semiconductor layer. Patent Document 1 discloses a display device in which transistors included in pixels are all n-channel transistors.

REFERENCE

Patent Document 1: Japanese Published Patent Application No. 2003-195810

SUMMARY OF THE INVENTION

In a semiconductor device such as a light-emitting device or a display device, drain current of a driving transistor is supplied to a light-emitting element; thus, when characteristics and the like of driving transistors vary among pixels, the luminance of display elements such as light-emitting elements varies correspondingly. Thus, in order to improve the quality of a semiconductor device, it is important to propose a pixel structure in which the amount of drain current of a driving transistor can be corrected in anticipation of variations in threshold voltage, for example.

In view of the above problem, it is an object of one embodiment of the present invention to provide a semiconductor device, a light-emitting device, or a display device that is less influenced by variations in characteristics of transistors. It is an object of one embodiment of the present invention to provide a semiconductor device, a light-emitting device, or a display device that is less influenced by degradation of characteristics of a transistor. It is an object of one embodiment of the present invention to provide a semiconductor device, a light-emitting device, or a display device in which variations in luminance due to variations in threshold voltage of driving transistors are reduced. It is an object of one embodiment of the present invention to provide a semiconductor device, a light-emitting device, or a display device in which variations in luminance due to variations in mobility of driving transistors are reduced. It is an object of one embodiment of the present invention to provide a semiconductor device, a light-emitting device, or a display device that displays high-quality images. It is an object of one embodiment of the present invention to provide a semiconductor device, a light-emitting device, or a display device that displays images with little unevenness. It is an object of one embodiment of the present invention to provide a semiconductor device, a light-emitting device, or a display device in which a desired circuit can be formed with a small number of transistors. It is an object of one embodiment of the present invention to provide a semiconductor device, a light-emitting device, or a display device in which a desired circuit can be formed with a small number of wirings. It is an object of one embodiment of the present invention to provide a semiconductor device, a light-emitting device, or a display device that is less influenced by degradation of a light-emitting element. It is an object of one embodiment of the present invention to provide a semiconductor device, a light-emitting device, or a display device that is manufactured in a small number of steps.

Note that the description of these objects does not impede the existence of other objects. In one embodiment of the present invention, there is no need to achieve all the objects. Other objects will be apparent and can be derived from the description of the specification, the drawings, the claims, and the like.

A semiconductor device according to one embodiment of the present invention includes a transistor, a load, a first wiring, a second wiring, a first switch, a second switch, a third switch, a fourth switch, a first capacitor, and a second capacitor. The first switch has a function of selecting conduction or non-conduction between the first wiring and one of a pair of electrodes of the first capacitor. One of the pair of electrodes of the first capacitor is electrically connected to one of a pair of electrodes of the second capacitor. The second switch has a function of selecting conduction or non-conduction between the other of the pair of electrodes of the first capacitor and one of a source and a drain of the transistor. The other of the pair of electrodes of the first capacitor is electrically connected to a gate of the transistor. The third switch has a function of selecting conduction or non-conduction between one of the pair of electrodes of the first capacitor and the other of the source and the drain of the transistor. The other of the pair of electrodes of the second capacitor is electrically connected to the load. The other of the source and the drain of the transistor is electrically connected to the load. The fourth switch has a function of selecting conduction or non-conduction between the second wiring and one of the source and the drain of the transistor.

In the semiconductor device with the above structure, voltage applied between the source and the gate of the transistor (hereinafter also referred to as the driving transistor) can be corrected in anticipation of variations in threshold voltage. Thus, the drain current of the transistor can be corrected. Further, the drain current can be supplied to the load.

A given element or circuit can be used as the load. For example, a light-emitting element such as an EL element can be used as the load. A light-emitting element such as an EL element emits light at luminance that is proportional to the amount of current flowing between an anode and a cathode of the light-emitting element. Alternatively, a pixel can be used as the load, for example.

In the case where a light-emitting element is used as the load, a structure of Type A or Type B can be employed.

(Type A)

In the semiconductor device according to one embodiment of the present invention, the other of the source and the drain of the transistor (the driving transistor) can be electrically connected to the anode of the light-emitting element. In that case, the transistor is an n-channel transistor. In addition, the cathode of the light-emitting element can be electrically connected to a third wiring that is different from the first wiring and the second wiring. Here, the semiconductor device includes a unit (e.g., a driver circuit) having a function of controlling the potential of the first wiring. The unit (the driver circuit) controls the potential of the first wiring so that a period during which the potential of the first wiring is equal to or lower than the potential of the cathode of the light-emitting element is provided.

(Type B)

In the semiconductor device according to one embodiment of the present invention, the other of the source and the drain of the transistor (the driving transistor) can be electrically connected to the cathode of the light-emitting element. In that case, the transistor is a p-channel transistor. In addition, the anode of the light-emitting element can be electrically connected to the third wiring. Here, the semiconductor device includes a unit (e.g., a driver circuit) having a function of controlling the potential of the first wiring. The unit (the driver circuit) controls the potential of the first wiring so that a period during which the potential of the first wiring is equal to or higher than the potential of the anode of the light-emitting element is provided.

Each of the first to fourth switches can be a transistor. The transistor can have the same conductivity type as the driving transistor.

The semiconductor device according to one embodiment of the present invention can include a transistor whose channel is formed using an oxide semiconductor layer. Alternatively, the semiconductor device can include a transistor whose channel is formed using single crystal silicon (e.g., a single crystal silicon layer or a single crystal silicon substrate). Alternatively, the semiconductor device can include a transistor whose channel is formed using polycrystalline silicon. Alternatively, the semiconductor device can include a transistor whose channel is formed using amorphous silicon.

In one embodiment of the present invention, it is possible to determine voltage applied between a source and a gate of a driving transistor depending on the threshold voltage of the driving transistor. Thus, it is possible to provide a semiconductor device, a light-emitting device, or a display device that is less influenced by variations in characteristics of transistors. It is possible to provide a semiconductor device, a light-emitting device, or a display device that is less influenced by degradation of characteristics of a transistor. It is possible to provide a semiconductor device, a light-emitting device, or a display device in which variations in luminance due to variations in threshold voltage of driving transistors are reduced. It is possible to provide a semiconductor device, a light-emitting device, or a display device in which variations in luminance due to variations in mobility of driving transistors are reduced. It is possible to provide a semiconductor device, a light-emitting device, or a display device that displays high-quality images. It is possible to provide a semiconductor device, a light-emitting device, or a display device that displays images with little unevenness. It is possible to provide a semiconductor device, a light-emitting device, or a display device in which a desired circuit can be formed with a small number of transistors. It is possible to provide a semiconductor device, a light-emitting device, or a display device in which a desired circuit can be formed with a small number of wirings. It is possible to provide a semiconductor device, a light-emitting device, or a display device that is less influenced by degradation of a light-emitting element. It is possible to provide a semiconductor device, a light-emitting device, or a display device that is manufactured in a small number of steps.

DETAILED DESCRIPTION OF THE INVENTION

Figure 1A:
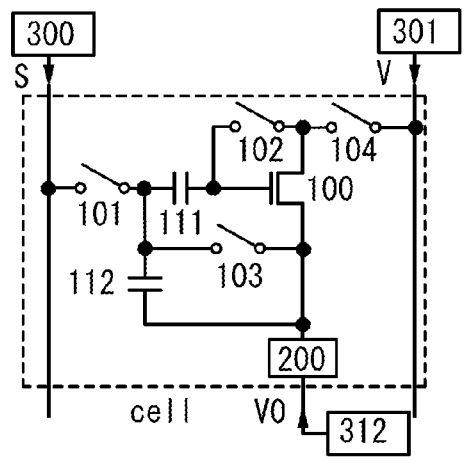
FIGS. 1A to 1E are circuit diagrams each illustrating the configuration of a semiconductor device.

Embodiments of the present invention will be hereinafter described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below. In structures given below, the same portions or portions having similar functions are denoted by the same reference numerals in different drawings, and explanation thereof will not be repeated.

Note that what is described in one embodiment (or part of the content) can be applied to, combined with, or replaced with different content (or part thereof) in the embodiment and/or content (or part thereof) described in another embodiment or other embodiments.

Note that the structure illustrated in a diagram (or part thereof) in one embodiment can be combined with the structure of another part of the diagram, the structure illustrated in a different diagram (or part thereof) in the embodiment, and/or the structure illustrated in a diagram (or part thereof)) in another embodiment or other embodiments.

Note that the size, thickness, and regions in the drawings are exaggerated for clarity in some cases. Thus, one aspect of an embodiment of the present invention is not limited to such scales. Alternatively, drawings schematically illustrate an ideal example. Thus, one aspect of an embodiment of the present invention is not limited to shapes illustrated in the drawings and can include variations in shape due to a fabrication technique or dimensional deviation, for example.

Note that an explicit description "X and Y are connected" indicates the case where X and Y are electrically connected, the case where X and Y are functionally connected, and the case where X and Y are directly connected. Here, each of X and Y denotes an object (e.g., a device, an element, a circuit, a wiring, an electrode, a terminal, a conductive film, a layer, a display element, a light-emitting element, or a load). Accordingly, a connection relation other than those shown in drawings and texts is also included without limitation to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a DC-DC converter, a step-up DC-DC converter, or a step-down DC-DC converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generator circuit; a memory circuit; and/or a control circuit) can be connected between X and Y. When a signal output from X is transmitted to Y, it can be said that X and Y are functionally connected even if another circuit is provided between X and Y.

Note that an explicit description "X and Y are connected" means that X and Y are electrically connected, X and Y are functionally connected, and X and Y are directly connected. That is, the explicit description "X and Y are electrically connected" is the same as an explicit simple expression "X and Y are connected".

Even when independent components are electrically connected to each other in a circuit diagram, one component has functions of a plurality of components in some cases. For example, when part of a wiring also functions as an electrode, one conductive layer functions as the wiring and the electrode. Thus, "electrical connection" in this specification includes in its category such a case where one conductive layer has functions of a plurality of components.

Note that it might be possible for those skilled in the art to constitute one embodiment of the invention even when portions to which all terminals of an active element (e.g., a transistor or a diode), a passive element (e.g., a capacitor or a resistor), or the like are connected are not specified. In particular, in the case where the number of portions to which the terminal is connected is plural, it is not necessary to specify the portions to which the terminal is connected. Therefore, it might be possible to constitute one embodiment of the invention by specifying portions to which only some of terminals of an active element (e.g., a transistor or a diode), a passive element (e.g., a capacitor or a resistor), or the like are connected.

Note that it might be possible for those skilled in the art to specify the invention when at least where a circuit is to be connected ("connection point") is specified. Alternatively, it might be possible for those skilled in the art to specify the invention when at least a function of a circuit is specified. Therefore, when a connection point of a circuit is specified, the circuit is disclosed as one embodiment of the invention even if a function is not specified, and one embodiment of the invention can be constructed. Alternatively, when a function of a circuit is specified, the circuit is disclosed as one embodiment of the invention even if a connection point is not specified, and one embodiment of the invention can be constructed.

The invention excluding content that is not specified in the drawings and texts in this specification can be constructed. Alternatively, when the range of a value (e.g., the maximum and minimum values) is described, the range may be freely narrowed or a value in the range may be excluded, so that the invention can be specified by a range part of which is excluded. In this manner, it is possible to specify the scope of the present invention so that a conventional technology is excluded, for example.

As a specific example, assuming that a circuit including first to fifth transistors is illustrated in a circuit diagram, the invention can be defined as the circuit that does not include a sixth transistor. Alternatively, the invention can be defined as the circuit that does not include a capacitor. Further, the invention can be constructed by specifying that the circuit does not include a sixth transistor with a particular connection. Alternatively, the invention can be constructed by specifying that the circuit does not include a capacitor with a particular connection. For example, the invention can be defined by specifying that the circuit does not include a sixth transistor whose gate is connected to a gate of the third transistor. Alternatively, for example, the invention can be defined by specifying that the circuit does not include a capacitor whose first electrode is connected to the gate of the third transistor.

As another specific example, when the expression "a voltage preferably ranges from 3 V to 10 V" is used to describe a given value, the invention can be defined, for example, by excluding the case where the voltage is higher than or equal to −2 V and lower than or equal to 1 V. Alternatively, for example, the invention can be defined by excluding the case where the voltage is higher than or equal to 13 V. Note that for example, it can be specified that the voltage is higher than or equal to 5 V and lower than or equal to 8 V in the invention. Moreover, it can be specified, in the invention, that the voltage is approximately 9 V or that the voltage is higher than or equal to 3 V and lower than 9 V and higher than 9 V and lower than or equal to 10 V As another specific example, when the expression "a voltage is preferably 10 V" is used to describe a given value, the invention can be defined, for example, by excluding the case where the voltage is higher than or equal to −2 V and lower than or equal to 1 V. Alternatively, for example, the invention can be defined by excluding the case where the voltage is higher than or equal to 13 V.

As another specific example, when the expression "a film is an insulating film" is used to describe properties of a material, the invention can be defined, for example, by excluding the case where the insulating film is an organic insulating film. Alternatively, for example, the invention can be defined by excluding the case where the insulating film is an inorganic insulating film.

As another specific example, when the expression "a film is provided between A and B" is used to describe a layered structure, the invention can be defined, for example, by excluding the case where the film is not a stack of four or more layers.

Alternatively, for example, the invention can be defined by excluding the case where a conductive film is not provided between A and the film.

Embodiment 1

One embodiment of a semiconductor device according to the present invention is described. A semiconductor device according to one embodiment of the present invention can be used not only as a pixel including a light-emitting element but also as a variety of circuits. For example, the semiconductor device can be used as an analog circuit and a circuit functioning as a current source. First, in this embodiment, examples of a basic principle of a circuit disclosed in the present invention are described. FIG. 1A is a circuit diagram illustrating one embodiment of a semiconductor device according to the present invention.

In FIG. 1A, the semiconductor device includes a transistor 100, a load 200, a wiring S, a wiring V, a switch 101, a switch 102, a switch 103, a switch 104, a capacitor 111, and a capacitor 112. The switch 101 has a function of selecting conduction or non-conduction between the wiring S and one of a pair of electrodes of the capacitor 111. One of the pair of electrodes of the capacitor 111 is connected to one of a pair of electrodes of the capacitor 112. The switch 102 has a function of selecting conduction or non-conduction between the other of the pair of electrodes of the capacitor 111 and one of a source and a drain of the transistor 100. The other of the pair of electrodes of the capacitor 111 is connected to a gate of the transistor 100. The switch 103 has a function of selecting conduction or non-conduction between one of the pair of electrodes of the capacitor 111 and the other of the source and the drain of the transistor 100. The other of the pair of electrodes of the capacitor 112 is connected to one terminal of the load 200. The other of the source and the drain of the transistor 100 is connected to one terminal of the load 200. The switch 104 has a function of selecting conduction or non-conduction between the wiring V and one of the source and the drain of the transistor 100. The other terminal of the load 200 can be connected to a wiring V0.

Note that a switch is an element having a function of selecting conduction (ON) or non-conduction (OFF) between terminals and a function of determining whether current flows. An electrical switch, a mechanical switch, or the like can be used as the switch. For example, the switch can be a transistor, a diode, or a switch formed by a micro electro mechanical systems (MEMS) technology, such as a digital micromirror device (DMD). The switch may be a logic circuit in which transistors are combined. In the case where a transistor is used as the switch, the polarity (conductivity type) of the transistor is not particularly limited. Note that a transistor with low off-state current is preferably used and the polarity of the transistor is preferably selected in accordance with an input potential.

Examples of a transistor with low off-state current are a transistor provided with an LDD region, a transistor with a multi-gate structure, and a transistor including an oxide semiconductor in a semiconductor layer. In the case where a combination of transistors operates as a switch, a complementary switch using an n-channel transistor and a p-channel transistor may be employed. A complementary switch can operate properly even when a potential input to the switch is changed relatively compared to an output potential.

Note that when a transistor is used as a switch, the switch includes an input terminal (one of a source and a drain), an output terminal (the other of the source and the drain), and a terminal for controlling conduction (a gate) in some cases. When a diode is used as a switch, the switch does not include a terminal for controlling conduction in some cases. Thus, when a diode is used as a switch, the number of wirings for controlling terminals can be reduced as compared to the case where a transistor is used.

Note that a transistor is an element having at least three terminals: a gate, a drain, and a source. The transistor has a channel region between the drain (a drain terminal, a drain region, or a drain electrode) and the source (a source terminal, a source region, or a source electrode) and can supply current through the drain, the channel region, and the source. Here, since the source and the drain of the transistor change depending on the structure, operating condition, and the like of the transistor, it is difficult to define which is a source or a drain. Thus, a region which serves as a source or a region which serves as a drain is not referred to as a source or a drain in some cases. In that case, one of the source and the drain might be referred to as a first terminal, a first electrode, or a first region, and the other of the source and the drain might be referred to as a second terminal, a second electrode, or a second region, for example.

Note that as illustrated in FIG. 1A, the wiring S is connected to at least a circuit 300 having a function of supplying a potential Vinit and a potential Vsig, for example. An example of the circuit 300 is a source driver (a signal line driver circuit). Accordingly, the wiring S has a function of capable of transmitting or supplying the potential Vinit and/or the potential Vsig. The wiring S functions as a video signal line. Alternatively, the wiring S functions as an initialization line.

The potential Vinit is a potential for initializing the potential of each node in the semiconductor device, for example. Alternatively, the potential Vinit is a potential for supplying electric charge to the capacitor 111, for example. Alternatively, the potential Vinit is a potential for turning on the transistor 100, for example. Note that the potential Vinit is preferably constant; however, one aspect of the embodiment of the present invention is not limited thereto. The potential Vinit may vary like a pulse signal.

An example of the potential Vsig is a signal for controlling the amount of current supplied to the load 200. Thus, the potential Vsig depends on the amount of current to be supplied to the load 200. For example, when current supplied to the load 200 is constant, the potential Vsig is constant. When current supplied to the load 200 is not constant, the potential Vsig changes over time depending on the amount of current supplied to the load 200. For example, the potential Vsig is an analog video signal.

For example, the potential Vinit is supplied to the wiring S before the potential Vsig is supplied thereto.

Note that as illustrated in FIG. 1A, the wiring V is connected to at least a circuit 301 for supplying a power supply potential (a high power supply potential or a low power supply potential), for example. An example of the circuit 301 is a power supply circuit. Accordingly, the wiring V has a function of capable of transmitting or supplying the power supply potential. Alternatively, the wiring V has a function of capable of supplying current to the transistor 100. Alternatively, the wiring V has a function of capable of supplying current to the load 200. The wiring V functions as a power supply line. Alternatively, the wiring V functions as a current supply line. Note that the potential of the wiring V is preferably constant; however, one aspect of the embodiment of the present invention is not limited thereto. The potential of the wiring V may vary like a pulse signal. For example, the potential of the wiring V may be a potential at which not only forward bias voltage but also reverse bias voltage is applied to the load 200.

Note that as illustrated in FIG. 1A, the wiring V0 is connected to at least a circuit 312 having a function of supplying a power supply potential (a low power supply potential or a high power supply potential), for example. An example of the circuit 312 is a power supply circuit. Accordingly, the wiring V0 has a function of capable of transmitting or supplying the power supply potential. Alternatively, the wiring V0 has a function of capable of supplying current to the load 200. Alternatively, the wiring V0 has a function of capable of supplying current to the transistor 100. The wiring V0 functions as a common line. Alternatively, the wiring V0 functions as a cathode line. Note that the potential of the wiring V0 is preferably constant; however, one aspect of the embodiment of the present invention is not limited thereto. The potential of the wiring V0 may vary like a pulse signal. For example, the potential of the wiring V0 may be a potential at which not only forward bias voltage but also reverse bias voltage is applied to the load 200.

The circuit 300, the circuit 301, and the circuit 312 may be the same circuit or different circuits.

In the configuration in FIG. 1A, it is possible not to provide the capacitor 111 by actively utilizing parasitic capacitance of the transistor or the like. Further, it is possible not to provide the capacitor 112 by actively utilizing parasitic capacitance of the transistor or the like.

Note that the semiconductor device according to one embodiment of the present invention may have a plurality of blocks (each represented by "cell" and surrounded by dotted lines in FIG. 1A).

Note that in this specification, the load 200 means a rectifier, a capacitive object, a resistive object, a circuit including a switch, a pixel circuit, or the like. For example, a rectifier has current-voltage characteristics showing different resistance values depending on the direction of an applied bias, and has electrical characteristics that allow most current to flow only in one direction. Other examples of the load 200 are a display element (e.g., a liquid crystal element), a light-emitting element (e.g., an EL element), and part of a display element or a light-emitting element (e.g., a pixel electrode, an anode, or a cathode). Examples of a light-emitting element are an EL element (e.g., an EL element including organic and inorganic materials, an organic EL element, or an inorganic EL element), an LED (e.g., a white LED, a red LED, a green LED, or a blue LED), a transistor (a transistor that emits light in accordance with current), and an electron emitter. In particular, in a configuration in FIG. 1B, for example, the transistor 100 is an n-channel transistor and the load 200 in FIG. 1A is a rectifier that allows current to flow from the wiring V to the wiring V0 (in the direction indicated by an arrow in FIG. 1B) and does not allow current to flow in an opposite direction. In a configuration in FIG. 1D, for example, the transistor 100 is a p-channel transistor and the load 200 in FIG. 1A is a rectifier that allows current to flow from the wiring V0 to the wiring V (in the direction indicated by an arrow in FIG. 1D) and does not allow current to flow in an opposite direction. FIG. 1C illustrates the case where a light-emitting element 201 is used as the load 200 in the configuration in FIG. 1B. As illustrated in FIG. 1C, an anode of the light-emitting element 201 is connected to the transistor 100, and a cathode of the light-emitting element 201 is connected to the wiring V0. FIG. 1E illustrates the case where the light-emitting element 201 is used as the load 200 in the configuration in FIG. 1D. As illustrated in FIG. 1E, the cathode of the light-emitting element 201 is connected to the transistor 100, and the anode of the light-emitting element 201 is connected to the wiring V0.

The transistor 100 functions as at least a current source, for example. Accordingly, for example, the transistor 100 has a function of supplying constant current even when the level of voltage applied across both ends (between the source and the drain) of the transistor 100 is changed. Alternatively, for example, the transistor 100 has a function of supplying constant current to the load 200 even when the potential of the load 200 is changed. Alternatively, for example, the transistor 100 has a function of supplying constant current even when the potential of the wiring V is changed.

Note that there is a voltage source as a power source different from a current source. The voltage source has a function of supplying constant voltage even when current flowing through a circuit connected to the voltage source is changed. Accordingly, the voltage source and the current source each have a function of supplying voltage and current. However, the function of the voltage source and the function of the current source are different in what is supplied at a constant level even when one factor is changed. The current source has a function of supplying constant current event when voltage across both ends is changed. The voltage source has a function of supplying constant voltage even when current is changed.

Note that FIG. 1A and the like each illustrate a circuit configuration example; thus, a transistor can be additionally provided. In contrast, for each node in FIG. 1A and the like, it is possible not to provide an additional transistor, switch, passive element, or the like. For example, it is possible not to provide an additional transistor that is directly connected to a node where terminals of switches are connected to each other, a node where terminals of a transistor are connected to each other, and/or a node where terminals of a load are connected to each other. Accordingly, for example, it is possible to directly connect only the transistor 100 to a node where the load 200, the transistor 100, the capacitor 112, and the switch 103 are connected to each other (in the case where the switch 103 is a transistor, the transistor is excluded), and it is possible not to directly connect another transistor to the node.

Thus, a circuit can be formed with a small number of transistors in the case where an additional transistor is not provided.

<Method for Driving Semiconductor Device>

An example of a method for driving the semiconductor device in FIG. 1A is described. In the driving method, potentials input to the wirings and the like vary depending on the conductivity type of the transistor 100. Thus, a method for driving the semiconductor device in FIG. 1B having the n-channel transistor 100 and a method for driving the semiconductor device in FIG. 1D having the p-channel transistor 100 are sequentially described.

<Driving Method in the Case of N-Channel Transistor 100>

Figure 1B:
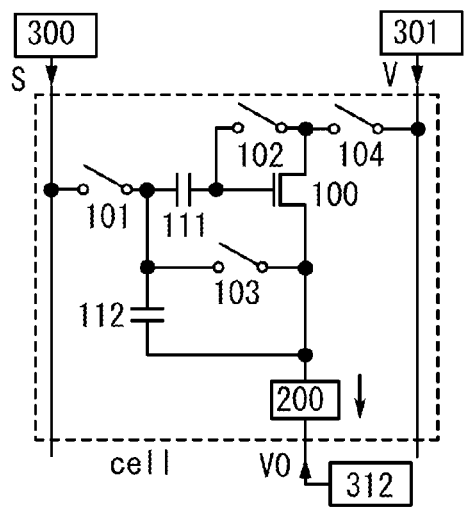
Figure 1C:
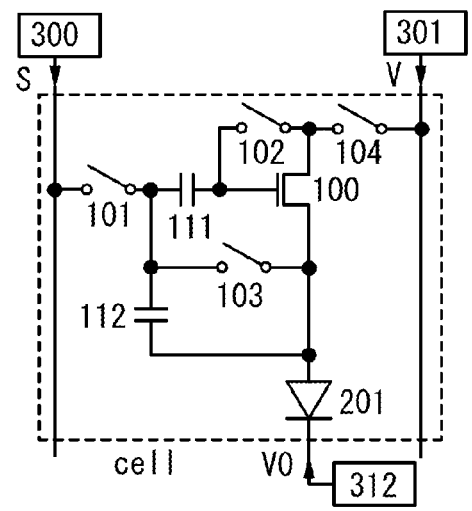

The method for driving the semiconductor device in FIG. 1B is described with reference to an example of a timing chart in FIG. 2.

Figure 2:
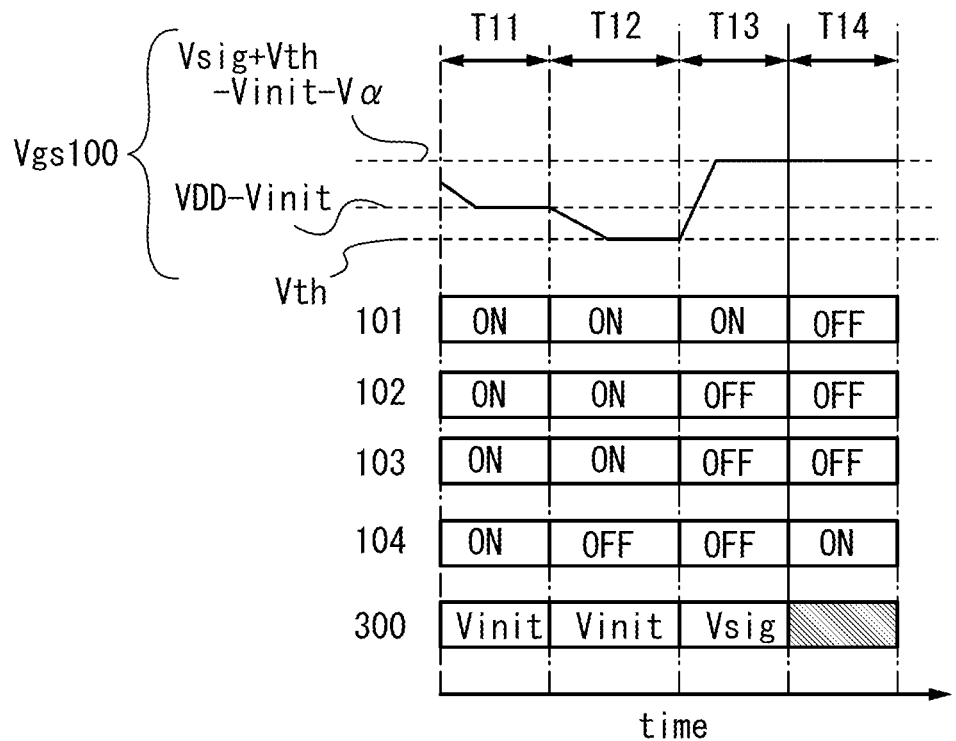
FIG. 2 is a timing chart illustrating a method for driving a semiconductor device.

In the timing chart in FIG. 2, Vgs100 represents a potential difference between the gate and the source of the transistor 100 in each period (each of a period T11, a period T12, a period T13, and a period T14). In the timing chart in FIG. 2, 101 represents the state of the switch 101 in each period; 102 represents the state of the switch 102 in each period; 103 represents the state of the switch 103 in each period; and 104 represents the state of the switch 104 in each period. Here, the state of the switch indicates the on/off state of the switch. In FIG. 2, "ON" represents the state where the switch is on, and "OFF" represents the state where the switch is off. In the timing chart in FIG. 2, 300 represents the potential of the wiring S that is controlled by the circuit 300 in each period. Note that the circuit 301 controls the potential of the wiring V so that the potential of the wiring V is VDD (VDD is higher than a potential applied to the wiring V0) at least in the period T11 and the period T14. In the period T12 and the period T13, the potential of the wiring V is a given potential. The circuit 301 may control the potential of the wiring V so that the potential of the wiring V is VDD in the period T12 and/or the period T13.

Figure 3A:
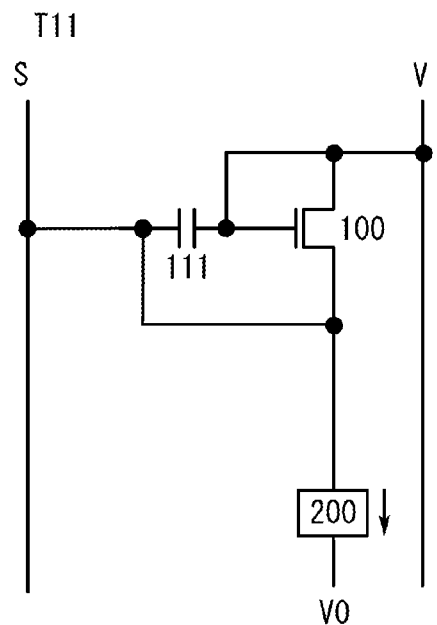
FIGS. 3A to 3D each illustrate an electrical connection in a semiconductor device in a predetermined period.

In the period T11, the switch 101, the switch 102, the switch 103, and the switch 104 are all turned on. The potential of the wiring S is set to the initialization potential Vinit by the circuit 300. Here, the initialization potential Vinit is equal to or lower than the potential of the wiring V0, for example. The potential of the wiring V is VDD. FIG. 3A schematically illustrates a connection in the cell in the period T11. With such a connection, voltage held in the capacitor 111 becomes VDD−Vinit. The potential of the source of the transistor 100 becomes Vinit, the potential of the gate of the transistor 100 becomes VDD, and Vgs100 becomes VDD−Vinit. Note that VDD and Vinit are set such that VDD−Vinit is higher than the threshold voltage (hereinafter also referred to as Vth) of the transistor 100. In this manner, the transistor 100 is turned on when the period T11 is terminated. Here, since the initialization potential Vinit is equal to or lower than a potential applied to the wiring V0, current does not flow to the load 200 in the period T11.

Figure 3B:
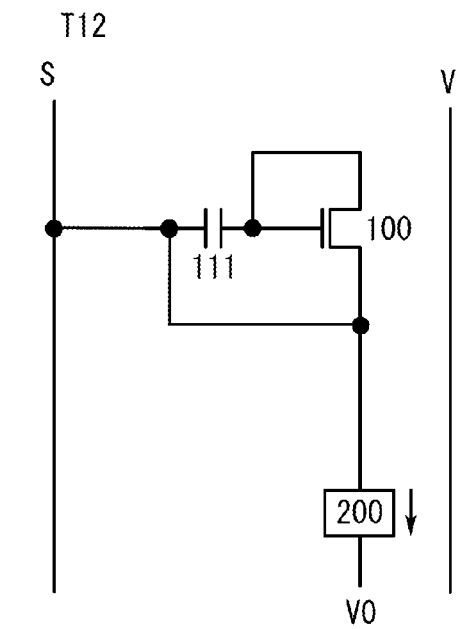

In the period T12, the switch 101, the switch 102, and the switch 103 are kept on and the switch 104 is turned off. The potential of the wiring S is kept at the initialization potential Vinit by the circuit 300. Note that while the switch 104 is off, the potential of the wiring V can be a given potential. FIG. 3B schematically illustrates a connection in the cell in the period T12. With such a connection, electric charge held in the capacitor 111 is discharged through the source and the drain of the transistor 100 that is on. The electric charge is continuously discharged until the voltage held in the capacitor 111 becomes Vth and the transistor 100 is turned off. In this manner, the voltage held in the capacitor 111 becomes Vth. The potential of the source of the transistor 100 remains at Vinit, the potential of the gate of the transistor 100 becomes Vinit+Vth, and Vgs100 becomes Vth. In this manner, the threshold voltage Vth of the transistor 100 can be held in the capacitor 111. Since the initialization potential Vinit is equal to or lower than the potential of the wiring V0, current does not flow to the load 200 in the period T12 as in the period T11.

Note that in some cases, it takes a very long time for Vgs100 to be equal to the threshold voltage Vth of the transistor 100. Accordingly, in many cases, the next operation is performed while Vgs100 is not completely lowered to the threshold voltage Vth. That is, in many cases, the period T12 is terminated while Vgs100 is slightly higher than the threshold voltage Vth. In other words, at the termination of the period T12, Vgs100 becomes voltage based on the threshold voltage.

Figure 3C:
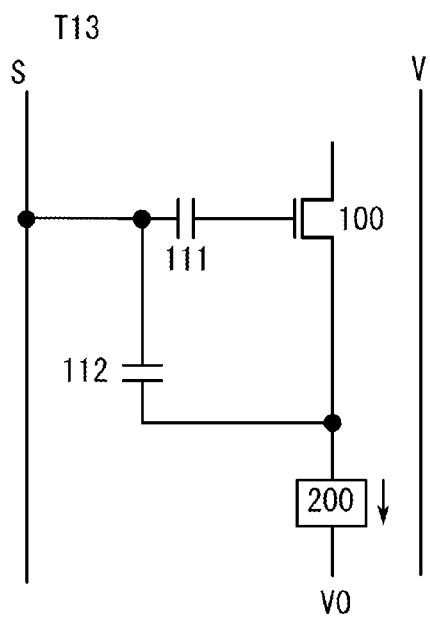

In the period T13, the switch 101 is kept on, the switch 104 is kept off, and the switch 102 and the switch 103 are turned off. Note that timing of turning off the switch 102 and timing of turning off the switch 103 may be the same or different. The potential of the wiring S is set to the signal potential Vsig by the circuit 300. Note that since the switch 104 is off, the potential of the wiring V can be a given potential. FIG. 3C schematically illustrates a connection in the cell in the period T13. With such a connection, the voltage held in the capacitor 111 remains at Vth or the voltage based on Vth, and the potential of the source of the transistor 100 becomes Vinit+Vα. The potential of the gate of the transistor 100 becomes Vsig+Vth, and Vgs100 becomes Vsig+Vth−(Vinit+Vα). Here, Vα depends on the capacitance of the load 200, the capacitance of the capacitor 112, and the like. For example, Vα is positive voltage. In this manner, Vgs100 can be voltage that is based on the signal potential Vsig and is corrected in accordance with the threshold voltage of the transistor 100. When the capacitance of the load 200 is much higher than the capacitance of the capacitor 112, Vα is very low. Since the potential of the source of the transistor 100 becomes Vinit+Vα but Vα is very low, current does not flow to the load 200. Voltage held in the capacitor 112 becomes Vsig−(Vinit+Vα).

Note that in the period T13, the semiconductor device can operate while the switch 104 is turned on. In that case, current flows to the transistor 100, and electric charge in the capacitor 112 is discharged by the current. At this time, discharge capacity varies depending on current characteristics (e.g., mobility) of the transistor 100. For example, higher mobility of the transistor 100 can increase electric discharge per unit time. Thus, when the switch 104 is turned on and the electric charge in the capacitor 112 is discharged, Vgs100 can be corrected in accordance with the mobility of the transistor 100. In this manner, Vgs100 can be corrected in accordance with variations, degradation, and the like of the current characteristics of the transistors 100.

Figure 3D:
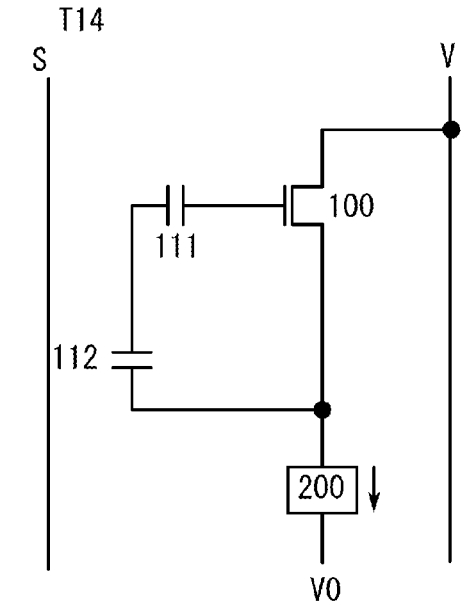

In the period T14, the switch 102 and the switch 103 are kept off, the switch 101 is turned off, and the switch 104 is turned on. Note that timing of turning off the switch 101 and timing of turning on the switch 104 may be the same or different. While the switch 101 is off, the potential of the wiring S can be a given potential (indicated by diagonal lines in FIG. 2). While the switch 104 is on, the potential of the wiring V is VDD. FIG. 3D schematically illustrates a connection in the cell in the period T14. With such a connection, the voltage held in the capacitor 111 remains at Vth, the voltage held in the capacitor 112 remains at Vsig−(Vinit+Vα), Vgs100 remains at Vsig+Vth−(Vinit+Vα), and the potential of the source of the transistor 100 becomes VEL. Further, the potential of the gate of the transistor 100 becomes Vsig+Vth−(Vinit+Vα)+VEL. Here, VEL is equal to or higher than the potential applied to the wiring V0 and equal to or lower than VDD. In this manner, the transistor 100 supplies drain current based on Vgs100 to the load 200.

In the driving method described with reference to the timing chart in FIG. 2, Vgs100 is voltage that is based on the signal potential Vsig and is corrected in accordance with the threshold voltage of the transistor 100. Thus, even when the threshold voltage of the transistor 100 is varied or changed, for example, a variation or change in the amount of current supplied to the load 200 can be reduced. Further, even when the level of the potential VEL of the source of the transistor 100 is changed due to variations in characteristics of the load 200, the potential of the gate of the transistor 100 is similarly changed; thus, Vgs100 is not changed. Consequently, even when the characteristics of the load 200 are changed, degraded, or varied, predetermined current can be supplied to the load 200.

The above is the description of the semiconductor device in FIG. 1B and the method for driving the semiconductor device.

Note that the configuration of the semiconductor device according to one embodiment of the present invention is not limited to the configuration in FIG. 1B. The semiconductor device according to one embodiment of the present invention can have the transistor 100, the load 200, the wiring S, the wiring V, and any number of switches to select the four connections in FIGS. 3A to 3D.

Figure 4A:
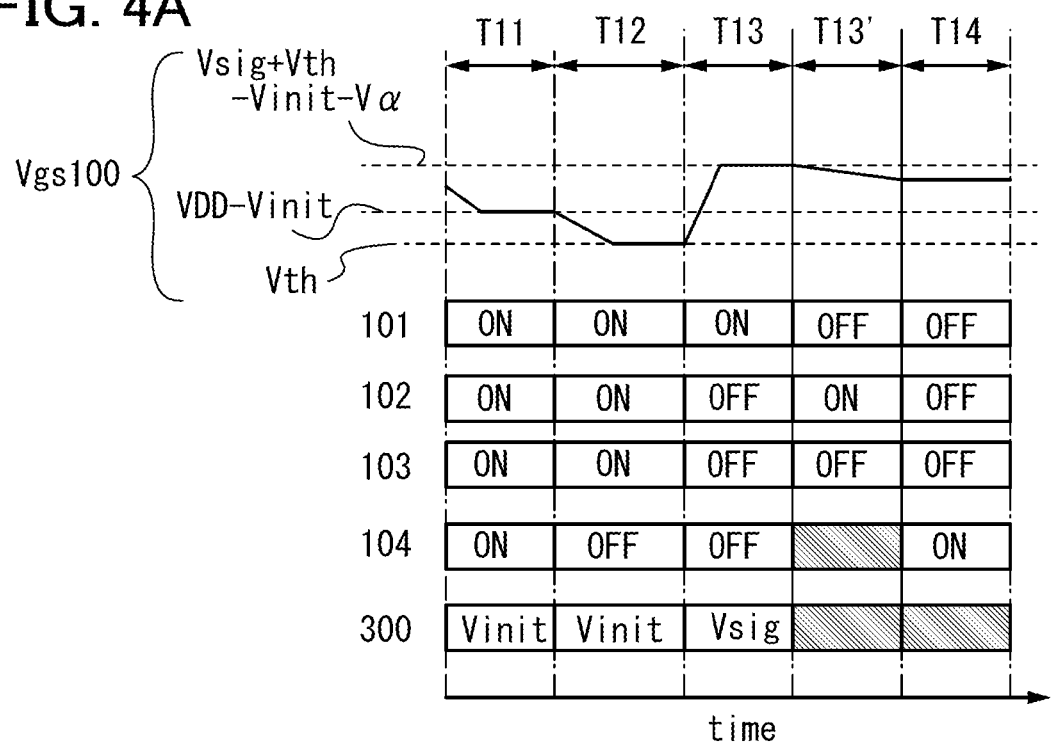
FIG. 4A is a timing chart illustrating a method for driving a semiconductor device, and FIGS. 4B and 4C each illustrate an electrical connection in the semiconductor device in a predetermined period.

The method for driving the semiconductor device in FIG. 1B is not limited to the driving method described with reference to the timing chart in FIG. 2. In the driving method described with reference to the timing chart in FIG. 2, some of the periods can be omitted or a different period can be added. For example, a driving method described with reference to a timing chart in FIG. 4A can be used. In the timing chart in FIG. 4A, operations in the period T11, the period T12, the period T13, and the period T14 are similar to the operations described with reference to FIG. 2. The timing chart in FIG. 4A differs from the timing chart in FIG. 2 in that a period T13' is provided after the period T13.

Figure 4B:
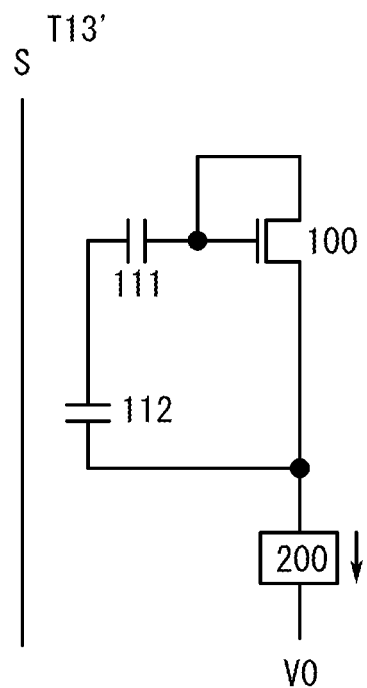
Figure 4C:
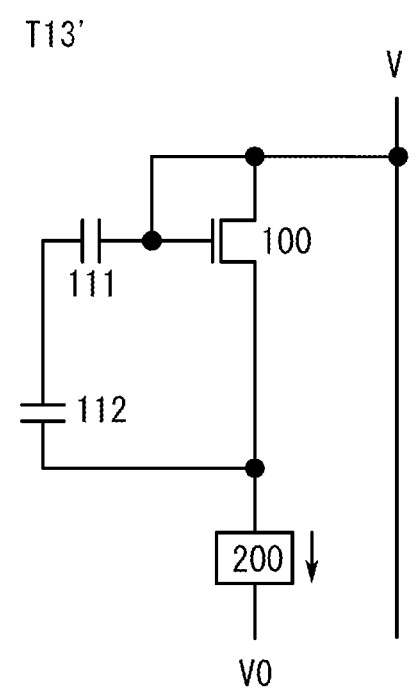

In the period T13', the switch 103 is kept off, the switch 101 is turned off, and the switch 102 is turned on. The switch 104 may be kept off or may be turned on. Note that timing of turning off the switch 101 and timing of turning on the switch 102 may be the same or different. In the case where the switch 104 is turned on in the period T13', timing of turning on the switch 104 may be the same as or different from the timing of turning off the switch 101 and/or the timing of turning on the switch 102. While the switch 101 is off, the potential of the wiring S can be a given potential (indicated by diagonal lines in FIG. 4A). When the switch 104 is off, the potential of the wiring V can be a given potential. When the switch 104 is on, the potential of the wiring V is VDD. FIG. 4B schematically illustrates a connection in the cell in which the switch 104 is off in the period T13'. FIG. 4C schematically illustrates a connection in the cell in which the switch 104 is on in the period T13'.

With a connection in FIG. 4B or 4C, electric charge held in the capacitor 111 and the capacitor 112 can be discharged via the transistor 100. Here, discharge capacity per unit time varies depending on current characteristics (e.g., mobility) of the transistor 100. For example, higher mobility of the transistor 100 can increase electric discharge per unit time. Thus, when the electric charge is discharged in a very short time, Vgs100 can be corrected in accordance with the mobility of the transistor 100. In this manner, Vgs100 can be corrected in accordance with variations, degradation, and the like of the current characteristics of the transistors 100.

The operation in the period T14 after the period T13' is similar to the operation described with reference to FIG. 2. In the driving method described with reference to the timing chart in FIG. 4A, Vgs100 is voltage that is based on the signal potential Vsig and is corrected in accordance with the threshold voltage and mobility of the transistor 100. Thus, even when the threshold voltage and mobility of the transistor 100 are varied or changed, for example, a variation or change in the amount of current supplied to the load 200 can be reduced. Further, even when the level of the potential VEL of the source of the transistor 100 is changed due to changes, variations, or degradation of the characteristics of the load 200, the potential of the gate of the transistor 100 is similarly changed; thus, Vgs100 is not changed. Consequently, even when the characteristics of the load 200 are changed, predetermined current can be supplied to the load 200.

Note that the configuration of the semiconductor device according to one embodiment of the present invention is not limited to the configuration in FIG. 1B. The semiconductor device according to one embodiment of the present invention can have the transistor 100, the load 200, the wiring S, the wiring V, and any number of switches to select the fifth connections in FIGS. 3A to 3D and FIG. 4B or 4C.

The method for driving the semiconductor device has been described giving the example in which the transistor 100 is an n-channel transistor, the load 200 has a rectifying property, and current flows from the wiring V to the wiring V0 in FIG. 1B. When the load 200 in FIG. 1B is the light-emitting element 201, the semiconductor device in FIG. 1B has the same configuration as the semiconductor device in FIG. 1C. Thus, the semiconductor device in FIG. 1C can also be operated by the driving method.

<Driving Method in the Case of P-Channel Transistor 100>

Figure 1D:
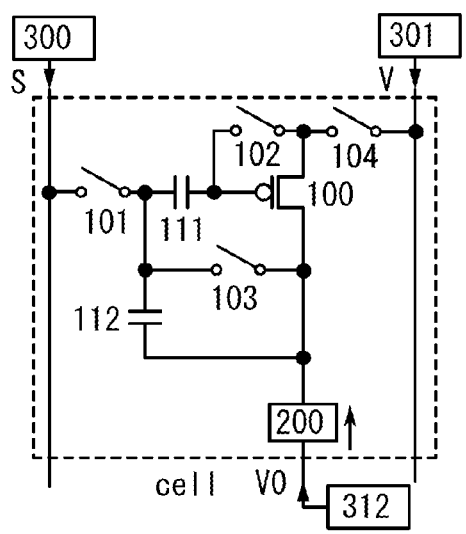
Figure 1E:
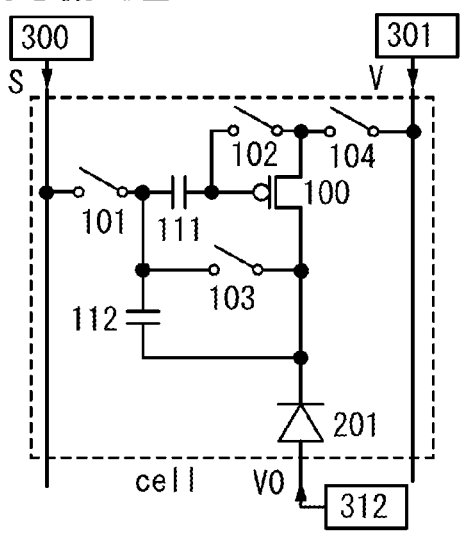

The method for driving the semiconductor device in FIG. 1D is described with reference to an example of a timing chart in FIG. 5.

Figure 5:
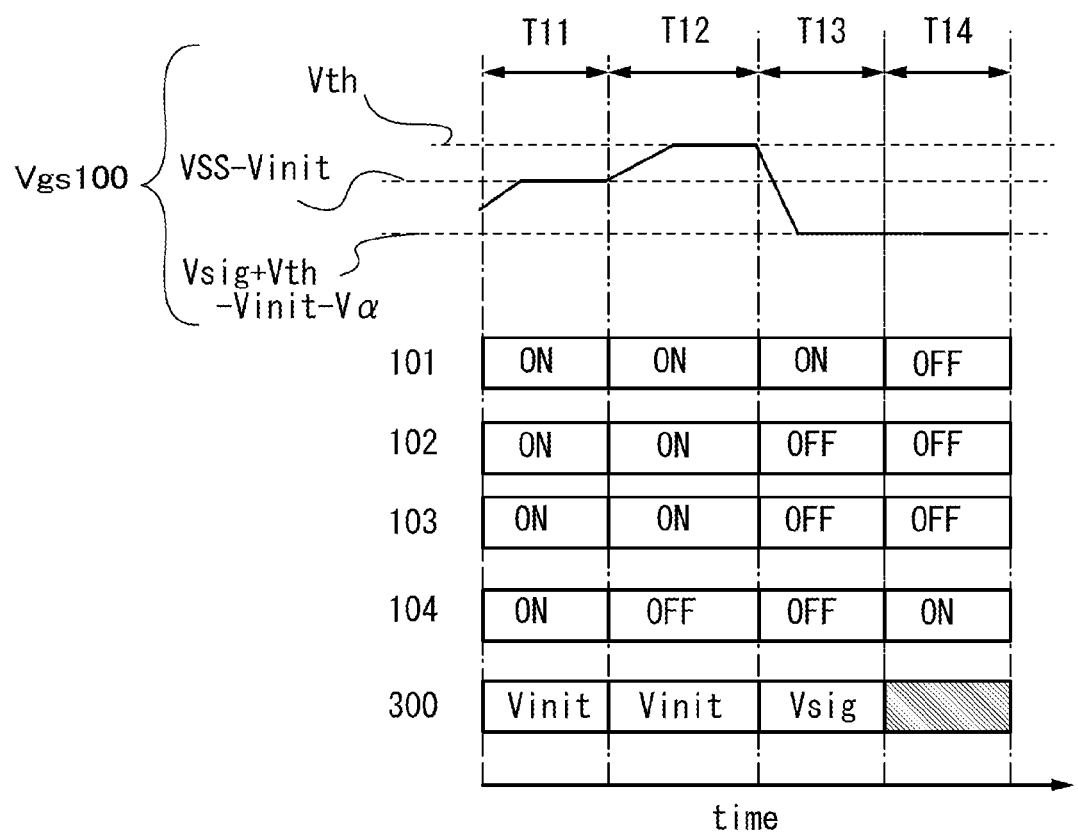
FIG. 5 is a timing chart illustrating a method for driving a semiconductor device.

In the timing chart in FIG. 5, Vgs100 represents a potential difference between the gate and the source of the transistor 100 in each period (each of the period T11, the period T12, the period T13, and the period T14). In the timing chart in FIG. 5, 101 represents the state of the switch 101 in each period; 102 represents the state of the switch 102 in each period; 103 represents the state of the switch 103 in each period; and 104 represents the state of the switch 104 in each period. In FIG. 5, "ON" represents the state where the switch is on, and "OFF" represents the state where the switch is off. In the timing chart in FIG. 5, 300 represents the potential of the wiring S that is controlled by the circuit 300 in each period. Note that the circuit 301 controls the potential of the wiring V so that the potential of the wiring V is VSS (VSS is lower than a potential applied to the wiring V0) at least in the period T11 and the period T14. In the period T12 and the period T13, the potential of the wiring V is a given potential. The circuit 301 may control the potential of the wiring V so that the potential of the wiring V is VSS in the period T12 and/or the period T13.

Figure 46A:
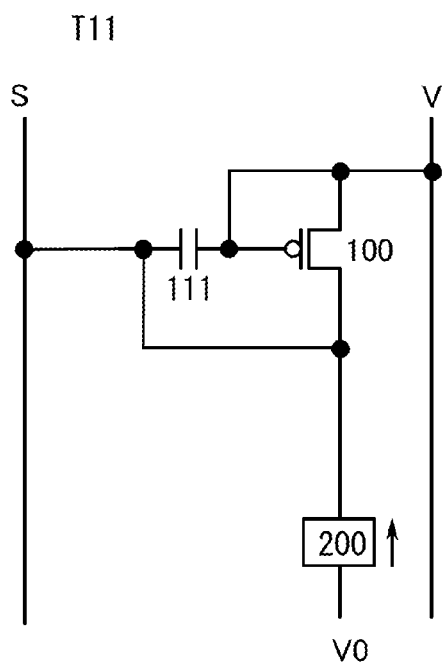
FIGS. 46A to 46D each illustrate an electrical connection in a semiconductor device in a predetermined period.

In the period T11, the switch 101, the switch 102, the switch 103, and the switch 104 are all turned on. The potential of the wiring S is set to the initialization potential Vinit by the circuit 300. Here, the initialization potential Vinit is equal to or higher than the potential of the wiring V0, for example. The potential of the wiring V is VSS. FIG. 46A schematically illustrates a connection in the cell in the period T11. With such a connection, voltage held in the capacitor 111 becomes VSS−Vinit. The potential of the source of the transistor 100 becomes Vinit, the potential of the gate of the transistor 100 becomes VSS, and Vgs100 becomes VSS−Vinit. Note that VSS and Vinit are set such that VSS−Vinit is lower than the threshold voltage of the transistor 100. In this manner, the transistor 100 is turned on when the period T11 is terminated. Here, since the initialization potential Vinit is equal to or higher than the potential of the wiring V0, current does not flow to the load 200 in the period T11.

Figure 46B:
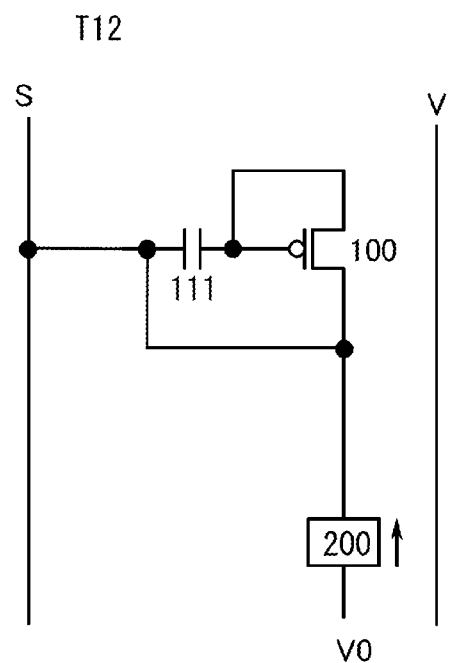

In the period T12, the switch 101, the switch 102, and the switch 103 are kept on and the switch 104 is turned off. The potential of the wiring S is kept at the initialization potential Vinit by the circuit 300. Note that while the switch 104 is off, the potential of the wiring V can be a given potential. FIG. 46B schematically illustrates a connection in the cell in the period T12. With such a connection, electric charge held in the capacitor 111 is discharged through the source and the drain of the transistor 100 that is on. The electric charge is continuously discharged until the voltage held in the capacitor 111 becomes Vth and the transistor 100 is turned off. In this manner, the voltage held in the capacitor 111 becomes Vth. The potential of the source of the transistor 100 remains at Vinit, the potential of the gate of the transistor 100 becomes Vinit+Vth, and Vgs100 becomes Vth. In this manner, the threshold voltage Vth of the transistor 100 can be held in the capacitor 111. Since the initialization potential Vinit is equal to or higher than the potential of the wiring V0, current does not flow to the load 200 in the period T12 as in the period T11.

Note that in some cases, it takes a very long time for Vgs100 to be equal to the threshold voltage Vth of the transistor 100. Accordingly, in many cases, the next operation is performed while Vgs100 is not completely raised to the threshold voltage Vth. That is, in many cases, the period T12 is terminated while Vgs100 is slightly lower than the threshold voltage Vth. In other words, at the termination of the period T12, Vgs100 becomes voltage based on the threshold voltage.

Figure 46C:
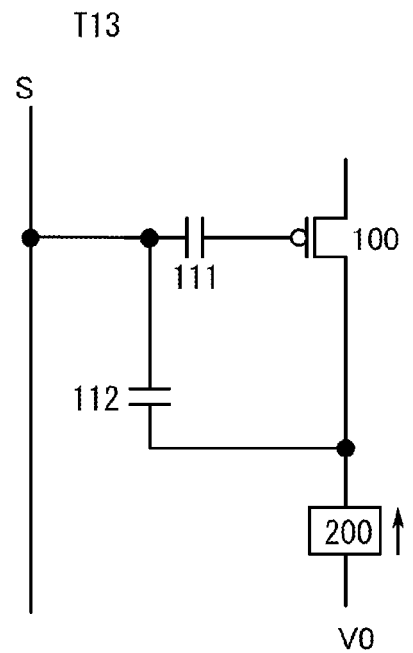

In the period T13, the switch 101 is kept on, the switch 104 is kept off, and the switch 102 and the switch 103 are turned off. Note that timing of turning off the switch 102 and timing of turning off the switch 103 may be the same or different. The potential of the wiring S is set to the signal potential Vsig by the circuit 300. Note that since the switch 104 is off, the potential of the wiring V can be a given potential. FIG. 46C schematically illustrates a connection in the cell in the period T13. With such a connection, the voltage held in the capacitor 111 remains at Vth or the voltage based on Vth, and the potential of the source of the transistor 100 becomes Vinit+Vα. The potential of the gate of the transistor 100 becomes Vsig+Vth, and Vgs100 becomes Vsig+Vth−(Vinit+Vα). Here, Vα depends on the capacitance of the load 200, the capacitance of the capacitor 112, and the like. For example, Vα is negative voltage. In this manner, Vgs100 can be voltage that is based on the signal potential Vsig and is corrected in accordance with the threshold voltage of the transistor 100.

When the capacitance of the load 200 is much higher than the capacitance of the capacitor 112, Vα is very low. Since the potential of the source of the transistor 100 becomes Vinit+Vα but Vα is very low, current does not flow to the load 200. Voltage held in the capacitor 112 becomes Vsig−(Vinit+Vα).

Note that in the period T13, the semiconductor device can operate while the switch 104 is turned on. In that case, current flows to the transistor 100, and electric charge in the capacitor 112 is discharged by the current. At this time, discharge capacity varies depending on current characteristics (e.g., mobility) of the transistor 100. For example, higher mobility of the transistor 100 can increase electric discharge per unit time. Thus, when the switch 104 is turned on and the electric charge in the capacitor 112 is discharged, Vgs100 can be corrected in accordance with the mobility of the transistor 100. In this manner, Vgs100 can be corrected in accordance with variations, degradation, and the like of the current characteristics of the transistors 100.

Figure 46D:
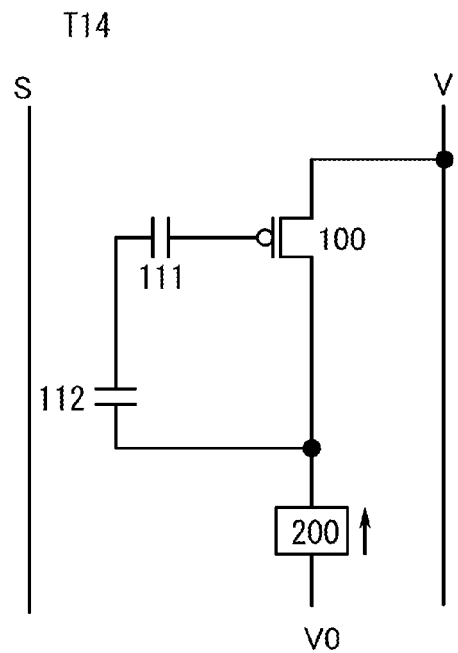

In the period T14, the switch 102 and the switch 103 are kept off, the switch 101 is turned off, and the switch 104 is turned on. Note that timing of turning off the switch 101 and timing of turning on the switch 104 may be the same or different. While the switch 101 is off, the potential of the wiring S can be a given potential (indicated by diagonal lines in FIG. 5). While the switch 104 is on, the potential of the wiring V is VSS. FIG. 46D schematically illustrates a connection in the cell in the period T14. With such a connection, the voltage held in the capacitor 111 remains at Vth, the voltage held in the capacitor 112 remains at Vsig−(Vinit+Vα), Vgs100 remains at Vsig+Vth−(Vinit+Vα), and the potential of the source of the transistor 100 becomes VEL. Further, the potential of the gate of the transistor 100 becomes Vsig+Vth−(Vinit+Vα)+VEL. Here, VEL is equal to or higher than VSS and equal to or lower than the potential of the wiring V0. In this manner, the transistor 100 supplies drain current based on Vgs100 to the load 200.

In the period T14, Vgs100 is voltage that is based on the signal potential Vsig and is corrected in accordance with the threshold voltage of the transistor 100. Thus, even when the threshold voltage of the transistor 100 is varied or changed, for example, predetermined drain current that is based on the signal potential Vsig can be supplied to the load 200. Further, even when the level of the potential VEL of the source of the transistor 100 is changed due to changes, degradation, or variations of characteristics of the load 200, the potential of the gate of the transistor 100 is similarly changed; thus, Vgs100 is not changed. Consequently, even when the characteristics of the load 200 are changed, predetermined current can be supplied to the load 200.

Note that the configuration of the semiconductor device according to one embodiment of the present invention is not limited to the configuration in FIG. 1D. The semiconductor device according to one embodiment of the present invention can have the transistor 100, the load 200, the wiring S, the wiring V, and any number of switches to select the four connections in FIGS. 46A to 46D.

Figure 6A:
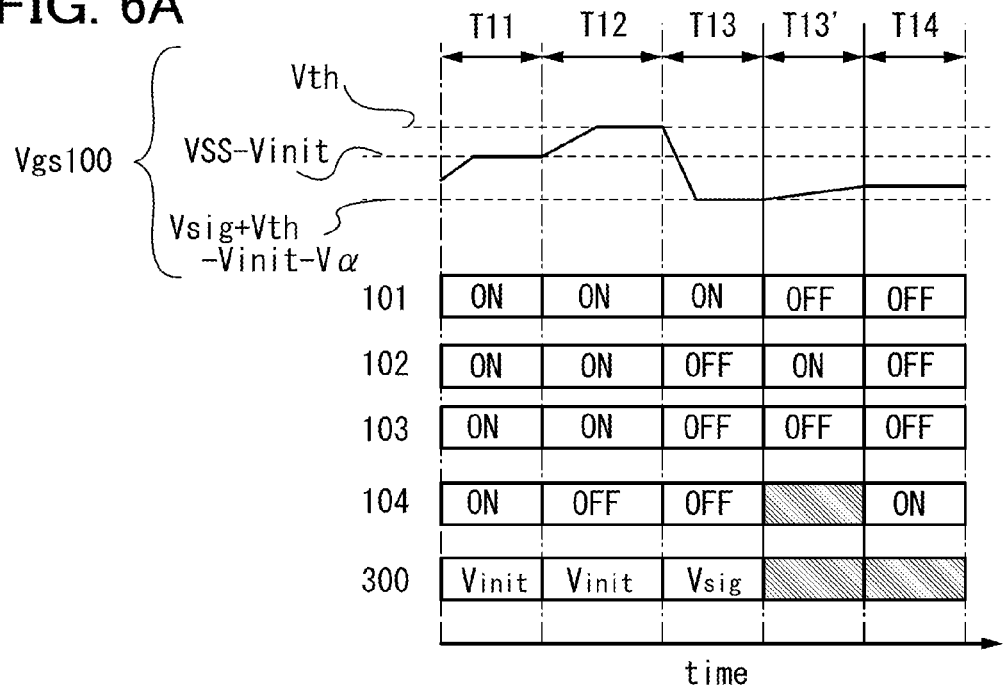
FIG. 6A is a timing chart illustrating a method for driving a semiconductor device, and FIGS. 6B and 6C each illustrate an electrical connection in the semiconductor device in a predetermined period.

The method for driving the semiconductor device in FIG. 1D is not limited to the driving method described with reference to the timing chart in FIG. 5. In the driving method described with reference to the timing chart in FIG. 5, some of the periods can be omitted or a different period can be added. For example, a driving method described with reference to a timing chart in FIG. 6A can be used. In the timing chart in FIG. 6A, operations in the period T11, the period T12, the period T13, and the period T14 are similar to the operations described with reference to FIG. 5. The timing chart in FIG. 6A differs from the timing chart in FIG. 5 in that the period T13′ is provided after the period T13.

Figure 6B:
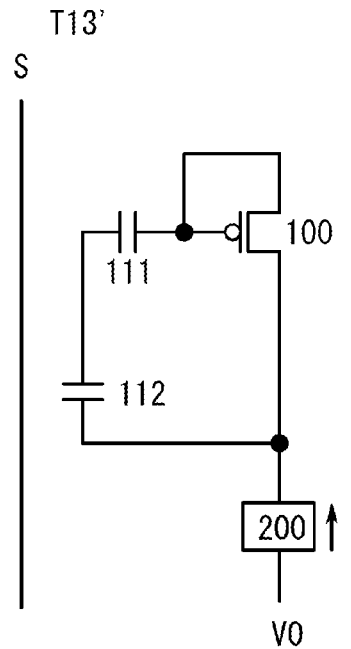
Figure 6C:
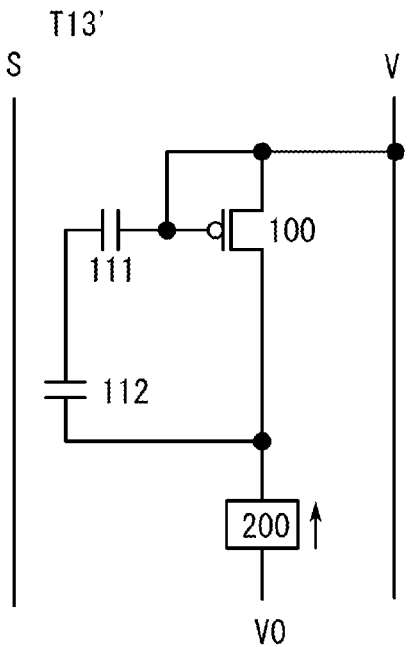

In the period T13′, the switch 103 is kept off, the switch 101 is turned off, and the switch 102 is turned on. The switch 104 may be kept off or may be turned on. Note that timing of turning off the switch 101 and timing of turning on the switch 102 may be the same or different. In the case where the switch 104 is turned on in the period T13′, timing of turning on the switch 104 may be the same as or different from the timing of turning off the switch 101 and/or the timing of turning on the switch 102. While the switch 101 is off, the potential of the wiring S can be a given potential (indicated by diagonal lines in FIG. 6A). When the switch 104 is off, the potential of the wiring V can be a given potential. When the switch 104 is on, the potential of the wiring V is VSS. FIG. 6B schematically illustrates a connection in the cell in which the switch 104 is off in the period T13′. FIG. 6C schematically illustrates a connection in the cell in which the switch 104 is on in the period T13′.

With a connection in FIG. 6B or 6C, electric charge held in the capacitor 111 and the capacitor 112 can be discharged via the transistor 100. Here, discharge capacity per unit time varies depending on current characteristics (e.g., mobility) of the transistor 100. In other words, higher mobility of the transistor 100 can increase electric discharge per unit time. Thus, when the electric charge is discharged in a very short time, Vgs100 can be corrected in accordance with the mobility of the transistor 100. In this manner, Vgs100 can be corrected in accordance with variations, degradation, and the like of the current characteristics of the transistors 100.

The operation in the period T14 after the period T13′ is similar to the operation described with reference to FIG. 5. In the driving method described with reference to the timing chart in FIG. 6A, Vgs100 is voltage that is based on the signal potential Vsig and is corrected in accordance with the threshold voltage and mobility of the transistor 100. Thus, even when the threshold voltage and mobility of the transistor 100 are varied or changed, for example, a variation or change in the amount of current supplied to the load 200 can be reduced. Further, even when the level of the potential VEL of the source of the transistor 100 is changed due to changes, variations, or degradation of the characteristics of the load 200, the potential of the gate of the transistor 100 is similarly changed; thus, Vgs100 is not changed. Consequently, even when the characteristics of the load 200 are changed, predetermined current can be supplied to the load 200.

Note that the configuration of the semiconductor device according to one embodiment of the present invention is not limited to the configuration in FIG. 1D. The semiconductor device according to one embodiment of the present invention can have the transistor 100, the load 200, the wiring S, the wiring V, and any number of switches to select the fifth connections in FIGS. 46A to 46D and FIG. 6B or 6C.

The method for driving the semiconductor device has been described using the example in which the transistor 100 is a p-channel transistor, the load 200 has a rectifying property, and current flows from the wiring V0 to the wiring V in FIG. 1D. When the load 200 in FIG. 1D is the light-emitting element 201, the semiconductor device in FIG. 1D has the same configuration as the semiconductor device in FIG. 1E. Thus, the semiconductor device in FIG. 1E can also be operated by the driving method.

Note that in FIGS. 1A to 1E and the like, the capacitance of the capacitor 111 is preferably higher than the parasitic capacitance of the gate of the transistor 100, more preferably 2 or more times the parasitic capacitance of the gate of the transistor 100, still more preferably 5 or more times the parasitic capacitance of the gate of the transistor 100. Alternatively, the area of the electrodes of the capacitor 111 is preferably larger than the area of a channel region of the transistor 100, more preferably 2 or more times the area of the channel region of the transistor 100, still more preferably 5 or more times the area of the channel region of the transistor 100. Alternatively, the area of the electrodes of the capacitor 111 is preferably larger than the area of the gate of the transistor 100, more preferably 2 or more times the area of the gate of the transistor 100, still more preferably 5 or more times the area of the gate of the transistor 100. Accordingly, when voltage is divided by the capacitor 111 and the gate capacitance of the transistor 100, a decrease in voltage of the capacitor 111 can be reduced. Note that one aspect of the embodiment of the present invention is not limited thereto.

Note that in FIGS. 1A to 1E and the like, the capacitance of the capacitor 112 is preferably lower than the parasitic capacitance of the load 200 (the light-emitting element 201), more preferably ½ or less of the parasitic capacitance of the load 200, still more preferably ⅕ or less of the parasitic capacitance of the load 200. Alternatively, the area of the electrodes of the capacitor 112 is preferably smaller than the area of the electrodes of the load 200 (the light-emitting element 201), more preferably ½ or less of the area of the electrodes of the load 200, still more preferably ⅕ or less of the area of the electrodes of the load 200. Accordingly, when voltage is divided by the capacitor 112 and the load 200 (the light-emitting element 201), higher voltage can be applied to the capacitor 112. Note that one aspect of the embodiment of the present invention is not limited thereto.

Note that in FIGS. 1A to 1E and the like, the capacitance of the capacitor 111 is preferably equal to or higher than the capacitance of the capacitor 112. The difference between the capacitance of the capacitor 111 and the capacitance of the capacitor 112 is preferably ±20% or lower, more preferably ±10% or lower. Alternatively, the area of the electrodes of the capacitor 111 is preferably equal to or larger than the area of the electrodes of the capacitor 112. Accordingly, the semiconductor device can perform optimum operation without changing the layout area. Note that one aspect of the embodiment of the present invention is not limited thereto.

Note that variations in threshold voltage and the like of the transistor 100 are corrected in this embodiment; however, one aspect of the embodiment of the present invention is not limited thereto. For example, the semiconductor device can operate by supply of current to the load 200 without compensating variations in threshold voltage.

In this embodiment, the examples of the basic principle are described. Thus, part or all of this embodiment can be freely combined with, applied to, or replaced with part or all of another embodiment.

Embodiment 2

In this embodiment, one embodiment of a semiconductor device according to the present invention and one embodiment of a method for driving the semiconductor device that are different from the semiconductor device and the method for driving the semiconductor device in Embodiment 1 are described.

Figure 7A:
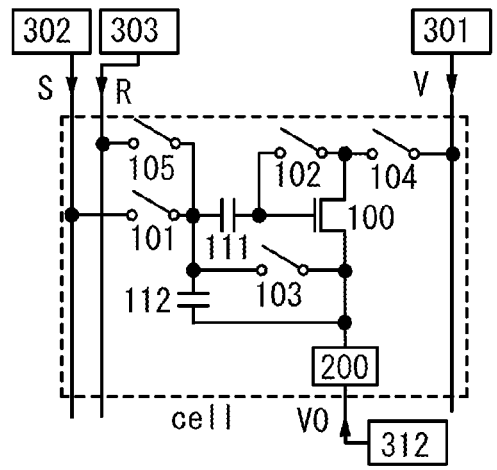
FIGS. 7A to 7E are circuit diagrams each illustrating the configuration of a semiconductor device.

FIG. 7A is a circuit diagram illustrating one embodiment of a semiconductor device according to the present invention.

In FIG. 7A, the semiconductor device includes the transistor 100, the load 200, the wiring S, the wiring V, a wiring R, the switch 101, the switch 102, the switch 103, the switch 104, a switch 105, the capacitor 111, and the capacitor 112. The configuration in FIG. 7A is obtained by addition of the switch 105 and the wiring R to the configuration in FIG. 1A. The switch 105 has a function of selecting conduction or non-conduction between the wiring R and one of the pair of electrodes of the capacitor 111.

Note that as illustrated in FIG. 7A, the wiring S is connected to at least a circuit 302 having a function of supplying the potential Vsig, for example. An example of the circuit 302 is a source driver (a signal line driver circuit). Accordingly, the wiring S has a function of capable of transmitting or supplying the potential Vsig. The wiring S functions as a video signal line.

An example of the potential Vsig is a signal for controlling the amount of current flowing to the load 200. Thus, the potential Vsig depends on the amount of current to be supplied to the load 200. For example, when current supplied to the load 200 is constant, the potential Vsig is constant. When current supplied to the load 200 is not constant, the potential Vsig changes over time depending on the amount of current supplied to the load 200. For example, the potential Vsig is an analog video signal.

Note that as illustrated in FIG. 7A, the wiring R is connected to at least a circuit 303 having a function of supplying the potential Vinit, for example. An example of the circuit 303 is an initialization circuit. Accordingly, the wiring R has a function of capable of transmitting or supplying the potential Vinit. The wiring R functions as an initialization line.

The potential Vinit is a potential for initializing the potential of each node in the semiconductor device, for example. Alternatively, the potential Vinit is a potential for supplying electric charge to the capacitor 111, for example. Alternatively, the potential Vinit is a potential for turning on the transistor 100, for example. Note that the potential Vinit is preferably constant; however, one aspect of the embodiment of the present invention is not limited thereto. The potential Vinit may vary like a pulse signal.

Note that as illustrated in FIG. 7A, the wiring V is connected to at least the circuit 301 for supplying a power supply potential (a high power supply potential or a low power supply potential), for example. An example of the circuit 301 is a power supply circuit. Accordingly, the wiring V has a function of capable of transmitting or supplying the power supply potential. Alternatively, the wiring V has a function of capable of supplying current to the transistor 100. Alternatively, the wiring V has a function of capable of supplying current to the load 200. The wiring V functions as a power supply line. Alternatively, the wiring V functions as a current supply line. Note that the potential of the wiring V is preferably constant; however, one aspect of the embodiment of the present invention is not limited thereto. The potential of the wiring V may vary like a pulse signal. For example, the potential of the wiring V may be a potential at which not only forward bias voltage but also reverse bias voltage is applied to the load 200.

Other portions in FIG. 7A are similar to those in FIG. 1A; thus, a description thereof is omitted.

Figure 7B:
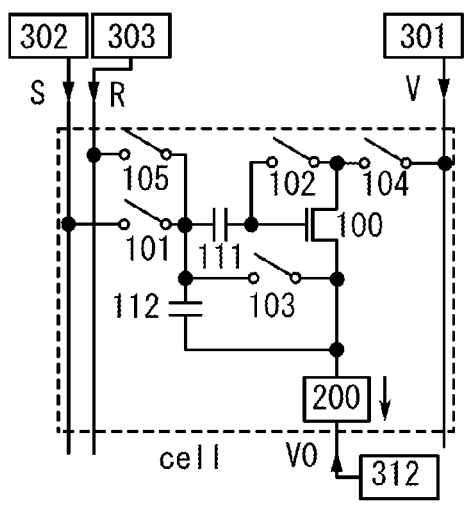

FIG. 7B is a circuit diagram illustrating one embodiment of a semiconductor device according to the present invention. The semiconductor device in FIG. 7B is an example of the semiconductor device in FIG. 7A, in which the transistor 100 is an n-channel transistor and a rectifier that allows current to flow from the wiring V to the wiring V0 (in the direction indicated by an arrow in FIG. 7B) is used as the load 200. The same portions as those in FIG. 7A are denoted by the same reference symbols, and a description thereof is omitted.

Figure 7C:
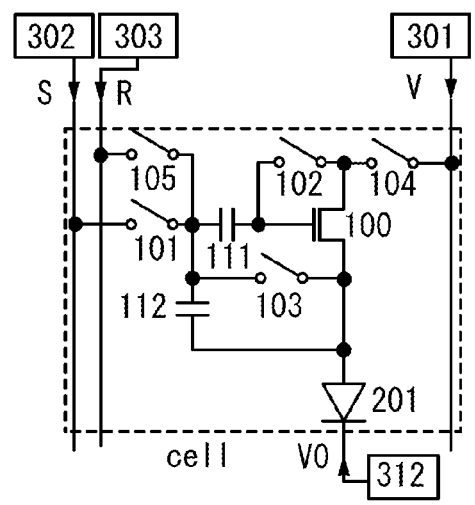

FIG. 7C is a circuit diagram illustrating one embodiment of a semiconductor device according to the present invention. The semiconductor device in FIG. 7C is an example in which the light-emitting element 201 is used as the load 200 in FIG.

7B. As illustrated in FIG. 7C, the anode of the light-emitting element 201 is connected to the transistor 100, and the cathode of the light-emitting element 201 is connected to the wiring V0. The same portions as those in FIG. 7B are denoted by the same reference symbols, and a description thereof is omitted.

Figure 7D:
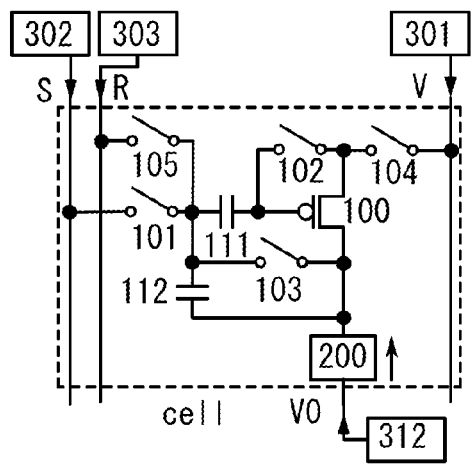

FIG. 7D is a circuit diagram illustrating one embodiment of a semiconductor device according to the present invention. The semiconductor device in FIG. 7D is an example of the semiconductor device in FIG. 7A, in which the transistor 100 is a p-channel transistor and a rectifier that allows current to flow from the wiring V0 to the wiring V (in the direction indicated by an arrow in FIG. 7D) is used as the load 200. The same portions as those in FIG. 7A are denoted by the same reference symbols, and a description thereof is omitted.

Figure 7E:
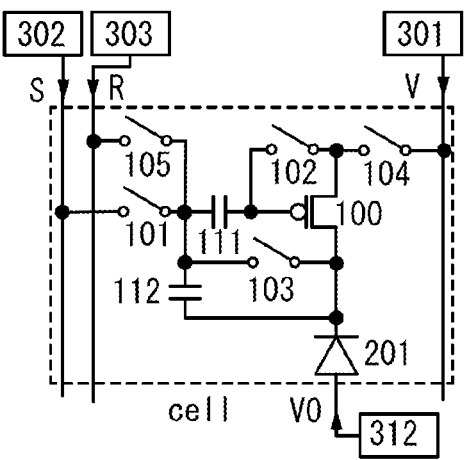

FIG. 7E is a circuit diagram illustrating one embodiment of a semiconductor device according to the present invention. The semiconductor device in FIG. 7E is an example in which the light-emitting element 201 is used as the load 200 in FIG. 7D. As illustrated in FIG. 7E, the cathode of the light-emitting element 201 is connected to the transistor 100, and the anode of the light-emitting element 201 is connected to the wiring V0. The same portions as those in FIG. 7D are denoted by the same reference symbols, and a description thereof is omitted.

Figure 8A:
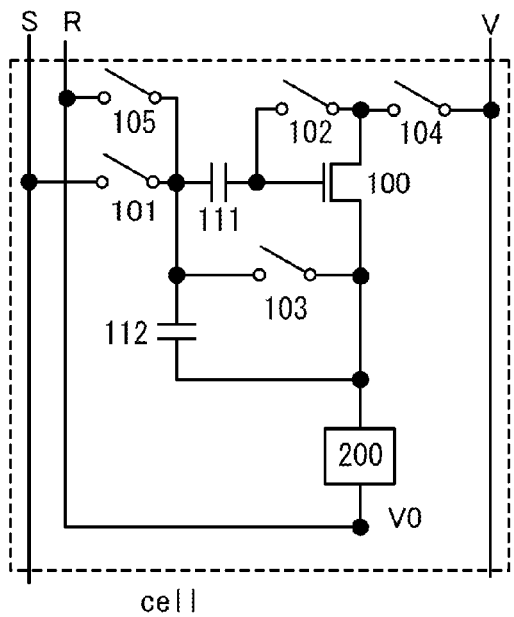
FIGS. 8A to 8C are circuit diagrams each illustrating the configuration of a semiconductor device.
Figure 8B:
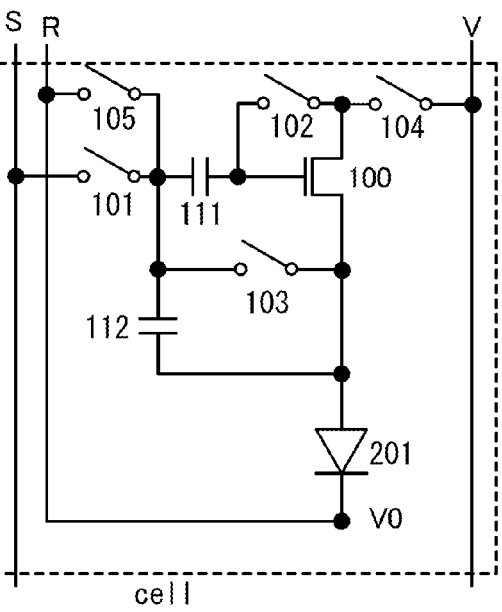
Figure 8C:
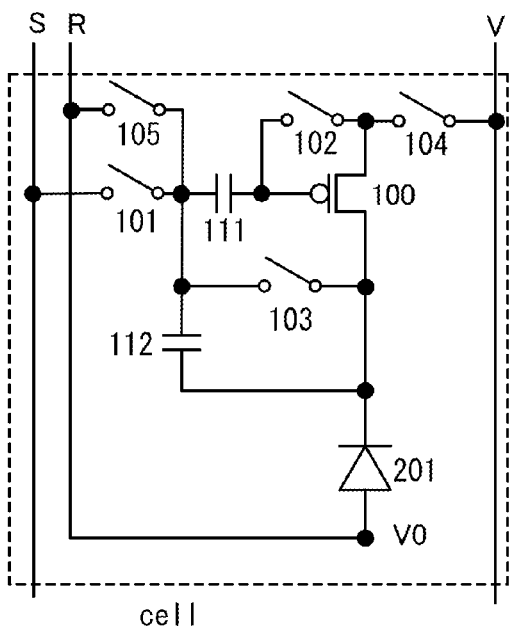

In FIGS. 7A to 7E, the wiring R can be connected to the wiring V0. For example, FIGS. 8A to 8C illustrate the case where the wiring R is connected to the wiring V0 in FIGS. 7A, 7C, and 7E. With such configurations, the number of wirings can be reduced.

Note that FIG. 7A and the like each illustrate a circuit configuration example; thus, a transistor can be additionally provided. In contrast, for each node in FIG. 7A and the like, it is possible not to provide an additional transistor, switch, passive element, or the like. For example, it is possible not to provide an additional transistor that is directly connected to a node where terminals of switches are connected to each other, a node where terminals of a transistor are connected to each other, and/or a node where terminals of a load are connected to each other. Accordingly, for example, it is possible to directly connect only the transistor 100 to a node where the load 200, the transistor 100, the capacitor 112, and the switch 103 are connected to each other (in the case where the switch 103 is a transistor, the transistor is excluded), and it is possible not to directly connect another transistor to the node.

<Method for Driving Semiconductor Device>

An example of a method for driving the semiconductor device in FIG. 7A is described. In the driving method, potentials input to the wirings and the like vary depending on the conductivity type of the transistor 100. Thus, a method for driving the semiconductor device in FIG. 7B having the n-channel transistor 100 and a method for driving the semiconductor device in FIG. 7D having the p-channel transistor 100 are sequentially described.

<Driving Method in the Case of N-Channel Transistor 100>

The method for driving the semiconductor device in FIG. 7B is described with reference to an example of a timing chart in FIG. 9.

Figure 9:
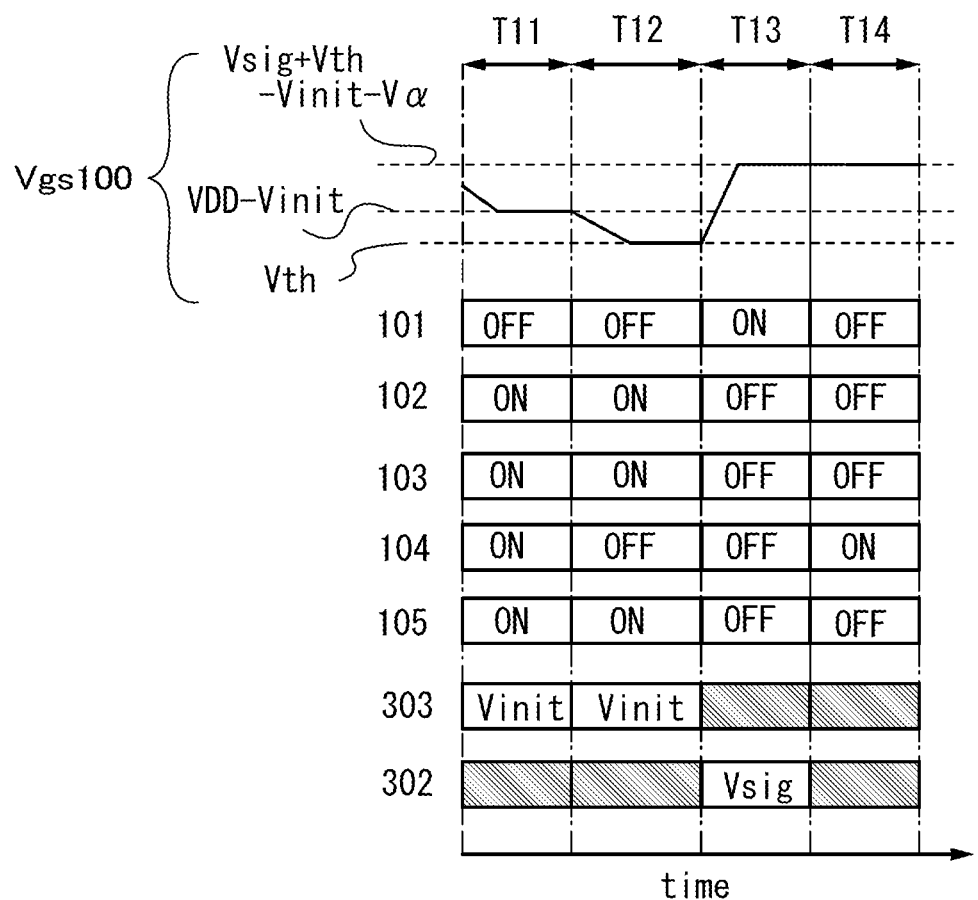
FIG. 9 is a timing chart illustrating a method for driving a semiconductor device.

In the timing chart in FIG. 9, Vgs100 represents a potential difference between the gate and the source of the transistor 100 in each period (each of the period T11, the period T12, the period T13, and the period T14). In the timing chart in FIG. 9, 101 represents the state of the switch 101 in each period; 102 represents the state of the switch 102 in each period; 103 represents the state of the switch 103 in each period; 104 represents the state of the switch 104 in each period; and 105 represents the state of the switch 105 in each period. In FIG. 9, "ON" represents the state where the switch is on, and "OFF" represents the state where the switch is off. In the timing chart in FIG. 9, 302 represents the potential of the wiring S that is controlled by the circuit 302 in each period, and 303 represents the potential of the wiring R that is controlled by the circuit 303 in each period. Note that the circuit 301 controls the potential of the wiring V so that the potential of the wiring V is VDD at least in the period T11 and the period T14. In the period T12 and the period T13, the potential of the wiring V is a given potential. The circuit 301 may control the potential of the wiring V so that the potential of the wiring V is VDD in the period T12 and/or the period T13.

Figure 10A:
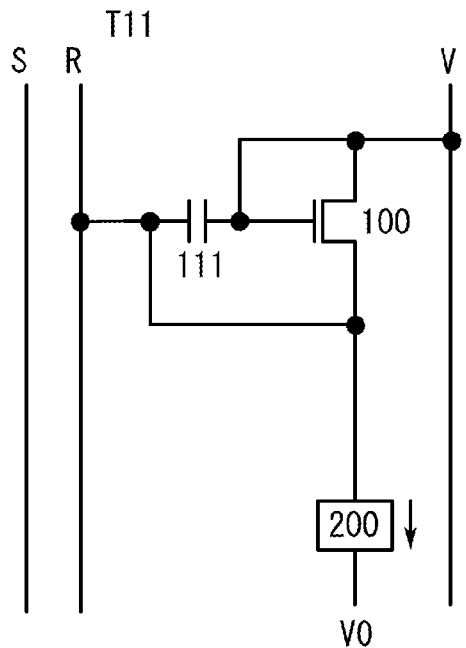
FIGS. 10A to 10D each illustrate an electrical connection in a semiconductor device in a predetermined period.

In the period T11, the switch 101 is turned off, and the switch 102, the switch 103, the switch 104, and the switch 105 are turned on. The potential of the wiring R is set to the initialization potential Vinit by the circuit 303. Here, the initialization potential Vinit is equal to or lower than the potential of the wiring V0, for example. While the switch 101 is off, the potential of the wiring S can be a given potential (indicated by diagonal lines in FIG. 9). The potential of the wiring V is VDD. FIG. 10A schematically illustrates a connection in the cell in the period T11. With such a connection, voltage held in the capacitor 111 becomes VDD−Vinit. The potential of the source of the transistor 100 becomes Vinit, the potential of the gate of the transistor 100 becomes VDD, and Vgs100 becomes VDD−Vinit. Note that VDD and Vinit are set such that VDD−Vinit is higher than the threshold voltage of the transistor 100. In this manner, the transistor 100 is turned on when the period T11 is terminated. Here, since the initialization potential Vinit is equal to or lower than a potential applied to the wiring V0, current does not flow to the load 200 in the period T11.

Figure 10B:
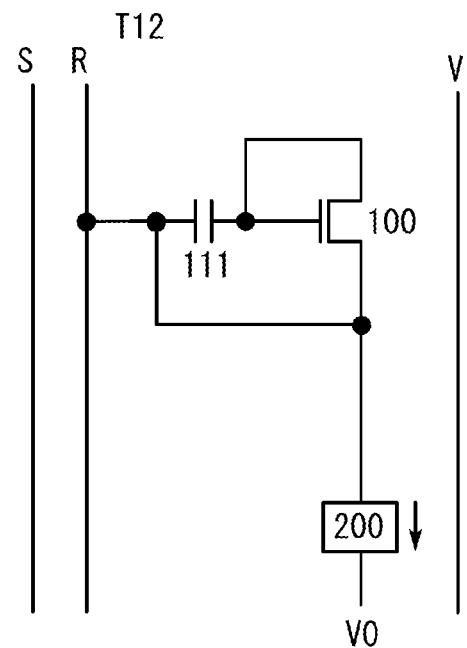

In the period T12, the switch 102, the switch 103, and the switch 105 are kept on, the switch 104 is turned off, and the switch 101 is kept off. The potential of the wiring R is kept at the initialization potential Vinit by the circuit 303. While the switch 101 is off, the potential of the wiring S can be a given potential (indicated by diagonal lines in FIG. 9). While the switch 104 is off, the potential of the wiring V can be a given potential. FIG. 10B schematically illustrates a connection in the cell in the period T12. With such a connection, electric charge held in the capacitor 111 is discharged through the source and the drain of the transistor 100 that is on. The electric charge is continuously discharged until the voltage held in the capacitor 111 becomes Vth and the transistor 100 is turned off. In this manner, the voltage held in the capacitor 111 becomes Vth. The potential of the source of the transistor 100 remains at Vinit, the potential of the gate of the transistor 100 becomes Vinit+Vth, and Vgs100 becomes Vth. In this manner, the threshold voltage Vth of the transistor 100 can be held in the capacitor 111. Since the initialization potential Vinit is equal to or lower than the potential of the wiring V0, current does not flow to the load 200 in the period T12 as in the period T11.

Note that in some cases, it takes a very long time for Vgs100 to be equal to the threshold voltage Vth of the transistor 100. Accordingly, in many cases, the next operation is performed while Vgs100 is not completely lowered to the threshold voltage Vth. That is, in many cases, the period T12 is terminated while Vgs100 is slightly higher than the threshold voltage Vth. In other words, at the termination of the period T12, Vgs100 becomes voltage based on the threshold voltage.

Figure 10C:
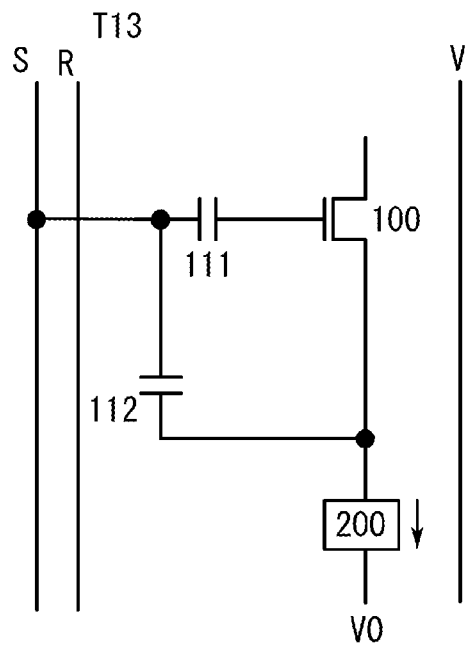

In the period T13, the switch 104 is kept off, the switch 101 is turned on, and the switch 102, the switch 103, and the switch 105 are turned off. Note that timing of turning on the switch 101 and timing of turning off any or all of the switch 102, the switch 103, and the switch 105 may be the same or different. The potential of the wiring S is set to the signal potential Vsig by the circuit 302. While the switch 105 is off, the potential of the wiring R can be a given potential (indicated by diagonal lines in FIG. 9). Note that since the switch 104 is off, the potential of the wiring V can be a given potential. FIG. 10C schematically illustrates a connection in the cell in the period T13. With such a connection, the voltage held in the capacitor 111 remains at Vth or the voltage based on Vth, and the potential of the source of the transistor 100 becomes Vinit+Vα. The potential of the gate of the transistor 100 becomes Vsig+Vth, and Vgs100 becomes Vsig+Vth−(Vinit+Vα). Here, Vα depends on the capacitance of the load 200, the capacitance of the capacitor 112, and the like. For example, Vα is positive voltage. In this manner, Vgs100 can be voltage that is based on the signal potential Vsig and is corrected in accordance with the threshold voltage of the transistor 100. When the capacitance of the load 200 is much higher than the capacitance of the capacitor 112, Vα is very low. Since the potential of the source of the transistor 100 becomes Vinit+Vα but Vα is very low, current does not flow to the load 200. Voltage held in the capacitor 112 becomes Vsig−(Vinit+Vα).

Note that in the period T13, the semiconductor device can operate while the switch 104 is turned on. In that case, current flows to the transistor 100, and electric charge in the capacitor 112 is discharged by the current. At this time, discharge capacity varies depending on current characteristics (e.g., mobility) of the transistor 100. For example, higher mobility of the transistor 100 can increase electric discharge per unit time. Thus, when the switch 104 is turned on and the electric charge in the capacitor 112 is discharged, Vgs100 can be corrected in accordance with variations, degradation, and the like of the current characteristics of the transistors 100.

Figure 10D:
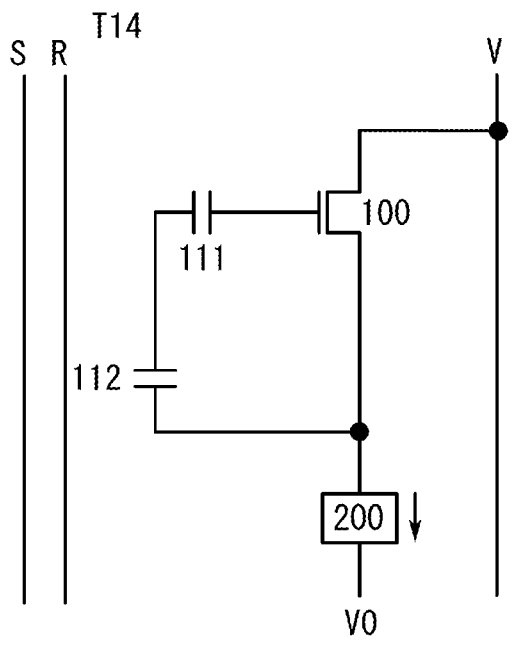

In the period T14, the switch 102, the switch 103, and the switch 105 are kept off, the switch 101 is turned off, and the switch 104 is turned on. Note that timing of turning off the switch 101 and timing of turning on the switch 104 may be the same or different. While the switch 101 is off, the potential of the wiring S can be a given potential (indicated by diagonal lines in FIG. 9). While the switch 104 is on, the potential of the wiring V is VDD. FIG. 10D schematically illustrates a connection in the cell in the period T14. With such a connection, the voltage held in the capacitor 111 remains at Vth, the voltage held in the capacitor 112 remains at Vsig−(Vinit+Vα), Vgs100 remains at Vsig+Vth−(Vinit+Vα), and the potential of the source of the transistor 100 becomes VEL. Further, the potential of the gate of the transistor 100 becomes Vsig+Vth−(Vinit+Vα)+VEL. Here, VEL is equal to or higher than the potential applied to the wiring V0 and equal to or lower than VDD. In this manner, the transistor 100 supplies drain current based on Vgs100 to the load 200.

In the driving method described with reference to the timing chart in FIG. 9, Vgs100 is voltage that is based on the signal potential Vsig and is corrected in accordance with the threshold voltage of the transistor 100. Thus, even when the threshold voltage of the transistor 100 is varied or changed, for example, a variation or change in the amount of current supplied to the load 200 can be reduced. Further, even when the level of the potential VEL of the source of the transistor 100 is changed due to variations in characteristics of the load 200, the potential of the gate of the transistor 100 is similarly changed; thus, Vgs100 is not changed. Consequently, even when the characteristics of the load 200 are changed, degraded, or varied, predetermined current can be supplied to the load 200.

The above is the description of the semiconductor device in FIG. 7B and the method for driving the semiconductor device.

In this embodiment, the semiconductor devices in FIGS. 7A to 7E and the like are obtained by addition of the wiring R and the switch 105 to the semiconductor devices in FIGS. 1A to 1E and the like in Embodiment 1. With these configurations, in the period T11, the period T12, and the period T13, predetermined potentials can be supplied from different wirings. Thus, the period T11, the period T12, and the period T13 can be prolonged. Alternatively, the number of cells to be connected to the wiring S can be increased.

Since the potential Vinit is not supplied to the wiring S, a change in potential of the wiring S can be made small, so that the power consumption of the semiconductor device can be reduced.

Note that the configuration of the semiconductor device according to one embodiment of the present invention is not limited to the configuration in FIG. 7B. The semiconductor device according to one embodiment of the present invention can have the transistor 100, the load 200, the wiring S, the wiring V, and any number of switches to select the four connections in FIGS. 10A to 10D.

Figure 11A:
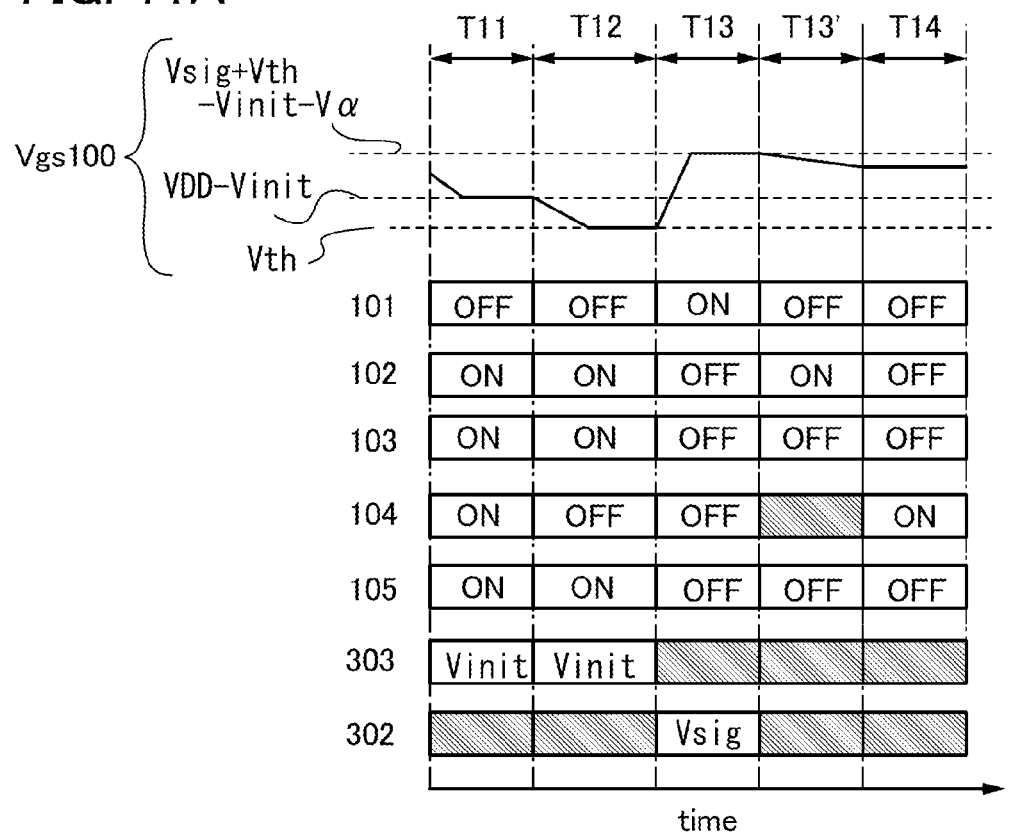
FIG. 11A is a timing chart illustrating a method for driving a semiconductor device, and FIGS. 11B and 11C each illustrate an electrical connection in the semiconductor device in a predetermined period.

The method for driving the semiconductor device in FIG. 7B is not limited to the driving method described with reference to the timing chart in FIG. 9. Some of the periods can be omitted or a different period can be added. For example, a driving method described with reference to a timing chart in FIG. 11A can be used. In the timing chart in FIG. 11A, operations in the period T11, the period T12, the period T13, and the period T14 are similar to the operations described with reference to FIG. 9. The timing chart in FIG. 11A differs from the timing chart in FIG. 9 in that the period T13' is provided after the period T13.

Figure 11B:
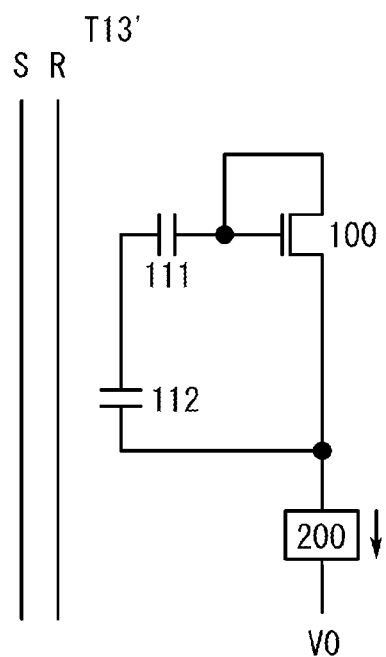
Figure 11C:
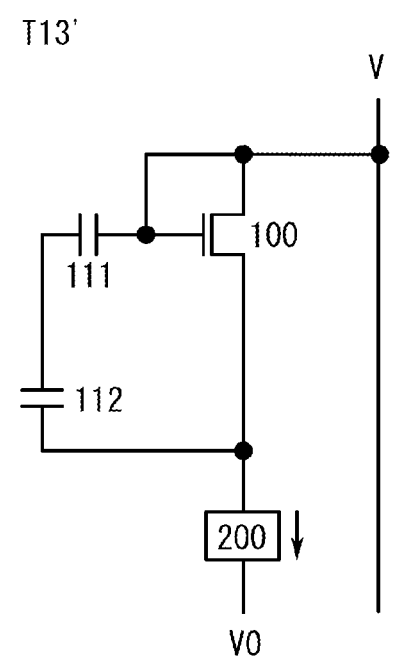

In the period T13', the switch 103 and the switch 105 are kept off, the switch 101 is turned off, and the switch 102 is turned on. The switch 104 may be kept off or may be turned on. Note that timing of turning off the switch 101 and timing of turning on the switch 102 may be the same or different. In the case where the switch 104 is turned on in the period T13', timing of turning on the switch 104 may be the same as or different from the timing of turning off the switch 101 or the timing of turning on the switch 102. While the switch 101 is off, the potential of the wiring S can be a given potential (indicated by diagonal lines in FIG. 11A). While the switch 105 is off, the potential of the wiring R can be a given potential (indicated by diagonal lines in FIG. 11A). When the switch 104 is off, the potential of the wiring V can be a given potential. When the switch 104 is on, the potential of the wiring V is VDD. FIG. 11B schematically illustrates a connection in the cell in which the switch 104 is off in the period T13'. FIG. 11C schematically illustrates a connection in the cell in which the switch 104 is on in the period T13'.

With a connection in FIG. 11B or 11C, electric charge held in the capacitor 111 and the capacitor 112 can be discharged via the transistor 100. Here, discharge capacity per unit time varies depending on current characteristics (e.g., mobility) of the transistor 100. In other words, higher mobility of the transistor 100 can increase electric discharge per unit time. Thus, when the electric charge is discharged in a very short time, Vgs100 can be corrected in accordance with the mobility of the transistor 100.

The operation in the period T14 after the period T13' is similar to the operation described with reference to FIG. 9. In the driving method described with reference to the timing chart in FIG. 11A, Vgs100 is voltage that is based on the signal potential Vsig and is corrected in accordance with the threshold voltage and mobility of the transistor 100. Thus, even when the threshold voltage and mobility of the transistor 100 are varied or changed, for example, a variation or change in the amount of current supplied to the load 200 can be reduced. Further, even when the level of the potential VEL of the source of the transistor 100 is changed due to changes, variations, or degradation of the characteristics of the load 200, the potential of the gate of the transistor 100 is similarly changed; thus, Vgs100 is not changed. Consequently, even when the characteristics of the load 200 are changed, predetermined current can be supplied to the load 200.

Note that the configuration of the semiconductor device according to one embodiment of the present invention is not limited to the configuration in FIG. 7B. The semiconductor device according to one embodiment of the present invention can have the transistor 100, the load 200, the wiring S, the wiring V, the wiring R, and any number of switches to select the fifth connections in FIGS. 10A to 10D and FIG. 11B or 11C.

The method for driving the semiconductor device has been described using the example in which the transistor 100 is an n-channel transistor, the load 200 has a rectifying property, and current flows from the wiring V to the wiring V0 in FIG. 7B. When the load 200 in FIG. 7B is the light-emitting element 201, the semiconductor device in FIG. 7B has the same configuration as the semiconductor device in FIG. 7C. Thus, the semiconductor device in FIG. 7C can also be operated by the driving method.

<Driving Method in the Case of P-Channel Transistor 100>

The method for driving the semiconductor device in FIG. 7D is described with reference to an example of a timing chart in FIG. 12.

Figure 12:
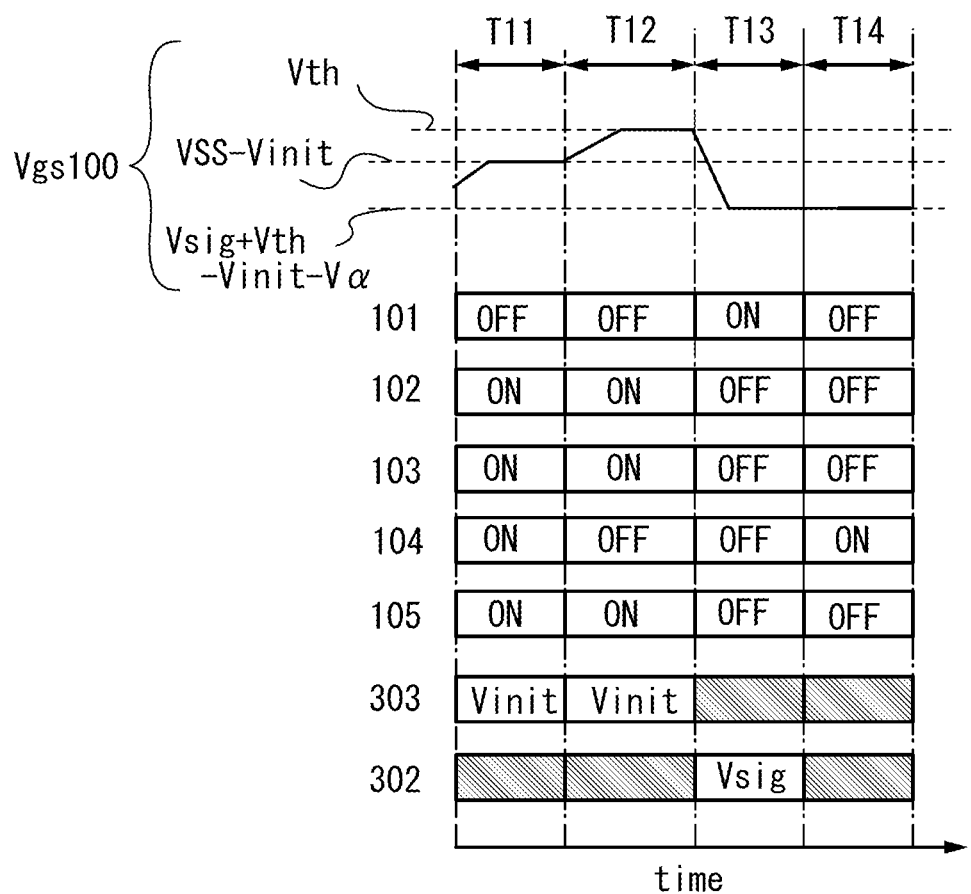
FIG. 12 is a timing chart illustrating a method for driving a semiconductor device.

In the timing chart in FIG. 12, Vgs100 represents a potential difference between the gate and the source of the transistor 100 in each period (each of the period T11, the period T12, the period T13, and the period T14). In the timing chart in FIG. 12, 101 represents the state of the switch 101 in each period; 102 represents the state of the switch 102 in each period; 103 represents the state of the switch 103 in each period; 104 represents the state of the switch 104 in each period; and 105 represents the state of the switch 105 in each period. In FIG. 12, "ON" represents the state where the switch is on, and "OFF" represents the state where the switch is off. In the timing chart in FIG. 12, 302 represents the potential of the wiring S that is controlled by the circuit 302 in each period, and 303 represents the potential of the wiring R that is controlled by the circuit 303 in each period. Note that the circuit 301 controls the potential of the wiring V so that the potential of the wiring V is VSS at least in the period T11 and the period T14. In the period T12 and the period T13, the potential of the wiring V is a given potential. The circuit 301 may control the potential of the wiring V so that the potential of the wiring V is VSS in the period T12 and/or the period T13.

Figure 47A:
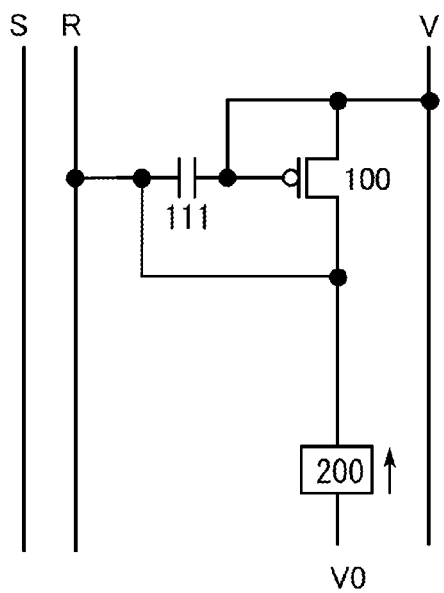
FIGS. 47A to 47D each illustrate an electrical connection in a semiconductor device in a predetermined period.

In the period T11, the switch 101 is turned off, and the switch 102, the switch 103, the switch 104, and the switch 105 are turned on. The potential of the wiring R is set to the initialization potential Vinit by the circuit 303. Here, the initialization potential Vinit is equal to or higher than the potential of the wiring V0, for example. While the switch 101 is off, the potential of the wiring S can be a given potential (indicated by diagonal lines in FIG. 12). The potential of the wiring V is VSS. FIG. 47A schematically illustrates a connection in the cell in the period T11. With such a connection, voltage held in the capacitor 111 becomes VSS−Vinit. The potential of the source of the transistor 100 becomes Vinit, the potential of the gate of the transistor 100 becomes VSS, and Vgs100 becomes VSS−Vinit. Note that VSS and Vinit are set such that VSS−Vinit is lower than the threshold voltage of the transistor 100. In this manner, the transistor 100 is turned on when the period T11 is terminated. Here, since the initialization potential Vinit is equal to or higher than the potential of the wiring V0, current does not flow to the load 200 in the period T11.

Figure 47B:
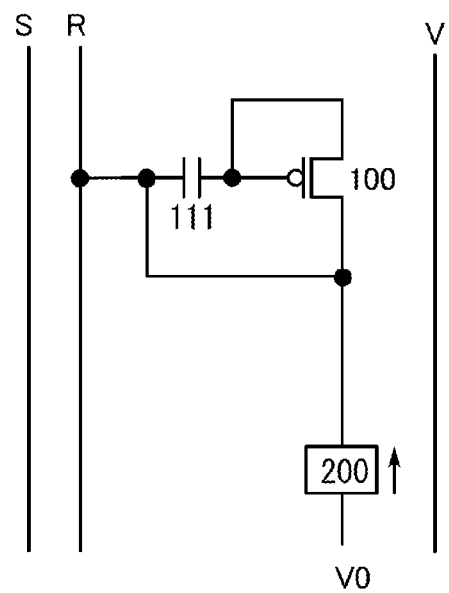

In the period T12, the switch 101 is kept off, the switch 102, the switch 103, and the switch 105 are kept on, and the switch 104 is turned off. The potential of the wiring R is kept at the initialization potential Vinit by the circuit 303. While the switch 101 is off, the potential of the wiring S can be a given potential (indicated by diagonal lines in FIG. 12). While the switch 104 is off, the potential of the wiring V can be a given potential. FIG. 47B schematically illustrates a connection in the cell in the period T12. With such a connection, electric charge held in the capacitor 111 is discharged through the source and the drain of the transistor 100 that is on. The electric charge is continuously discharged until the voltage held in the capacitor 111 becomes Vth and the transistor 100 is turned off. In this manner, the voltage held in the capacitor 111 becomes Vth. The potential of the source of the transistor 100 remains at Vinit, the potential of the gate of the transistor 100 becomes Vinit+Vth, and Vgs100 becomes Vth. In this manner, the threshold voltage Vth of the transistor 100 can be held in the capacitor 111. Since the initialization potential Vinit is equal to or higher than the potential of the wiring V0, current does not flow to the load 200 in the period T12 as in the period T11.

Note that in some cases, it takes a very long time for Vgs100 to be equal to the threshold voltage Vth of the transistor 100. Accordingly, in many cases, the next operation is performed while Vgs100 is not completely raised to the threshold voltage Vth. That is, in many cases, the period T12 is terminated while Vgs100 is slightly lower than the threshold voltage Vth. In other words, at the termination of the period T12, Vgs100 becomes voltage based on the threshold voltage.

Figure 47C:
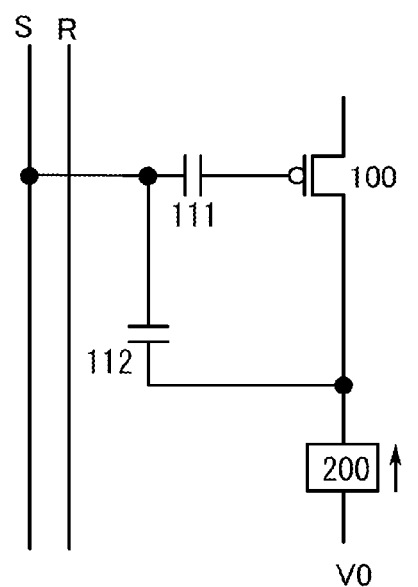

In the period T13, the switch 104 is kept off, the switch 101 is turned on, and the switch 102, the switch 103, and the switch 105 are turned off. Note that timing of turning on the switch 101 and timing of turning off any or all of the switch 102, the switch 103, and the switch 105 may be the same or different. The potential of the wiring S is set to the signal potential Vsig by the circuit 302. While the switch 105 is off, the potential of the wiring R can be a given potential (indicated by diagonal lines in FIG. 12). Note that since the switch 104 is off, the potential of the wiring V can be a given potential. FIG. 47C schematically illustrates a connection in the cell in the period T13. With such a connection, the voltage held in the capacitor 111 remains at Vth or the voltage based on Vth, and the potential of the source of the transistor 100 becomes Vinit+Vα. The potential of the gate of the transistor 100 becomes Vsig+Vth, and Vgs100 becomes Vsig+Vth−(Vinit+Vα). Here, Vα depends on the capacitance of the load 200, the capacitance of the capacitor 112, and the like. For example, Vα is negative voltage. In this manner, Vgs100 can be voltage that is based on the signal potential Vsig and is corrected in accordance with the threshold voltage of the transistor 100. When the capacitance of the load 200 is much higher than the capacitance of the capacitor 112, Vα is very low. Since the potential of the source of the transistor 100 becomes Vinit+Vα but Vα is very low, current does not flow to the load 200. Voltage held in the capacitor 112 becomes Vsig−(Vinit+Vα).

Note that in the period T13, the semiconductor device can operate while the switch 104 is turned on. In that case, current flows to the transistor 100, and electric charge in the capacitor 112 is discharged by the current. At this time, discharge capacity varies depending on current characteristics (e.g., mobility) of the transistor 100.

For example, higher mobility of the transistor 100 can increase electric discharge per unit time. Thus, when the switch 104 is turned on and the electric charge in the capacitor 112 is discharged, Vgs100 can be corrected in accordance with the mobility of the transistor 100. In this manner, Vgs100 can be corrected in accordance with variations, degradation, and the like of the current characteristics of the transistors 100.

Figure 47D:
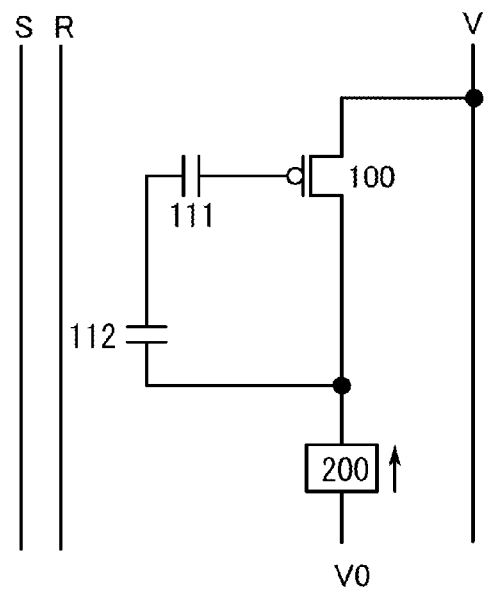

In the period T14, the switch 102, the switch 103, and the switch 105 are kept off, the switch 101 is turned off, and the switch 104 is turned on. Note that timing of turning off the switch 101 and timing of turning on the switch 104 may be the same or different. While the switch 101 is off, the potential of the wiring S can be a given potential (indicated by diagonal lines in FIG. 12). While the switch 104 is on, the potential of the wiring V is VSS. FIG. 47D schematically illustrates a connection in the cell in the period T14. With such a connection, the voltage held in the capacitor 111 remains at Vth, the voltage held in the capacitor 112 remains at Vsig−(Vinit+Vα), Vgs100 remains at Vsig+Vth−(Vinit+Vα), and the potential of the source of the transistor 100 becomes VEL. Further, the potential of the gate of the transistor 100 becomes Vsig+Vth−(Vinit+Vα)+VEL. Here, VEL is equal to or higher than VSS and equal to or lower than the potential of the wiring V0. In this manner, the transistor 100 supplies drain current based on Vgs100 to the load 200.

In the period T14, Vgs100 is voltage that is based on the signal potential Vsig and is corrected in accordance with the threshold voltage of the transistor 100. Thus, even when the threshold voltage of the transistor 100 is varied, predetermined drain current that is based on the signal potential Vsig can be supplied to the load 200. Further, even when the level of the potential VEL of the source of the transistor 100 is changed due to changes in characteristics of the load 200, the potential of the gate of the transistor 100 is similarly changed; thus, Vgs100 is not changed. Consequently, even when the characteristics of the load 200 are changed, predetermined current can be supplied to the load 200.

Figure 13A:
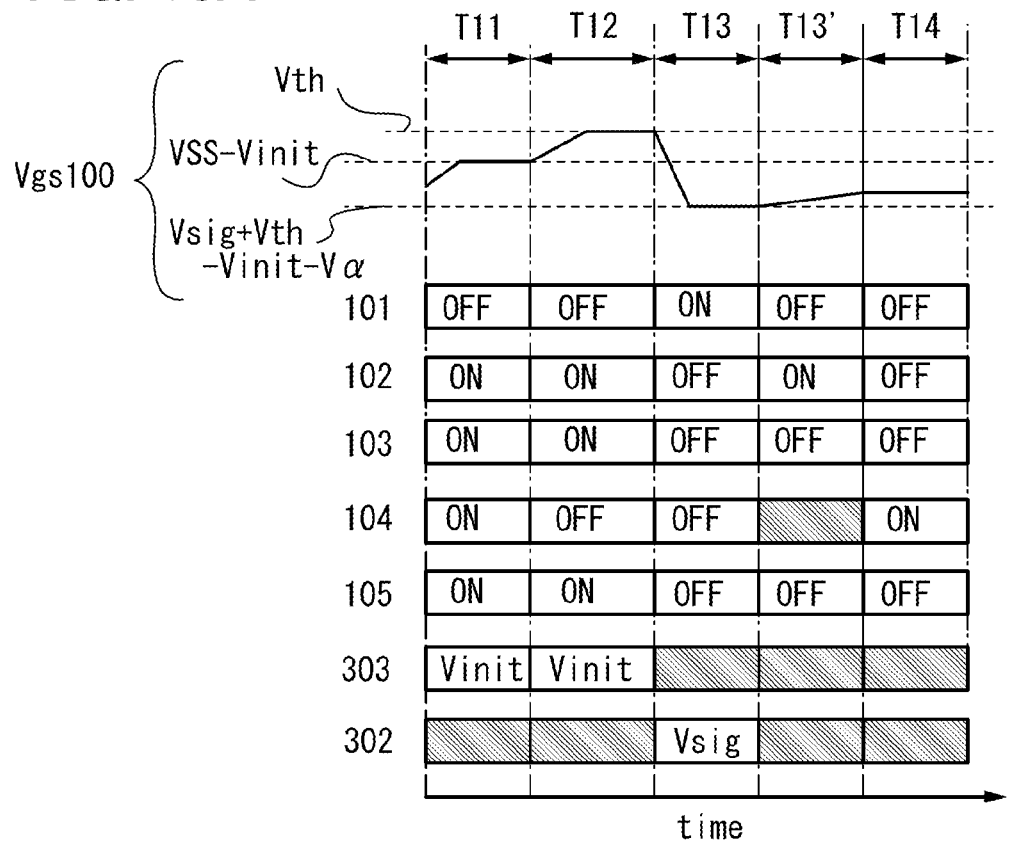
FIG. 13A is a timing chart illustrating a method for driving a semiconductor device, and FIGS. 13B and 13C each illustrate an electrical connection in the semiconductor device in a predetermined period.

Note that the configuration of the semiconductor device according to one embodiment of the present invention is not limited to the configuration in FIG. 7D. The semiconductor device according to one embodiment of the present invention can have the transistor 100, the load 200, the wiring S, the wiring V, and any number of switches to select the four connections in FIGS. 47A to 47D The method for driving the semiconductor device in FIG. 7D is not limited to the driving method described with reference to the timing chart in FIG. 12. For example, a driving method described with reference to a timing chart in FIG. 13A can be used. In the timing chart in FIG. 13A, operations in the period T11, the period T12, the period T13, and the period T14 are similar to the operations described with reference to FIG. 12. The timing chart in FIG. 13A differs from the timing chart in FIG. 12 in that the period T13' is provided after the period T13.

Figure 13B:
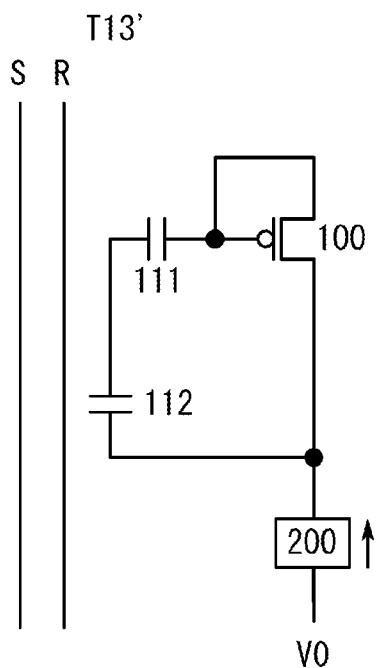
Figure 13C:
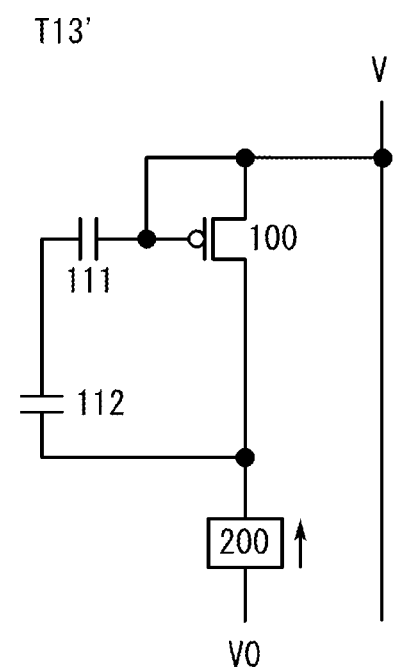

In the period T13', the switch 103 and the switch 105 are kept off, the switch 101 is turned off, and the switch 102 is turned on. The switch 104 may be kept off or may be turned on (indicated by diagonal lines in FIG. 13A). Note that some or all of timing of turning off the switch 101, timing of turning off the switch 105, and timing of turning on the switch 102 may be the same or different. In the case where the switch 104 is turned on in the period T13', timing of turning on the switch 104 may be the same as or different from the timing of turning off the switch 101, the timing of turning off the switch 105, or the timing of turning on the switch 102. While the switch 101 is off, the potential of the wiring S can be a given potential (indicated by diagonal lines in FIG. 13A). While the switch 105 is off, the potential of the wiring R can be a given potential (indicated by diagonal lines in FIG. 13A). When the switch 104 is off, the potential of the wiring V can be a given potential. When the switch 104 is on, the potential of the wiring V is VSS. FIG. 13B schematically illustrates a connection in the cell in which the switch 104 is off in the period T13'. FIG. 13C schematically illustrates a connection in the cell in which the switch 104 is on in the period T13'.

With a connection in FIG. 13B or 13C, electric charge held in the capacitor 111 and the capacitor 112 can be discharged via the transistor 100. Here, discharge capacity per unit time varies depending on the mobility of the transistor 100. In other words, higher mobility of the transistor 100 can increase electric discharge per unit time. Thus, when the electric charge is discharged in a very short time, Vgs100 can be corrected in accordance with the mobility of the transistor 100.

The operation in the period T14 after the period T13' is similar to the operation described with reference to FIG. 12. In the driving method described with reference to the timing chart in FIG. 13A, Vgs100 is voltage that is based on the signal potential Vsig and is corrected in accordance with the threshold voltage and mobility of the transistor 100. Thus, even when the threshold voltage and mobility of the transistor 100 are varied, a variation in the amount of current supplied to the load 200 can be reduced. Further, even when the level of the potential VEL of the source of the transistor 100 is changed due to changes in characteristics of the load 200, the potential of the gate of the transistor 100 is similarly changed; thus, Vgs100 is not changed. Consequently, even when the characteristics of the load 200 are changed, predetermined current can be supplied to the load 200.

Note that the configuration of the semiconductor device according to one embodiment of the present invention is not limited to the configuration in FIG. 7D. The semiconductor device according to one embodiment of the present invention can have the transistor 100, the load 200, the wiring S, the wiring V, the wiring R, and any number of switches to select the fifth connections in FIGS. 47A to 47D and FIG. 13B or 13C.

The method for driving the semiconductor device has been described using the example in which the transistor 100 is a p-channel transistor, the load 200 has a rectifying property, and current flows from the wiring V0 to the wiring V in FIG. 7D. When the load 200 in FIG. 7D is the light-emitting element 201, the semiconductor device in FIG. 7D has the same configuration as the semiconductor device in FIG. 7E. Thus, the semiconductor device in FIG. 7E can also be operated by the driving method.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

Embodiment 3

The semiconductor device according to the present invention can have a plurality of blocks each shown as "cell" in the diagrams in Embodiments 1 and 2 (such a block is hereinafter also referred to as a basic circuit). In that case, a wiring can be shared with a plurality of basic circuits, whereby the semiconductor device can be downsized. In a display device and a light-emitting device, the use of the basic circuits as pixels increases the pixel density. Examples of structures for sharing wirings will be described below in detail with reference to diagrams. Note that in the diagrams shown below, a plurality of basic circuits are distinguished from each other by symbols such as (i,j), wirings arranged in the row direction are distinguished from each other by symbols such as (i), and wirings arranged in the column direction are distinguished from each other by symbols such as (j). Note also that the configurations of the basic circuits are similar to those shown in Embodiments 1 and 2.

FIGS. 14A to 14E, FIGS. 15A to 15F, and FIGS. 16A and 16B are schematic diagrams and circuit diagrams each illustrating the configuration of a semiconductor device including a plurality of basic circuits represented by "cell" in the diagrams in Embodiment 1.

Figure 14A:
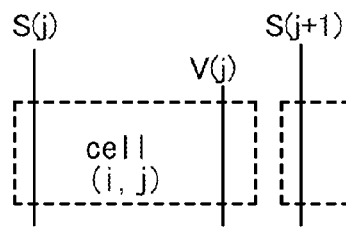
FIGS. 14A to 14E are schematic diagrams and circuit diagrams for illustrating wire sharing structures in a semiconductor device.
Figure 14B:
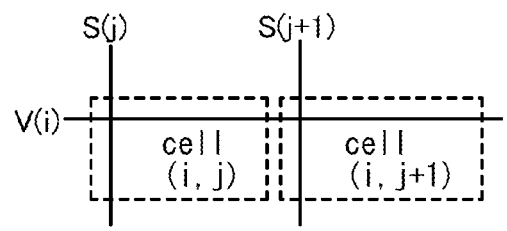
Figure 14C:
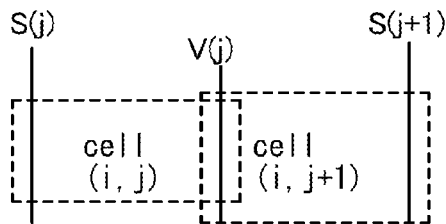
Figure 14D:
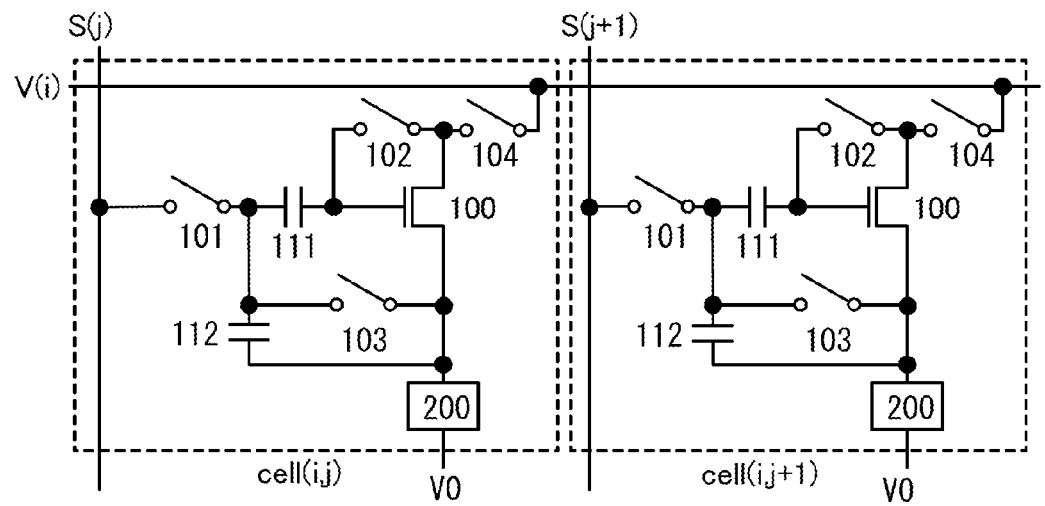
Figure 14E:
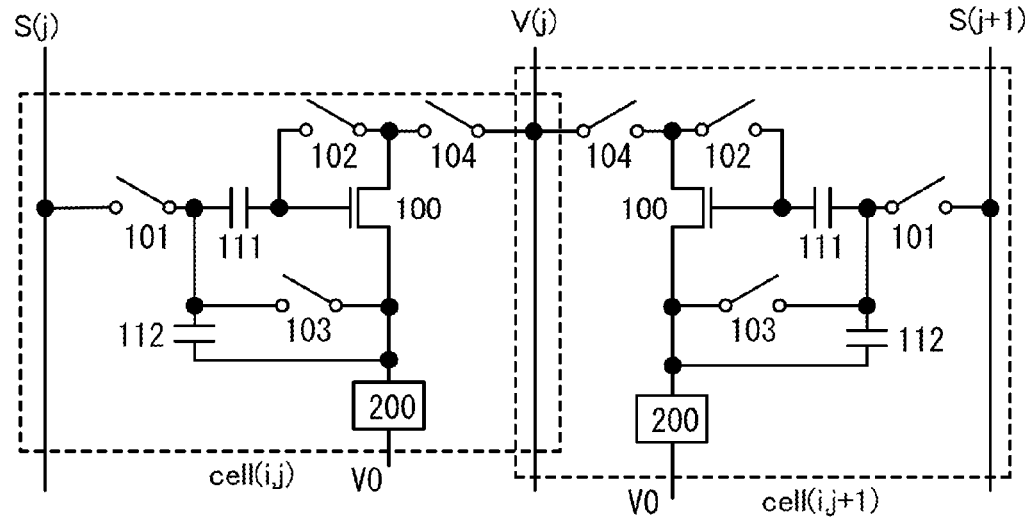

FIG. 14A illustrates basic circuits (cell(i,j) and cell(i,j+1)) in adjacent columns. In each of the basic circuits, the wiring S and the wiring V are provided in the column direction. FIG. 14B illustrates an example in which the direction of the wiring V in FIG. 14A is changed so that a wiring V(i) is provided in the row direction and shared with the two basic circuits. FIG. 14C illustrates an example in which a wiring V(j) provided in the column direction in FIG. 14A is shared with the two basic circuits. FIG. 14D is an example of a circuit diagram illustrating the configuration in FIG. 14B more specifically. FIG. 14E is an example of a circuit diagram illustrating the configuration in FIG. 14C more specifically.

Figure 15A:
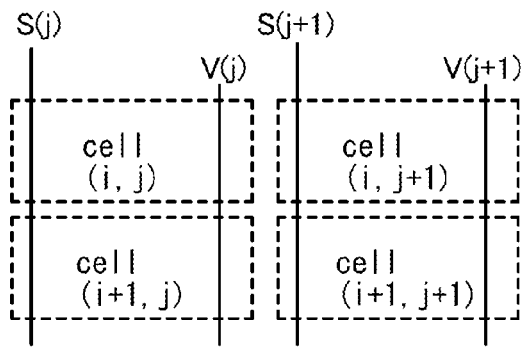
FIGS. 15A to 15F are schematic diagrams each illustrating a wire sharing structure in a semiconductor device.
Figure 15B:
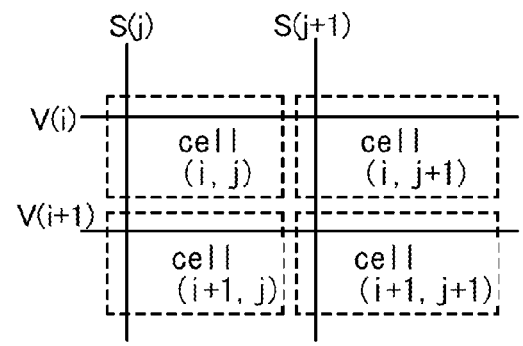
Figure 15C:
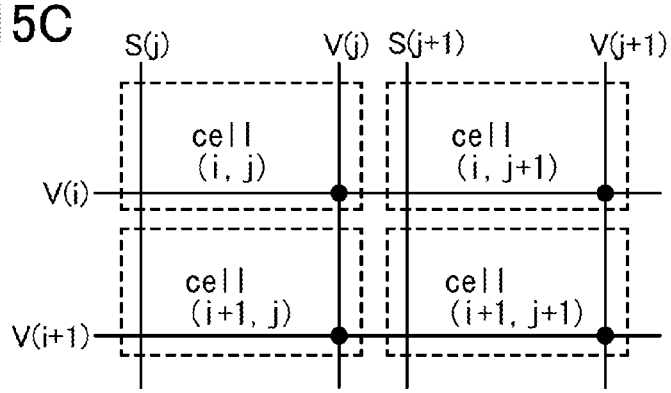
Figure 15D:
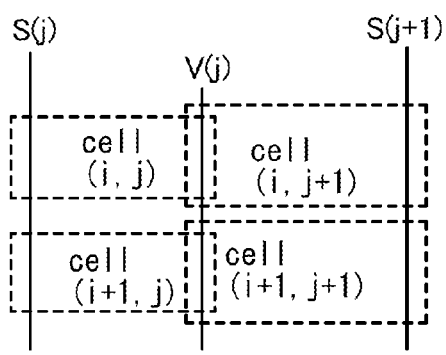
Figure 15E:
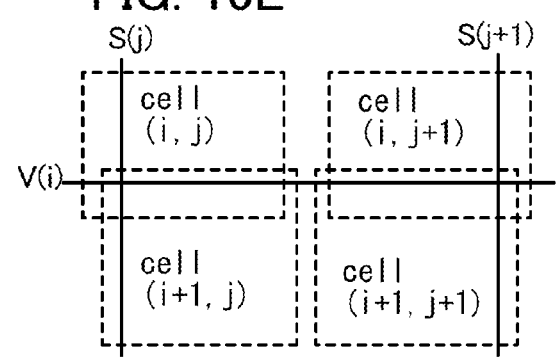
Figure 15F:
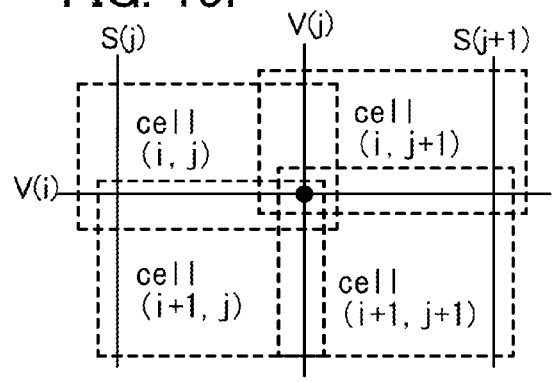
Figure 16A:
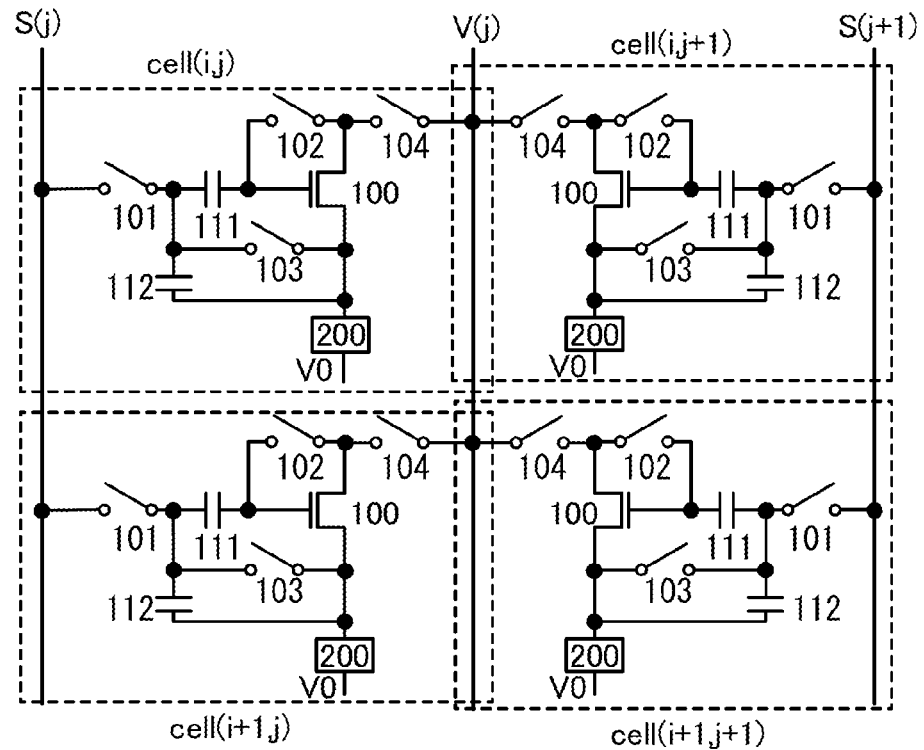
FIGS. 16A and 16B are circuit diagrams each illustrating a wire sharing structure in a semiconductor device.
Figure 16B:
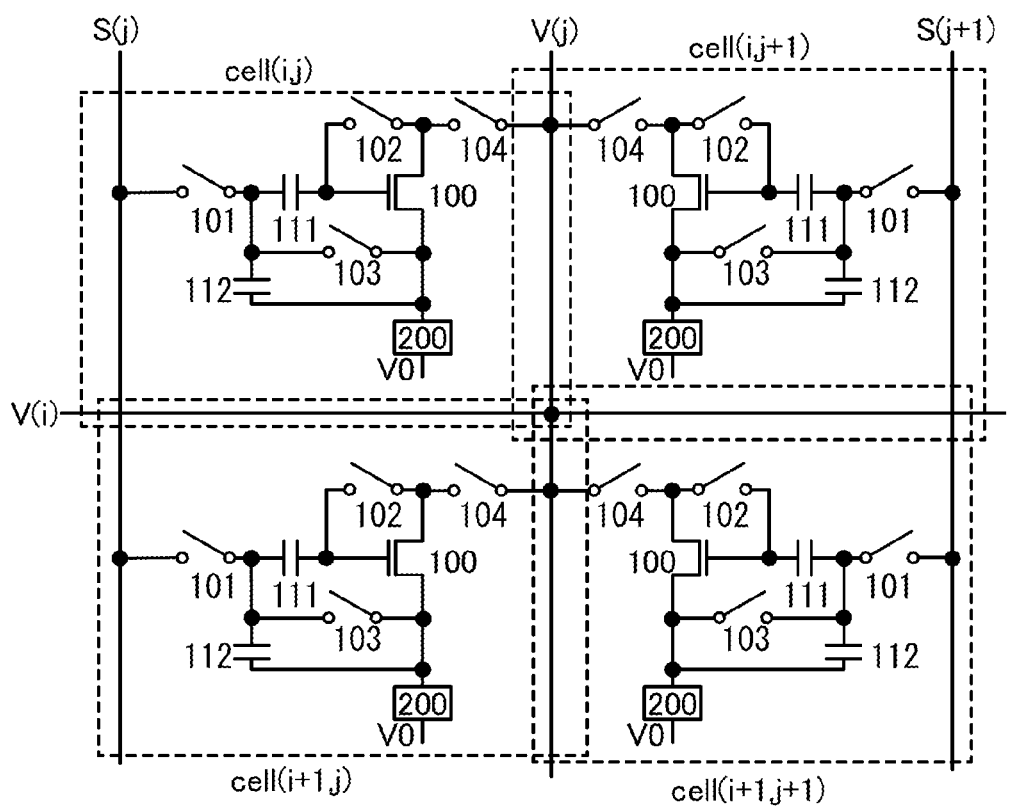

FIG. 15A illustrates four adjacent basic circuits (cell(i,j), cell(i,j+1), cell(i+1,j), and cell(i+1,j+1)). The cell(i,j) and the cell(i+1,j) share a wiring S(j) and the wiring V(j). The cell(i,j+1) and the cell(i+1,j+1) share a wiring S(j+1) and a wiring V(j+1). FIG. 15B illustrates an example in which the direction of the wirings V in FIG. 15A is changed so that the wiring V(i) and a wiring V(i+1) are provided in the row direction, the cell(i,j) and the cell(i,j+1) share the wiring V(i), and the cell(i+1,j) and the cell(i+1,j+1) share the wiring V(i+1). FIG. 15C illustrates an example in which the wirings V are provided in the row and column directions; the cell(i,j) and the cell(i,j+1) share the wiring V(i), the cell(i+1,j) and the cell(i+1,j+1) share the wiring V(i+1), the cell(i,j) and the cell(i+1,j) share the wiring V(j), and the cell(i,j+1) and the cell(i+1,j+1) share the wiring V(j+1). The wiring V(i), the wiring V(i+1), the wiring V(j), and the wiring V(j+1) can be connected to each other. By providing the wirings V in such a manner, adverse effects of voltage drop due to wiring resistance or the like can be reduced and a constant potential can be supplied to a plurality of basic circuits. Thus, the configuration illustrated in FIG. 15C is particularly effective for a structure including a plurality of basic circuits, for example, a display device and a light-emitting device that include the basic circuits as pixels. FIG. 15D illustrates an example in which the wiring V(j) is shared between adjacent columns FIG. 15E illustrates an example in which the wiring V(i) is shared between adjacent rows. FIG. 15F illustrates an example in which the wiring V(j) and the wiring V(i) are provided, the wiring V(j) is shared between adjacent columns, and the wiring V(i) is shared between adjacent rows. The wiring V(i) and the wiring V(j) can be connected to each other. By providing the wirings V in such a manner, adverse effects of voltage drop due to wiring resistance or the like can be reduced and a constant potential can be supplied to a plurality of basic circuits. Thus, the configuration illustrated in FIG. 15F is particularly effective for a structure including a plurality of basic circuits, for example, a display device and a light-emitting device that include the basic circuits as pixels. FIG. 16A is an example of a circuit diagram illustrating the configuration in FIG. 15D more specifically. FIG. 16B is an example of a circuit diagram illustrating the configuration in FIG. 15F more specifically.

FIGS. 17A to 17I, FIGS. 18A and 18B, FIGS. 19A to 19E, FIGS. 20A to 20G, and FIGS. 21A and 21B are schematic diagrams and circuit diagrams each illustrating the configuration of a semiconductor device including a plurality of basic circuits represented by "cell" in the diagrams in Embodiment 2.

Figure 17A:
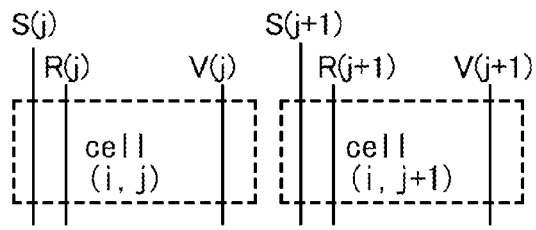
FIGS. 17A to 17I are schematic diagrams and a circuit diagram each illustrating a wire sharing structure in a semiconductor device.
Figure 17B:
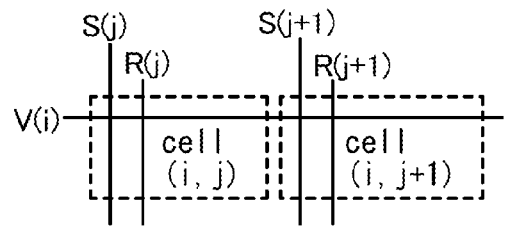
Figure 17C:
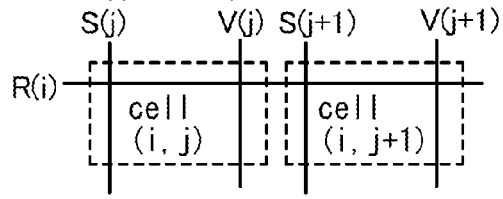
Figure 17D:
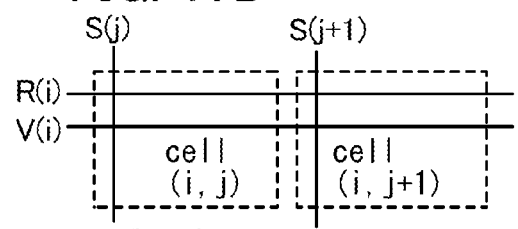
Figure 17E:
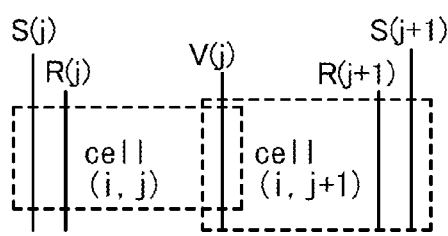
Figure 17F:
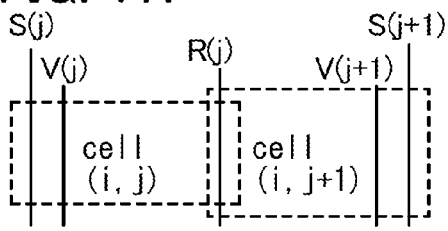
Figure 17G:
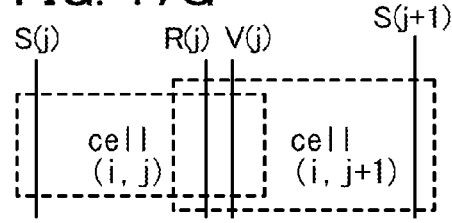
Figure 17H:
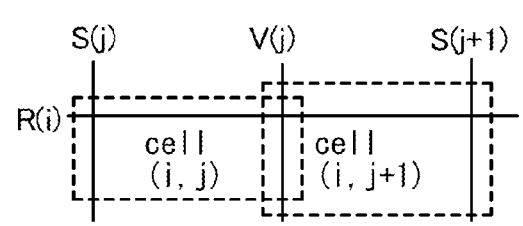
Figure 17I:
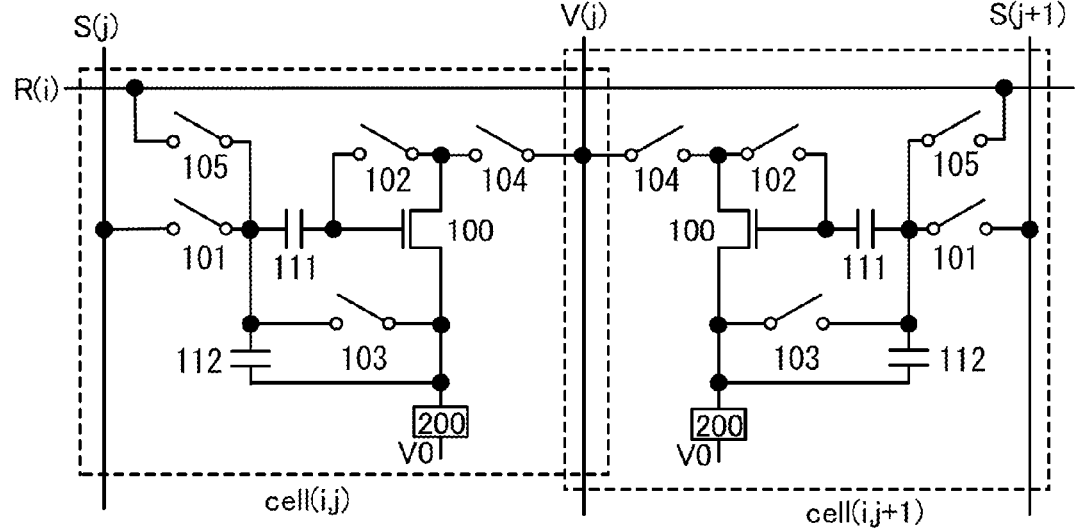
Figure 18A:
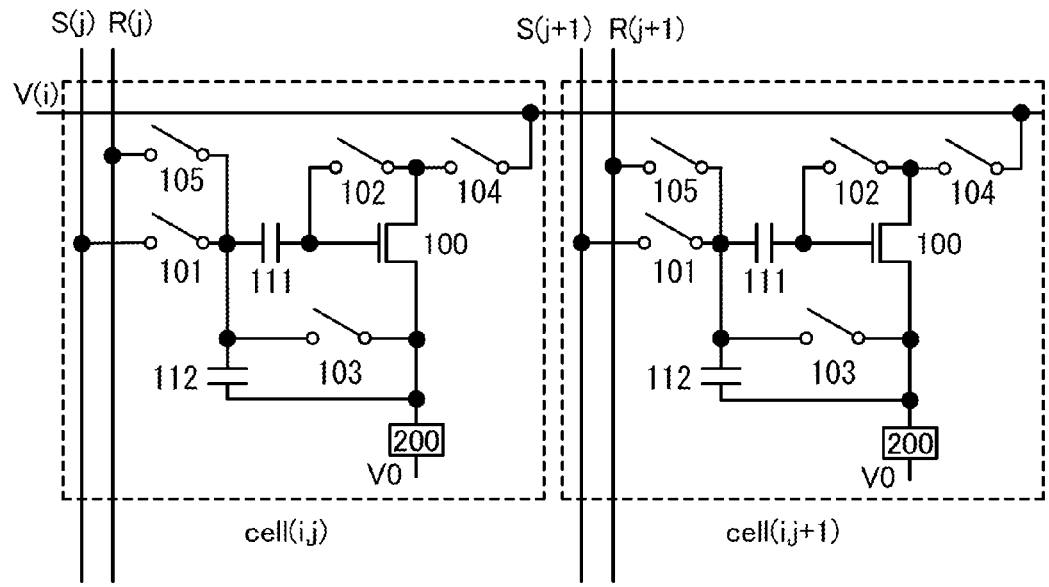
FIGS. 18A and 18B are circuit diagrams each illustrating a wire sharing structure in a semiconductor device.
Figure 18B:
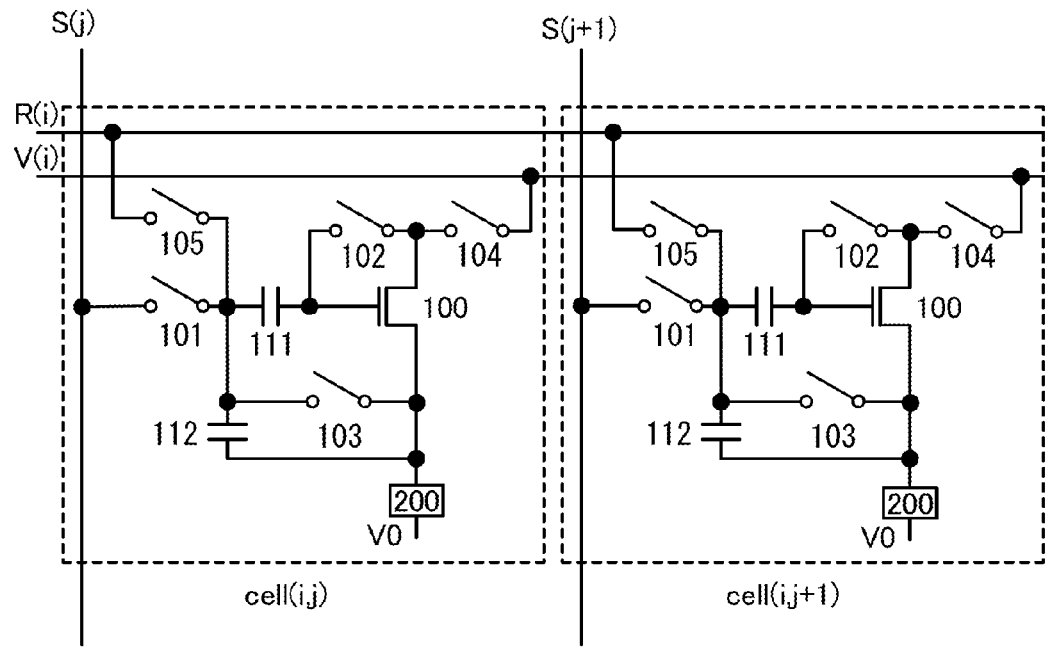

FIG. 17A illustrates the basic circuits (the cell(i,j) and cell(i,j+1)) in adjacent columns In each of the basic circuits, the wiring S, the wiring R, and the wiring V are provided in the column direction. FIG. 17B illustrates an example in which the direction of the wirings V in FIG. 17A is changed so that the wiring V(i) is provided in the row direction and shared with the two basic circuits. FIG. 17C illustrates an example in which the direction of the wirings R in FIG. 17A is changed so that a wiring R(i) is provided in the row direction and shared with the two basic circuits. FIG. 17D illustrates an example in which the direction of the wirings V and the wirings R in FIG. 17A is changed so that the wiring V(i) and the wiring R(i) are provided in the row direction and shared with the two basic circuits. FIG. 17E illustrates an example in which the wiring V(j) provided in the column direction in FIG. 17A is shared with the two basic circuits. FIG. 17F illustrates an example in which a wiring R(j) provided in the column direction in FIG. 17A is shared with the two basic circuits. FIG. 17G illustrates an example in which the wiring V(j) and the wiring R(j) provided in the column direction in FIG. 17A are shared with the two basic circuits. FIG. 17H illustrates an example in which the wiring V(j) in FIG. 17C is shared with the two basic circuits. FIG. 17I is an example of a circuit diagram illustrating the configuration in FIG. 17H more specifically. FIG. 18A is an example of a circuit diagram illustrating the configuration in FIG. 17B more specifically. FIG. 18B is an example of a circuit diagram illustrating the configuration in FIG. 17D more specifically.

Figure 19A:
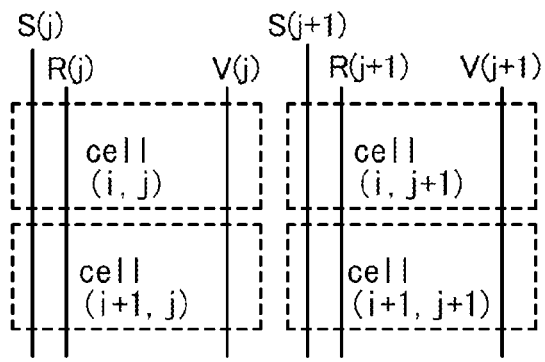
FIGS. 19A to 19E are schematic diagrams each illustrating a wire sharing structure in a semiconductor device.
Figure 19B:
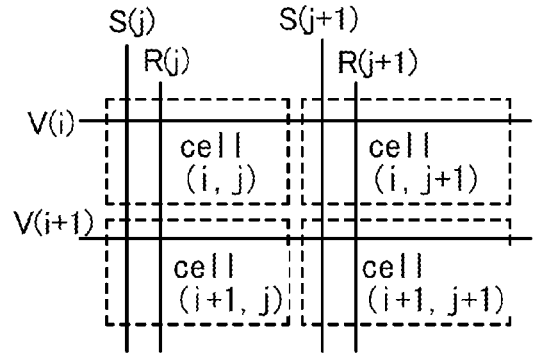
Figure 19C:
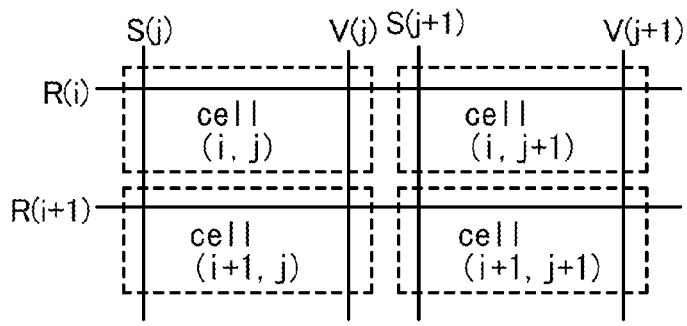
Figure 19D:
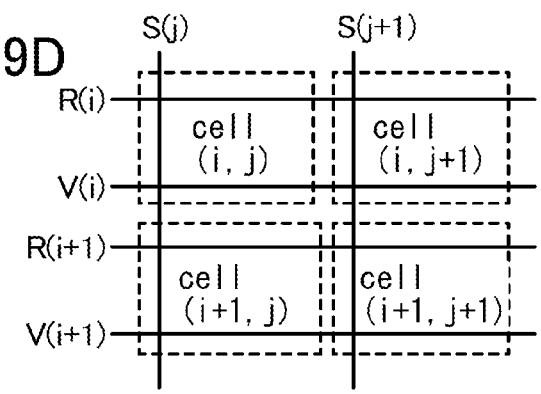
Figure 19E:
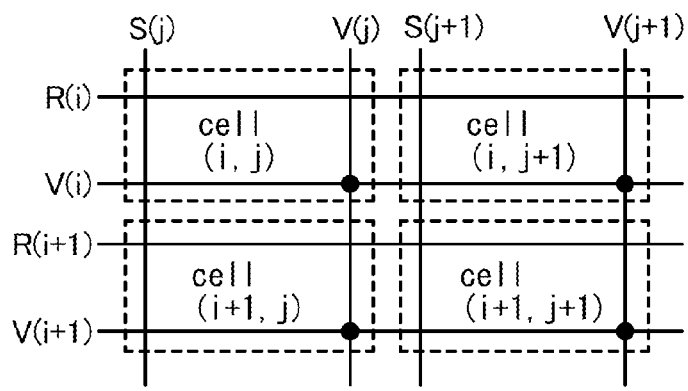

FIG. 19A illustrates four adjacent basic circuits (the cell(i,j), cell(i,j+1), cell(i+1,j), and cell(i+1,j+1)). The cell(i,j) and cell(i+1,j) share the wiring S(j), the wiring R(j), and the wiring V(j). The cell(i,j+1) and the cell(i+1,j+1) share the wiring S(j+1), a wiring R(j+1), and the wiring V(j+1). In FIG. 19B, the cell(i,j) and the cell(i+1,j) share the wiring S(j) and the wiring R(j). Moreover, the cell(i,j+1) and the cell(i+1,j+1) share the wiring S(j+1) and the wiring R(j+1). The cell(i,j) and the cell(i,j+1) share the wiring V(i). The cell(i+1,j) and the cell(i+1,j+1) share the wiring V(i+1). In FIG. 19C, the cell(i,j) and the cell(i+1,j) share the wiring S(j) and the wiring V(j). The cell(i,j+1) and the cell(i+1,j+1) share the wiring S(j+1) and the wiring V(j+1). The cell(i,j) and the cell(i,j+1) share the wiring R(i). The cell(i+1,j) and the cell(i+1,j+1) share a wiring R(i+1). FIG. 19D illustrates an example in which the direction of the wirings R in FIG. 19B is changed so that the wiring R(i) and the wiring R(i+1) are provided in the row direction. FIG. 19E illustrates an example in which the wiring V(j) and the wiring V(j+1) are additionally provided in FIG. 19D. The wiring V(i), the wiring V(i+1), the wiring V(j), and the wiring V(j+1) can be connected to each other. By providing the wirings V in such a manner, adverse effects of voltage drop due to wiring resistance or the like can be reduced and a constant potential can be supplied to a plurality of basic circuits. Thus, the configuration illustrated in FIG. 19E is particularly effective for a structure including a plurality of basic circuits, for example, a display device and a light-emitting device that include the basic circuits as pixels.

Figure 20A:
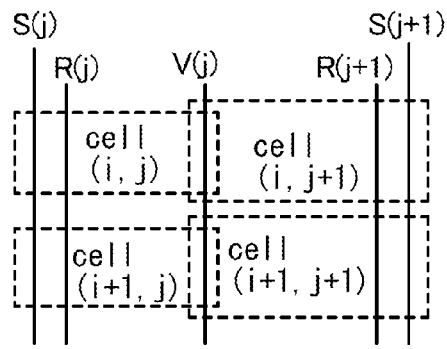
FIGS. 20A to 20G are schematic diagrams each illustrating a wire sharing structure in a semiconductor device.
Figure 20B:
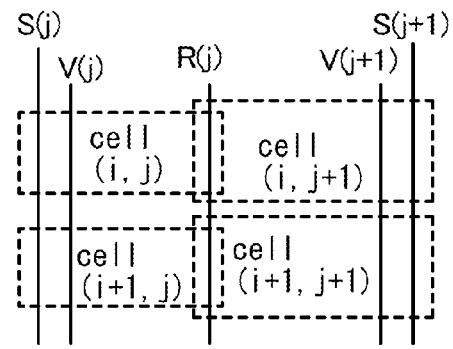
Figure 20C:
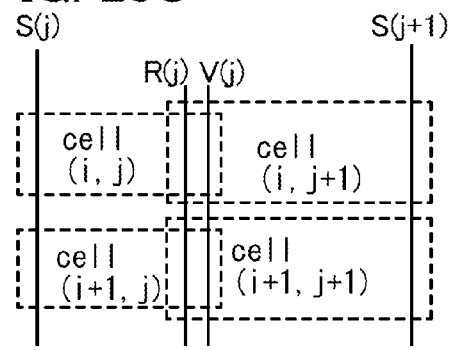
Figure 20D:
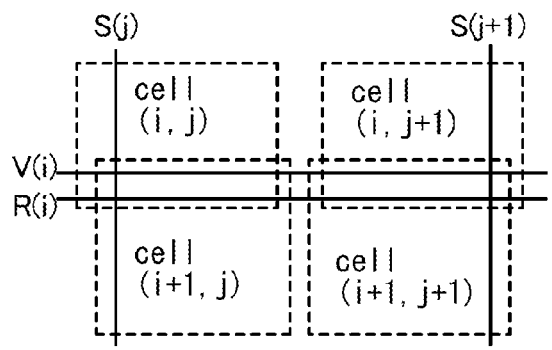
Figure 20E:
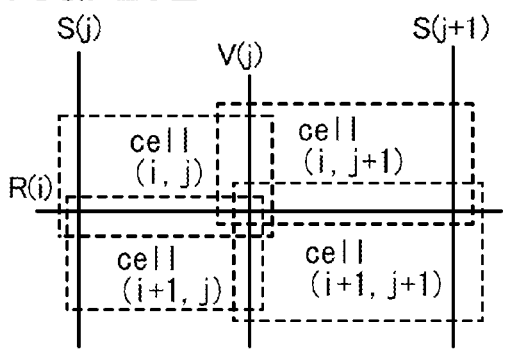
Figure 20F:
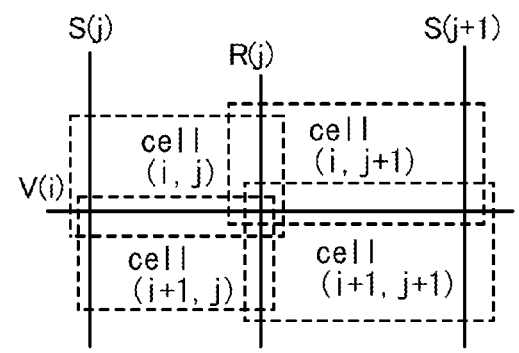
Figure 20G:
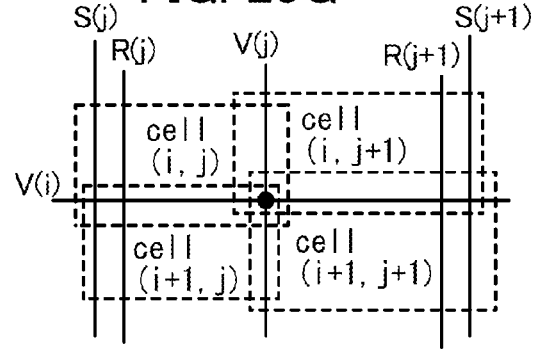
Figure 21A:
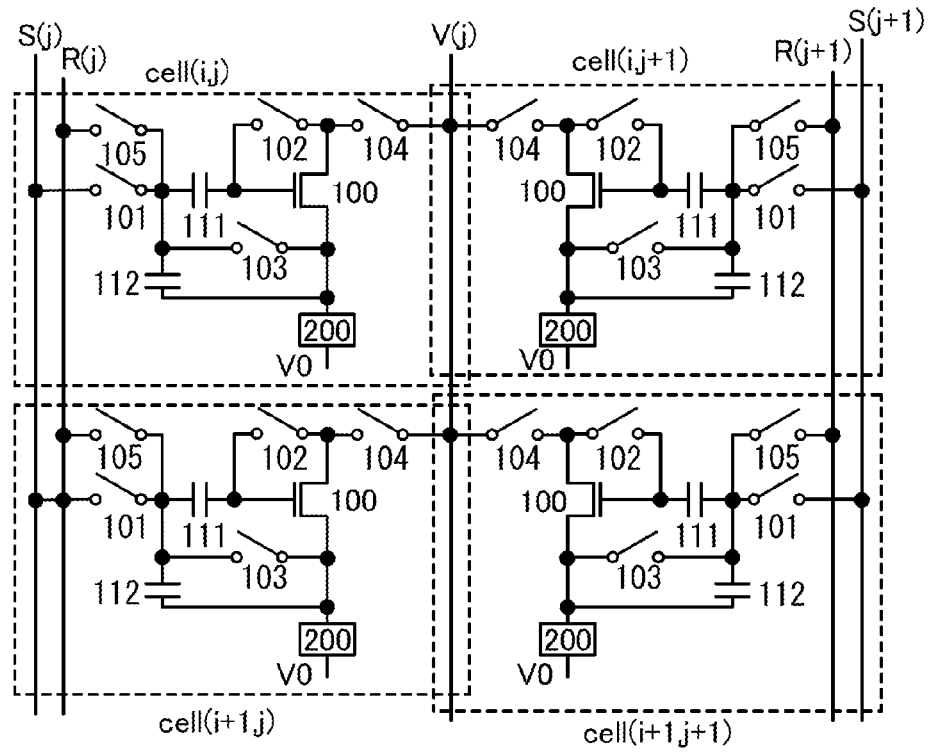
FIGS. 21A and 21B are circuit diagrams each illustrating a wire sharing structure in a semiconductor device.
Figure 21B:
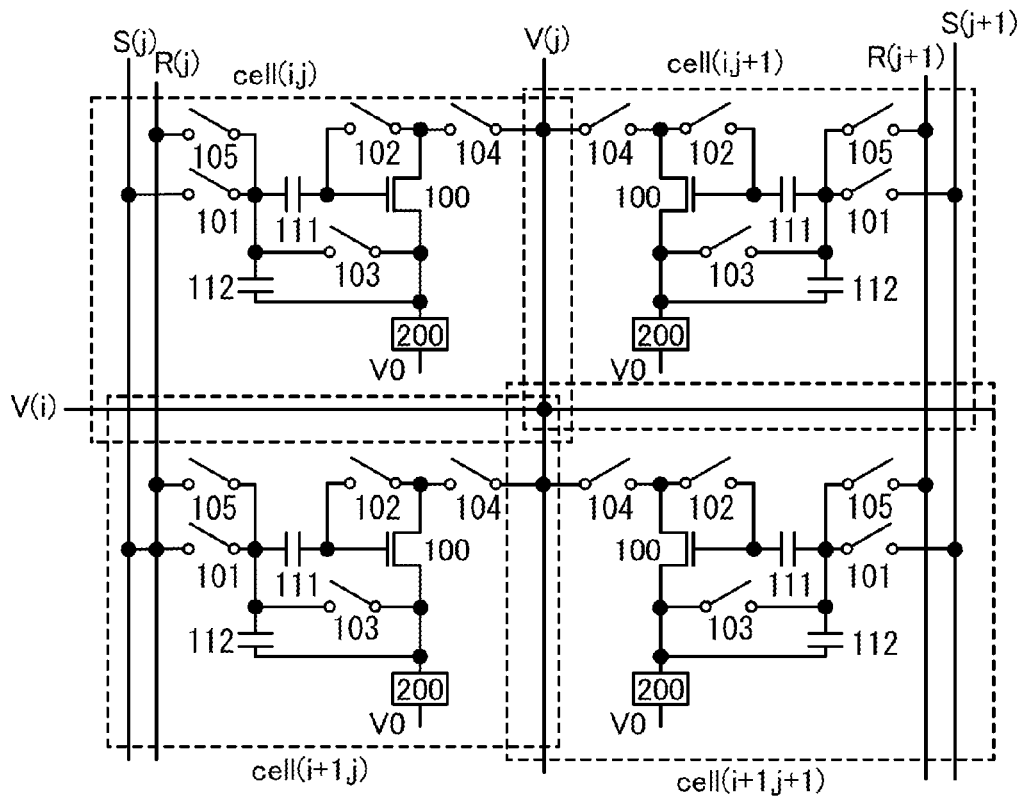

FIG. 20A illustrates four adjacent basic circuits (the cell(i, j), cell(i,j+1), cell(i+1,j), and cell(i+1,j+1)). The cell(i,j) and the cell(i+1,j) share the wiring S(j) and the wiring R(j). The cell(i,j+1) and the cell(i+1,j+1) share the wiring S(j+1) and the wiring R(j+1). The four basic circuits share the wiring V(j). In FIG. 20B, the cell(i,j) and the cell(i+1,j) share the wiring S(j) and the wiring V(j). The cell(i,j+1) and the cell(i+1,j+1) share the wiring S(j+1) and the wiring V(j+1). The four basic circuits share the wiring R(j). In FIG. 20C, the cell(i,j) and the cell(i+1,j) share the wiring S(j). The cell(i,j+1) and the cell(i+1,j+1) share the wiring S(j+1). The four basic circuits share the wiring V(j) and the wiring R(j). FIG. 20D illustrates an example in which the direction of the wiring V and the wiring R in FIG. 20C is changed so that the wiring V(i) and the wiring R(i) are provided in the row direction and shared with the four basic circuits. In FIG. 20E, the cell(i,j) and the cell(i+1,j) share the wiring S(j). The cell(i,j+1) and the cell (i+1,j+1) share the wiring S(j+1). The four basic circuits share the wiring R(i) and the wiring V(j). In FIG. 20F, the cell(i,j) and the cell(i+1,j) share the wiring S(j). The cell(i,j+1) and the cell(i+1,j+1) share the wiring S(j+1). The four basic circuits share the wiring R(j) and the wiring V(i). In FIG. 20G, the wiring V(i) is additionally provided in FIG. 20A and shared with the four basic circuits. The wiring V(i) and the wiring V(j) can be connected to each other. By providing the wirings V in such a manner, adverse effects of voltage drop due to wiring resistance or the like can be reduced and a constant potential can be supplied to a plurality of basic circuits. Thus, the configuration illustrated in FIG. 20G is particularly effective for a structure including a plurality of basic circuits, for example, a display device and a light-emitting device that include the basic circuits as pixels. FIG. 21A is an example of a circuit diagram illustrating the configuration in FIG. 20A more specifically. FIG. 21B is an example of a circuit diagram illustrating the configuration in FIG. 20G more specifically.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

Embodiment 4

Each of the switches in the basic circuit (cell) described in Embodiments 1 to 3 can be a transistor.

Figure 22A:
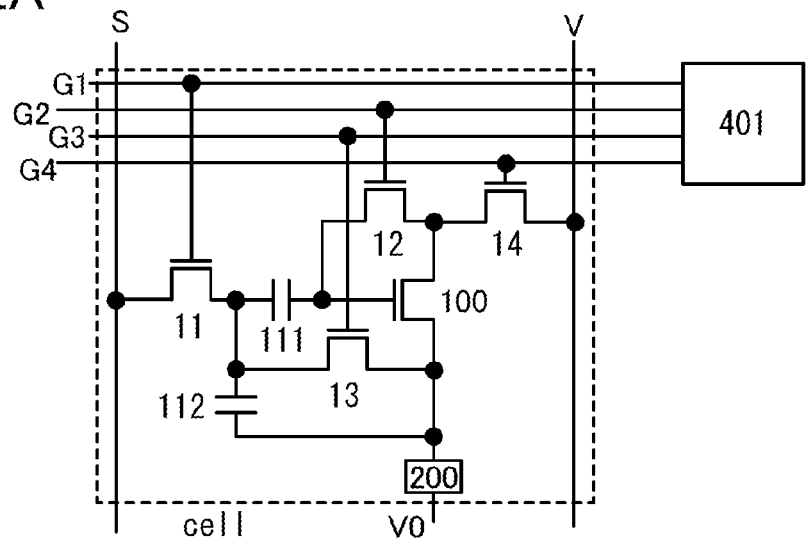
FIGS. 22A to 22C are circuit diagrams each illustrating the configuration of a semiconductor device including transistors as switches.
Figure 22B:
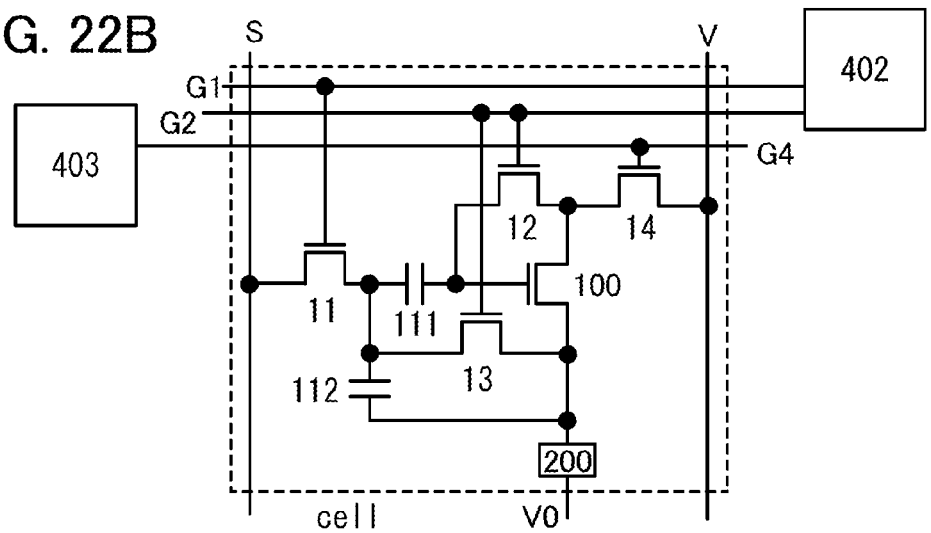
Figure 22C:
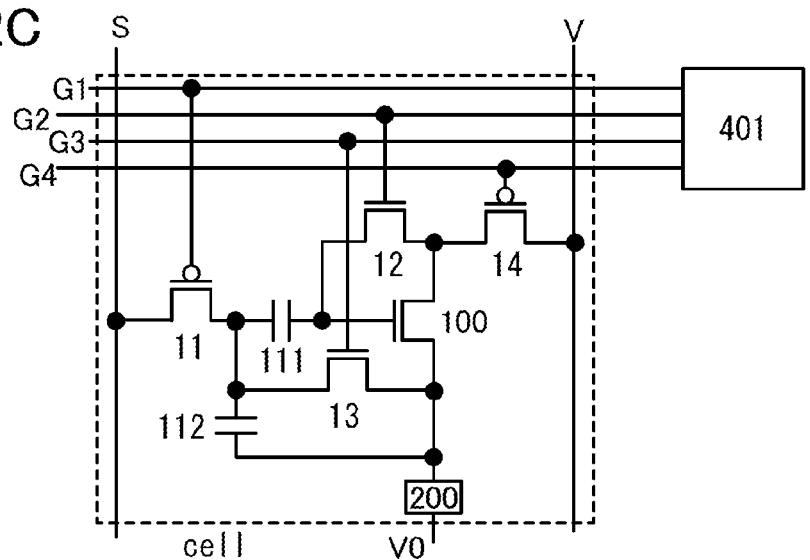

FIGS. 22A and 22C each illustrate an example of the semiconductor device in FIG. 1A of Embodiment 1, which is configured such that the switches 101 to 104 are transistors 11 to 14, respectively. The conductivity types of the transistors 11 to 14 can be the same as or different from that of the transistor 100. When all the transistors included in the basic circuit (cell) have the same conductivity type, the process of fabricating the semiconductor device can be simplified and thus the costs can be reduced. FIG. 22A illustrates an example where the transistors 11 to 14 are n-channel transistors, while FIG. 22C illustrates an example where the transistors 12 and 13 are n-channel transistors and the transistors 11 and 14 are p-channel transistors.

A gate of the transistor 11 can be connected to a wiring G1; a gate of the transistor 12, a wiring G2; a gate of the transistor 13, a wiring G3; and a gate of the transistor 14, a wiring G4. For example, the wirings G1 to G4 are connected to a circuit 401 as illustrated in FIGS. 22A and 22C. The circuit 401 has functions of outputting signals to the wirings G1 to G4 and controlling switching (on/off state) of the transistors 11 to 14. Consequently, potentials (e.g., signal potentials) supplied to the wirings G1 to G4 are preferably pulsed potentials and not constant; however, one aspect of the embodiment of the present invention is not limited thereto. Alternatively, the wirings G1 to G4 function as gate signal lines, selection signal lines, or scan lines. An example of the circuit 401 is a gate driver (scan line driver circuit). Other parts of the configuration are the same as those in FIG. 1A and the like; therefore, a description thereof is omitted.

FIG. 22B illustrates an example of the configuration in FIG. 22A, in which the transistors 12 and 13 have the same conductivity type and share the wirings G2 and G3 so that the wiring G3 is integrated with the wiring G2. For example, the wirings G1 and G2 are connected to a circuit 402 as illustrated in FIG. 22B. The circuit 402 has functions of outputting signals to the wirings G1 and G2 and controlling switching (on/off state) of the transistors 11 to 13. The wiring G4 is connected to a circuit 403, for example, as illustrated in FIG. 22B. The circuit 403 has functions of outputting signals to the wiring G4 and controlling switching (on/off state) of the transistor 14. An example of the circuits 402 and 403 is a gate driver (scan line driver circuit). Other parts of the configuration are the same as those in FIG. 1A and the like; therefore, a description thereof is omitted.

Although FIGS. 22A to 22C illustrate the examples in which the switches in the basic circuit (cell) in FIG. 1A are transistors, the semiconductor device according to the present invention is not limited to such structures. Each of the switches in the semiconductor device described in Embodiment 1 can be a transistor. Moreover, a plurality of transistors that are switched on or off at the same time or at different timings can share a wiring connected to gates of the transistors. For example, when a transistor A and a transistor B have the same conductivity type and are turned on or off at the same time, a wiring connected to a gate of the transistor A and a wiring connected to a gate of the transistor B can be merged into a single wiring. Alternatively, for example, when the transistor A and the transistor B have different conductivity types and one of the transistors A and B is turned on while the other is turned off and one of the transistors A and B is turned off while the other is turned on, the wiring connected to the gate of the transistor A and the wiring connected to the gate of the transistor B can be merged into a single wiring.

Figure 23A:
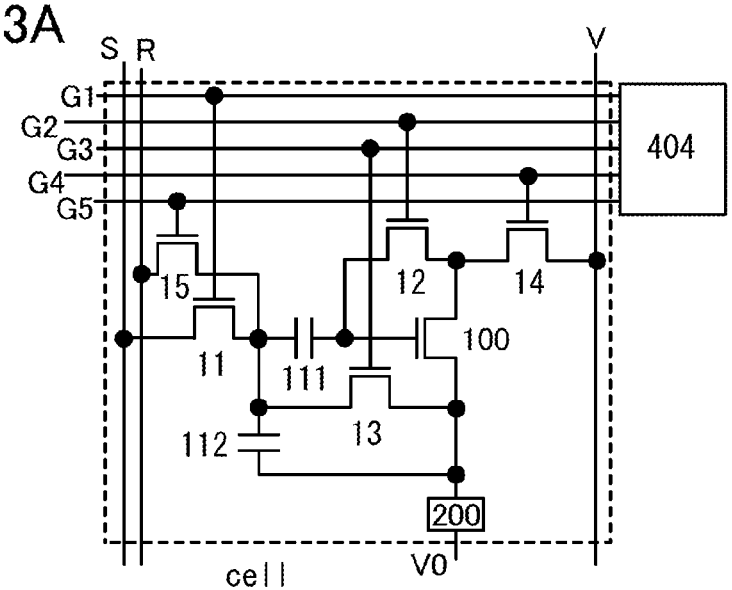
FIGS. 23A to 23C are circuit diagrams each illustrating the configuration of a semiconductor device including transistors as switches.

FIG. 23A illustrates an example of the semiconductor device in FIG. 7A of Embodiment 2, which is configured such that the switches 101 to 105 are transistors 11 to 15, respectively. The conductivity types of the transistors 11 to 15 can be the same as or different from that of the transistor 100. When all the transistors included in the basic circuit (cell) have the same conductivity type, the process of fabricating the semiconductor device can be simplified and thus the costs can be reduced.

The gate of the transistor 11 can be connected to the wiring G1; the gate of the transistor 12, the wiring G2; the gate of the transistor 13, the wiring G3; the gate of the transistor 14, the wiring G4; and a gate of the transistor 15, a wiring G5. For example, the wirings G1 to G5 are connected to a circuit 404 as illustrated in FIG. 23A. The circuit 404 has functions of outputting signals to the wirings G1 to G5 and controlling switching (on/off state) of the transistors 11 to 15. Consequently, potentials (e.g., signal potentials) supplied to the wirings G1 to G5 are preferably pulsed potentials and not constant; however, one aspect of the embodiment of the present invention is not limited thereto. Alternatively, the wirings G1 to G5 function as gate signal lines, selection signal lines, or scan lines. An example of the circuit 404 is a gate driver (scan line driver circuit). Other parts of the configuration are the same as those in FIG. 7A and the like; therefore, a description thereof is omitted.

Figure 23B:
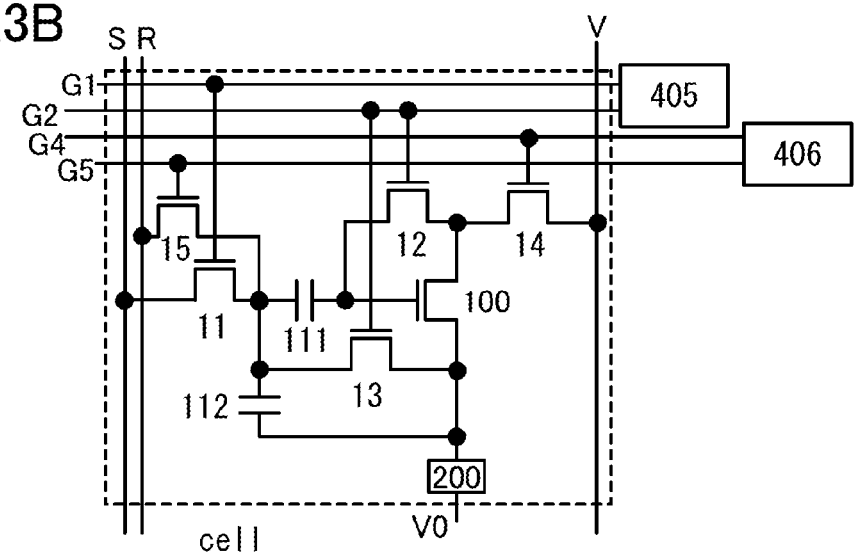

FIG. 23B illustrates an example of the configuration in FIG. 23A, in which the transistors 12 and 13 have the same conductivity type and share the wirings G2 and G3 so that the wiring G3 is integrated with the wiring G2. For example, the wirings G1 and G2 are connected to a circuit 405 as illustrated in FIG. 23B. The circuit 405 has functions of outputting signals to the wirings G1 and G2 and controlling switching (on/off state) of the transistors 11 to 13. The wirings G4 and G5 are connected to a circuit 406, for example, as illustrated in FIG. 23B. The circuit 406 has functions of outputting signals to the wirings G4 and G5 and controlling switching (on/off state) of the transistors 14 and 15. An example of the circuits 405 and 406 is a gate driver (scan line driver circuit). Other parts of the configuration are the same as those in FIG. 7A and the like; therefore, a description thereof is omitted.

Figure 23C:
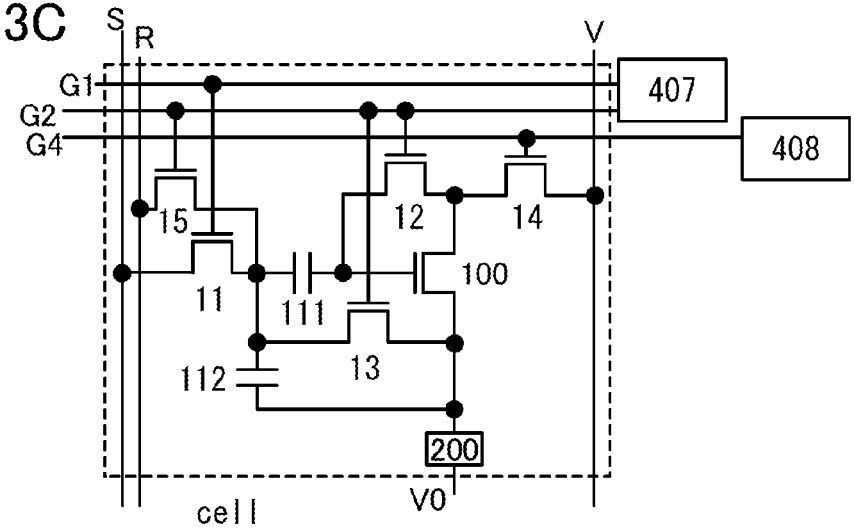

FIG. 23C illustrates an example of the configuration in FIG. 23A, in which the transistors 12, 13, and 15 have the same conductivity type and share the wirings G2, G3, and G5 so that the wirings G3 and G5 are integrated with the wiring G2. For example, the wirings G1 and G2 are connected to a circuit 407 as illustrated in FIG. 23C. The circuit 407 has functions of outputting signals to the wirings G1 and G2 and controlling switching (on/off state) of the transistors 11 to 13 and the transistor 15. The wiring G4 is connected to a circuit 408, for example, as illustrated in FIG. 23C. The circuit 408 has functions of outputting signals to the wiring G4 and controlling switching (on/off state) of the transistor 14. An example of the circuits 407 and 408 is a gate driver (scan line driver circuit). Other parts of the configuration are the same as those in FIG. 7A and the like; therefore, a description thereof is omitted.

Figure 51A:
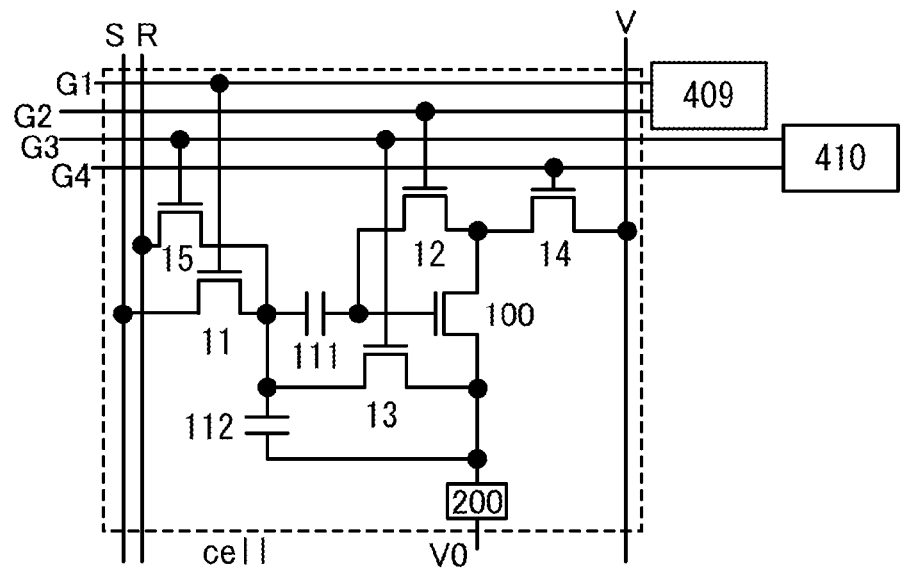
FIGS. 51A and 51B are circuit diagrams each illustrating the configuration of a semiconductor device including transistors as switches.

FIG. 51A illustrates an example of the configuration in FIG. 23A, in which the transistors 13 and 15 have the same conductivity type and share the wirings G3 and G5 so that the wiring G5 is integrated with the wiring G3. For example, the wirings G1 and G2 are connected to a circuit 409 as illustrated in FIG. 51A. The circuit 409 has functions of outputting signals to the wirings G1 and G2 and controlling switching (on/off state) of the transistors 11 and 12. The wirings G3 and G4 are connected to a circuit 410, for example, as illustrated in FIG. 51A. The circuit 410 has functions of outputting signals to the wirings G3 and G4 and controlling switching (on/off state) of the transistors 13 to 15. An example of the circuits 409 and 410 is a gate driver (scan line driver circuit). Other parts of the configuration are the same as those in FIG. 7A and the like; therefore, a description thereof is omitted.

Figure 51B:
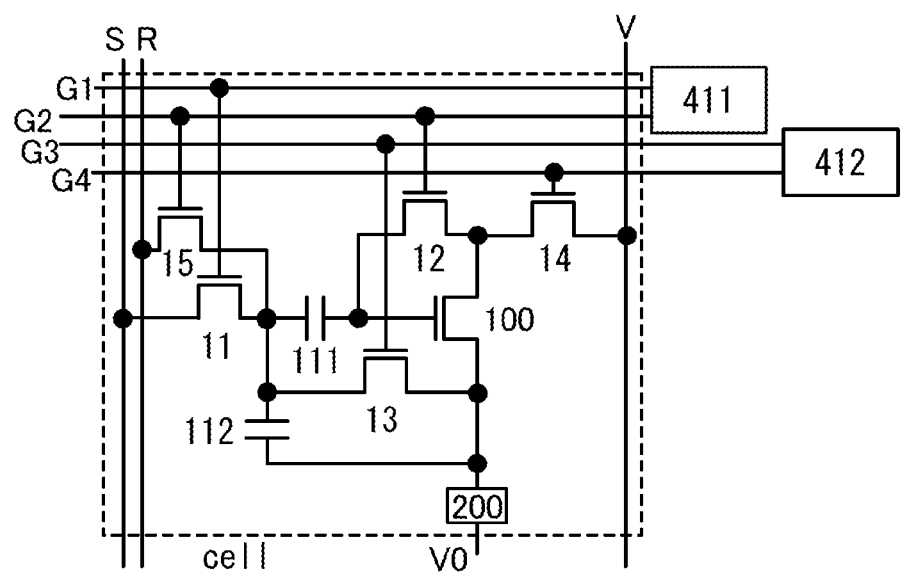

FIG. 51B illustrates an example of the configuration in FIG. 23A, in which the transistors 12 and 15 have the same conductivity type and share the wirings G2 and G5 so that the wiring G5 is integrated with the wiring G2. For example, the wirings G1 and G2 are connected to a circuit 411 as illustrated in FIG. 51B. The circuit 411 has functions of outputting signals to the wirings G1 and G2 and controlling switching (on/off state) of the transistors 11, 12, and 15. The wirings G3 and G4 are connected to a circuit 412, for example, as illustrated in FIG. 51B. The circuit 412 has functions of outputting signals to the wirings G3 and G4 and controlling switching (on/off state) of the transistors 13 and 14. An example of the circuits 411 and 412 is a gate driver (scan line driver circuit). Other parts of the configuration are the same as those in FIG. 7A and the like; therefore, a description thereof is omitted.

In FIGS. 22A to 22C, FIGS. 23A to 23C, and the like, the transistor 100 can function as a current source. Accordingly, the transistor 100 often operates in a saturation region when current flows. In that case, the functionality of the current source is higher as the slope of the current characteristics in the saturation region is flatter (as the slope of the curve with voltage between a drain and a source on the horizontal axis and current flowing between the drain and source on the vertical axis is smaller, for example, is closer to 0). For that reason, the channel length or gate length of the transistor 100 is preferably larger than that of each of the transistors 11 to 15. Specifically, the channel length or gate length of the transistor 100 is preferably 5 or more times, further preferably 10 or more times that of each of the transistors 11 to 15. Note that one aspect of the embodiment of the present invention is not limited thereto.

In FIGS. 22A to 22C, FIGS. 23A to 23C, and the like, the transistor 100 can have a function of supplying high current to the load 200. Accordingly, it is preferable that the transistor 100 can supply a higher current to the load 200 when a current flows through the transistor 100. For that reason, the channel width or gate width of the transistor 100 is preferably larger than that of each of the transistors 11 to 15. Specifically, the channel width or gate width of the transistor 100 is preferably 5 or more times, further preferably 10 or more times that of each of the transistors 11 to 15. Note that one aspect of the embodiment of the present invention is not limited thereto.

Although FIGS. 23A to 23C illustrate the examples in which the switches in the basic circuit (cell) in FIG. 7A are transistors, the semiconductor device according to the present invention is not limited to such structures. Each of the switches in the semiconductor device described in Embodiment 2 can be a transistor. Moreover, a plurality of transistors that are switched on or off at the same time or at different timings can share a wiring connected to gates of the transistors.

When the semiconductor device according to the present invention includes a plurality of basic circuits (cells) each having the configuration illustrated in any of FIGS. 22A to 22C and FIGS. 23A to 23C, the plurality of basic circuits can share a wiring. Sharing of a wiring with a plurality of basic circuits can downsize the semiconductor device. In a display device and a light-emitting device, the use of the basic circuits as pixels increases the pixel density. Examples of structures for sharing wirings will be described below in detail with reference to diagrams. Note that in the diagrams shown below, a plurality of basic circuits are distinguished from each other by symbols such as (i,j), wirings arranged in the row direction are distinguished from each other by symbols such as (i), and wirings arranged in the column direction are distinguished from each other by symbols such as (j). Note also that the configuration of the basic circuits is similar to those described above.

Figure 24:
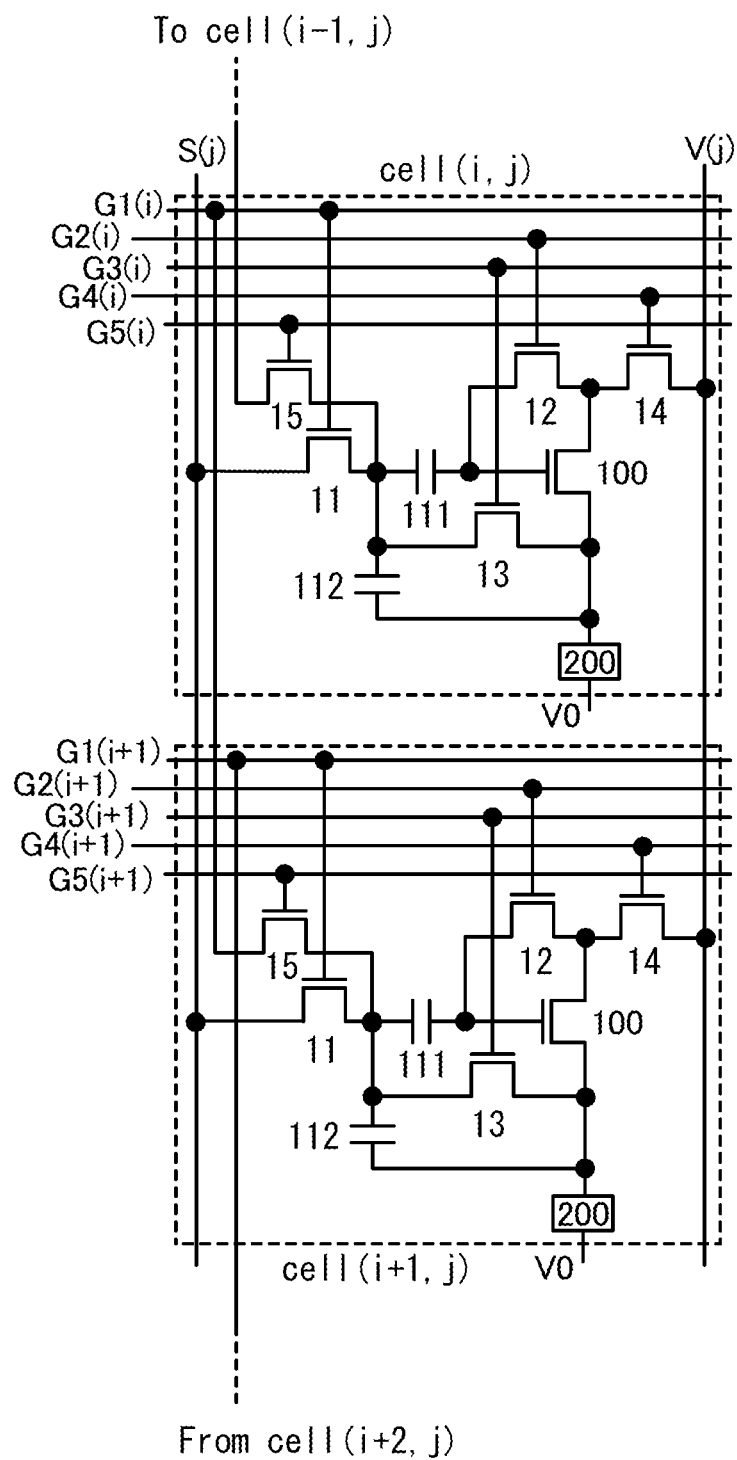
FIG. 24 is a circuit diagram illustrating the configuration of a semiconductor device including transistors as switches.
Figure 25:
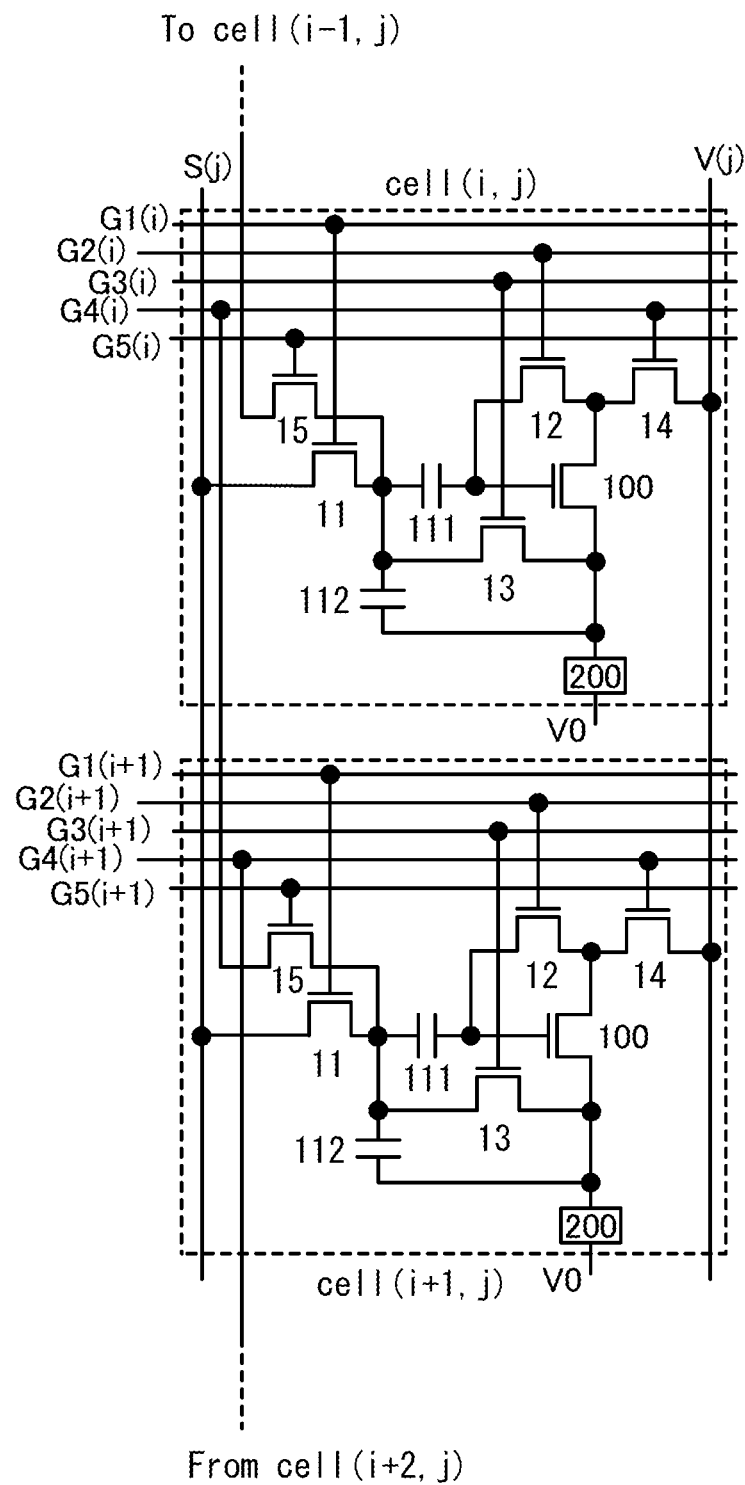
FIG. 25 is a circuit diagram illustrating the configuration of a semiconductor device including transistors as switches.

FIG. 24 illustrates an example of a semiconductor device including a plurality of basic circuits (cells) having the configuration illustrated in FIG. 23A; a wiring of another basic circuit (cell) is used without the provision of the wiring R. As an example, the wiring G1 in the previous row is used. FIG. 25 illustrates another example of a semiconductor device including a plurality of basic circuits (cells) having the configuration illustrated in FIG. 23A. The wiring G4 in the previous row is used without the provision of the wiring R. One aspect of the embodiment of the present invention is not limited to these examples, and any of the wirings G1 to G5 in another row can be used without the provision of the wiring R.

Figure 26:
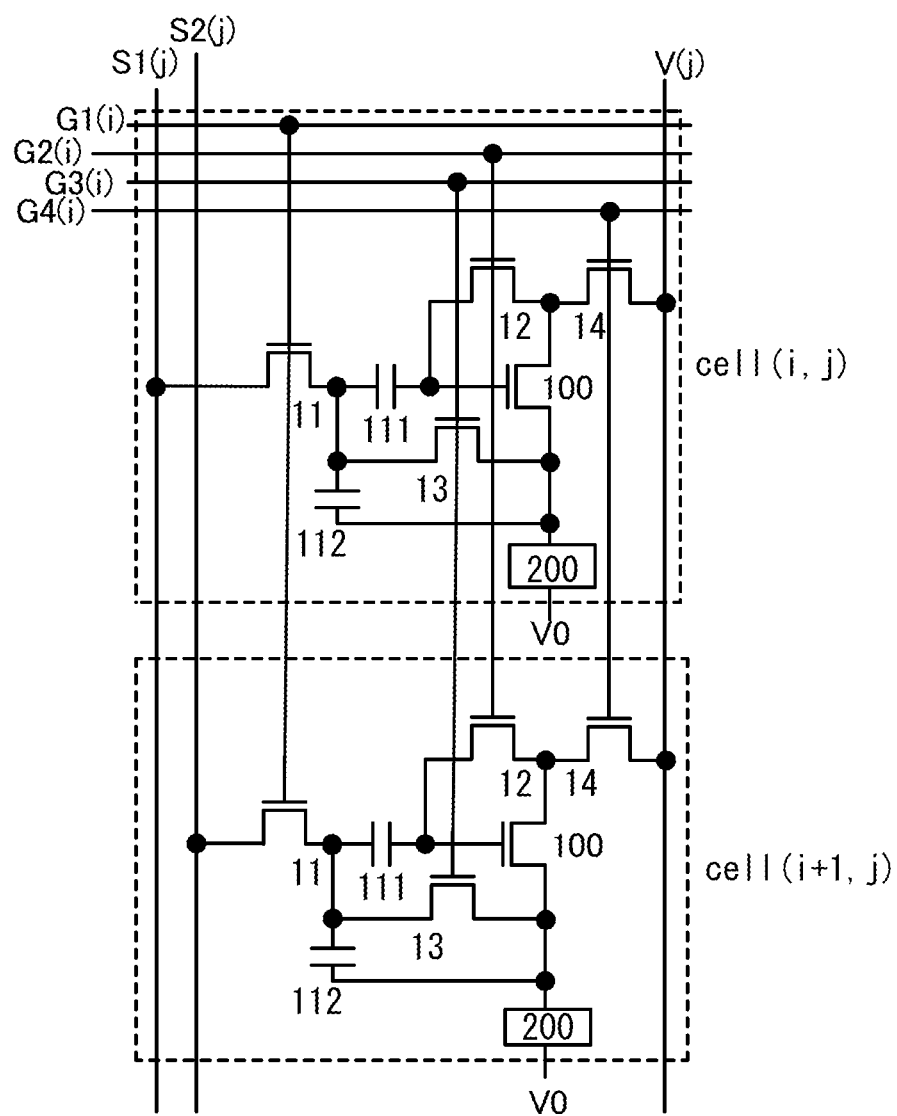
FIG. 26 is a circuit diagram illustrating the configuration of a semiconductor device including transistors as switches.
Figure 27:
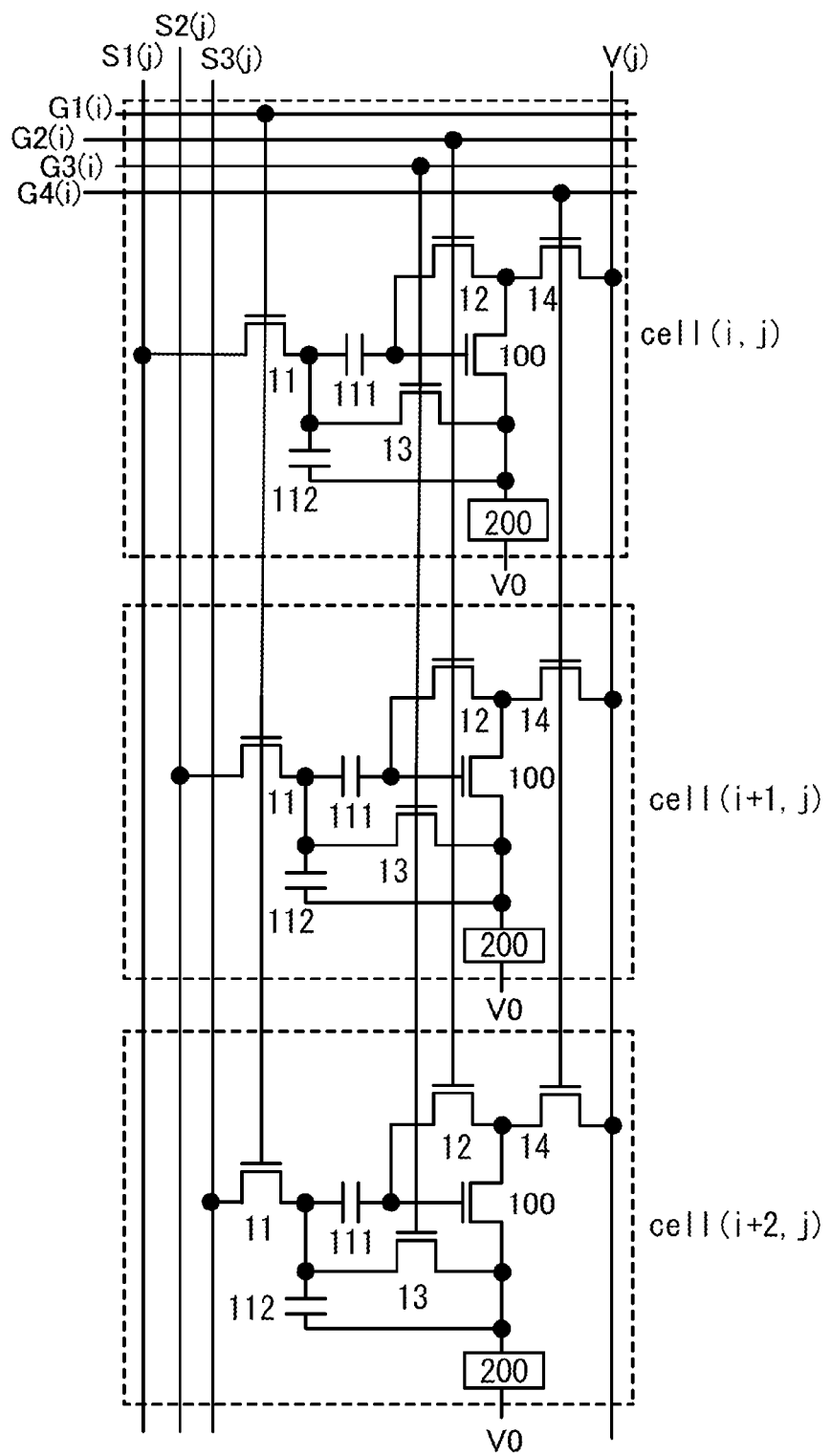
FIG. 27 is a circuit diagram illustrating the configuration of a semiconductor device including transistors as switches.
Figure 28:
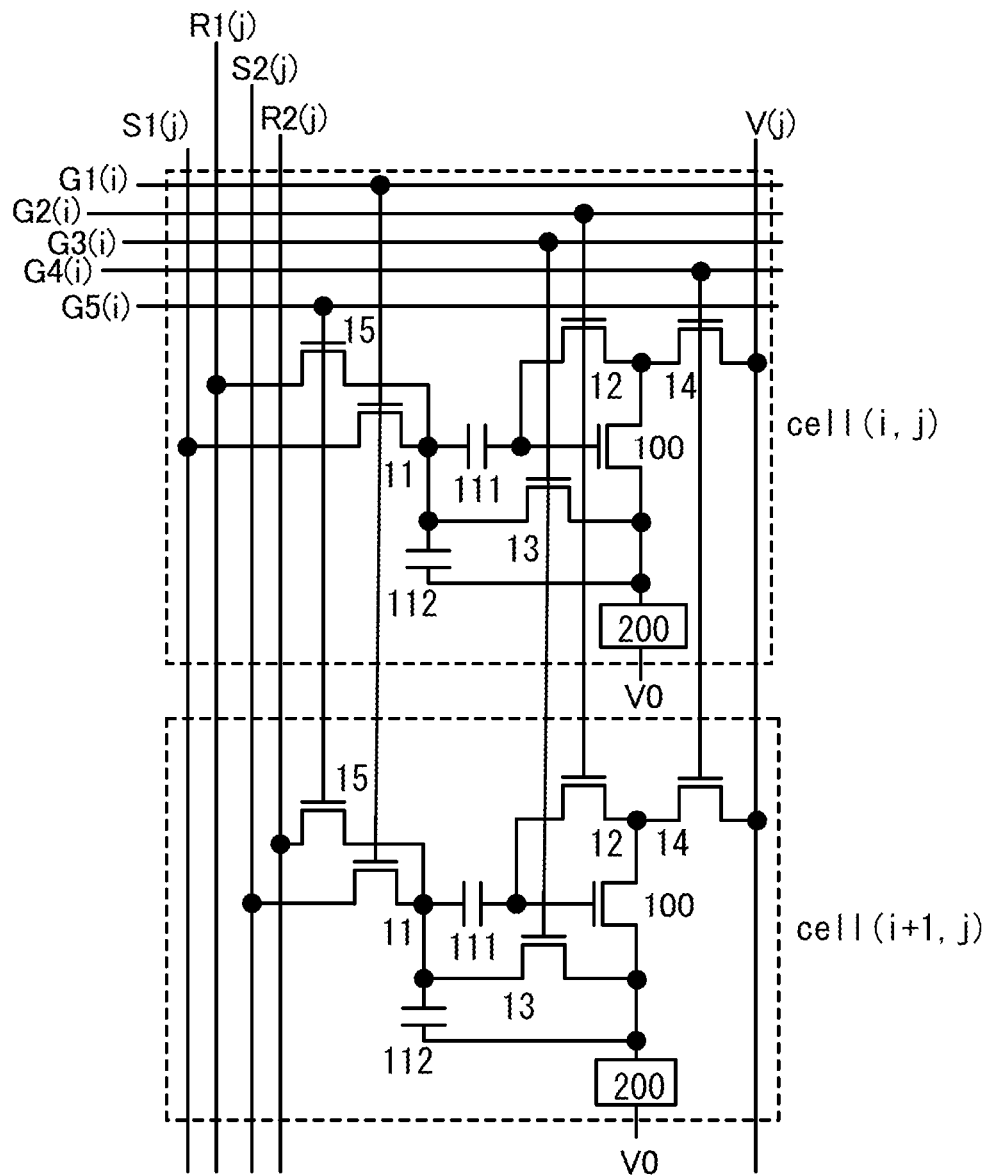
FIG. 28 is a circuit diagram illustrating the configuration of a semiconductor device including transistors as switches.
Figure 29:
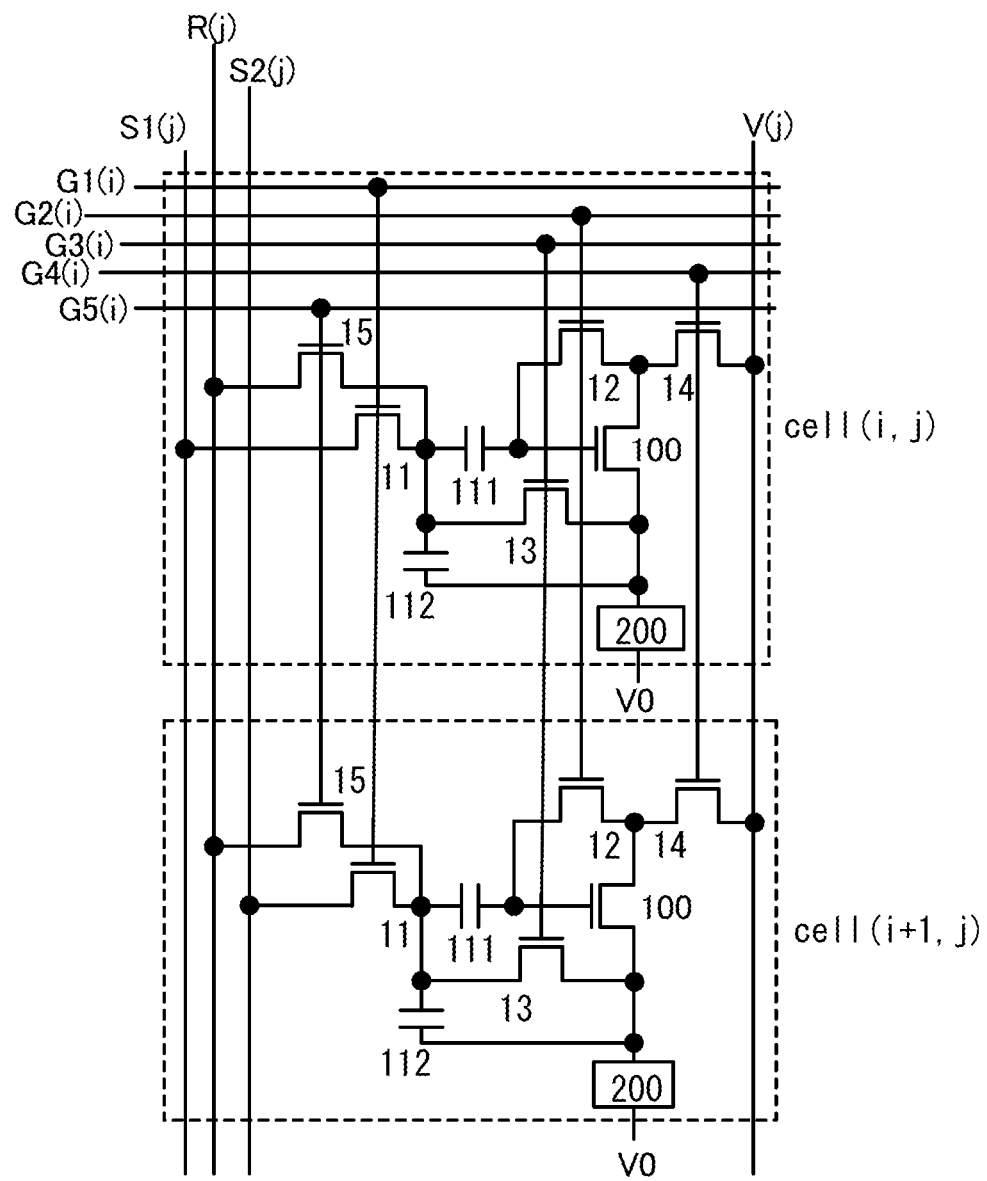
FIG. 29 is a circuit diagram illustrating the configuration of a semiconductor device including transistors as switches.

FIG. 26 illustrates an example of a semiconductor device including a plurality of basic circuits (cells) having the configuration illustrated in FIG. 22A. Two basic circuits share the wirings G1 to G4. FIG. 27 illustrates another example of a semiconductor device including a plurality of basic circuits (cells) having the configuration illustrated in FIG. 22A. Three basic circuits share the wirings G1 to G4. The present invention is not limited to these examples, and the wirings G1 to G4 can be shared with four or more basic circuits. FIG. 28 illustrates another example of a semiconductor device including a plurality of basic circuits (cells) having the configuration illustrated in FIG. 23A. Two basic circuits share the wirings G1 to G5. FIG. 29 illustrates an example where the two basic circuits in FIG. 28 also share the wiring R(j). Note that the present invention is not limited to these examples, and a plurality of transistors that are switched on or off at the same time or at different timings can share a wiring connected to gates of the transistors.

Although FIG. 26 and FIG. 27 illustrate the examples in which a plurality of basic circuits share all the wirings G1 to G4, the present invention is not limited to these examples and some of these wirings may be shared. Although FIG. 28 and FIG. 29 illustrate the examples in which a plurality of basic circuits share all the wirings G1 to G5, the present invention is not limited to these examples and some of these wirings may be shared. Further, the configurations in FIGS. 26 to 29 may be used in combination with the wire sharing structure described in Embodiment 3.

Figures 41A, 41B:
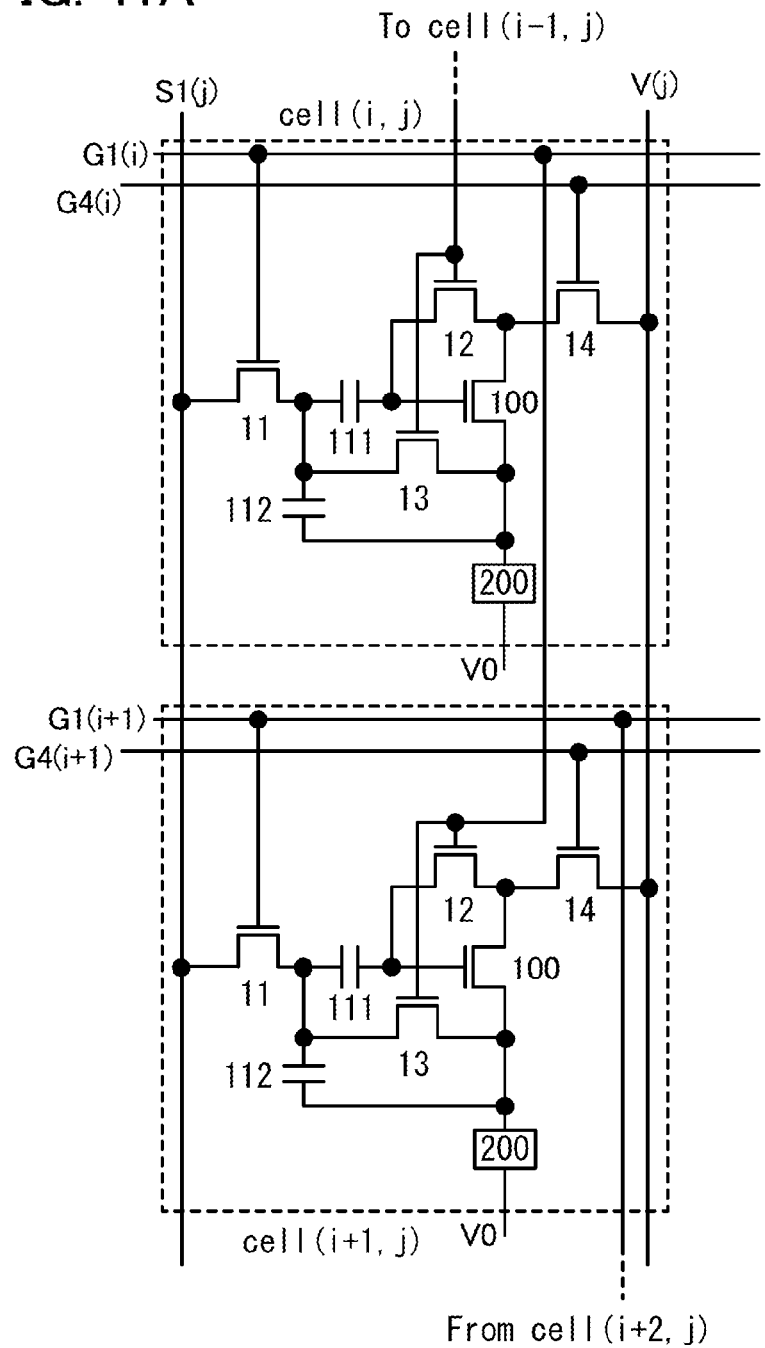
FIG. 41A is a circuit diagram illustrating the configuration of a semiconductor device including transistors as switches.
FIG. 41B is a timing chart illustrating a method for driving the semiconductor device.

FIG. 41A illustrates an example of a semiconductor device including a plurality of basic circuits (cells) having the configuration illustrated in FIG. 22A. The wiring G1 of the basic circuit (cell) in the previous row can be used without the provision of the wirings G2 and G3. Note that the transistors 12 and 13 have the same conductivity type as the transistor 11. An example of a method for driving the semiconductor device having this structure is illustrated in FIG. 41B. FIG. 41B illustrates the timing relationships between the periods T11, T12, T13, and T14 in the cell(i,j) and the periods T11, T12, T13, and T14 in the cell(i+1,j). The operation in each period is the same as that described in Embodiments 1 and 2, and the description thereof is omitted.

Figure 44:
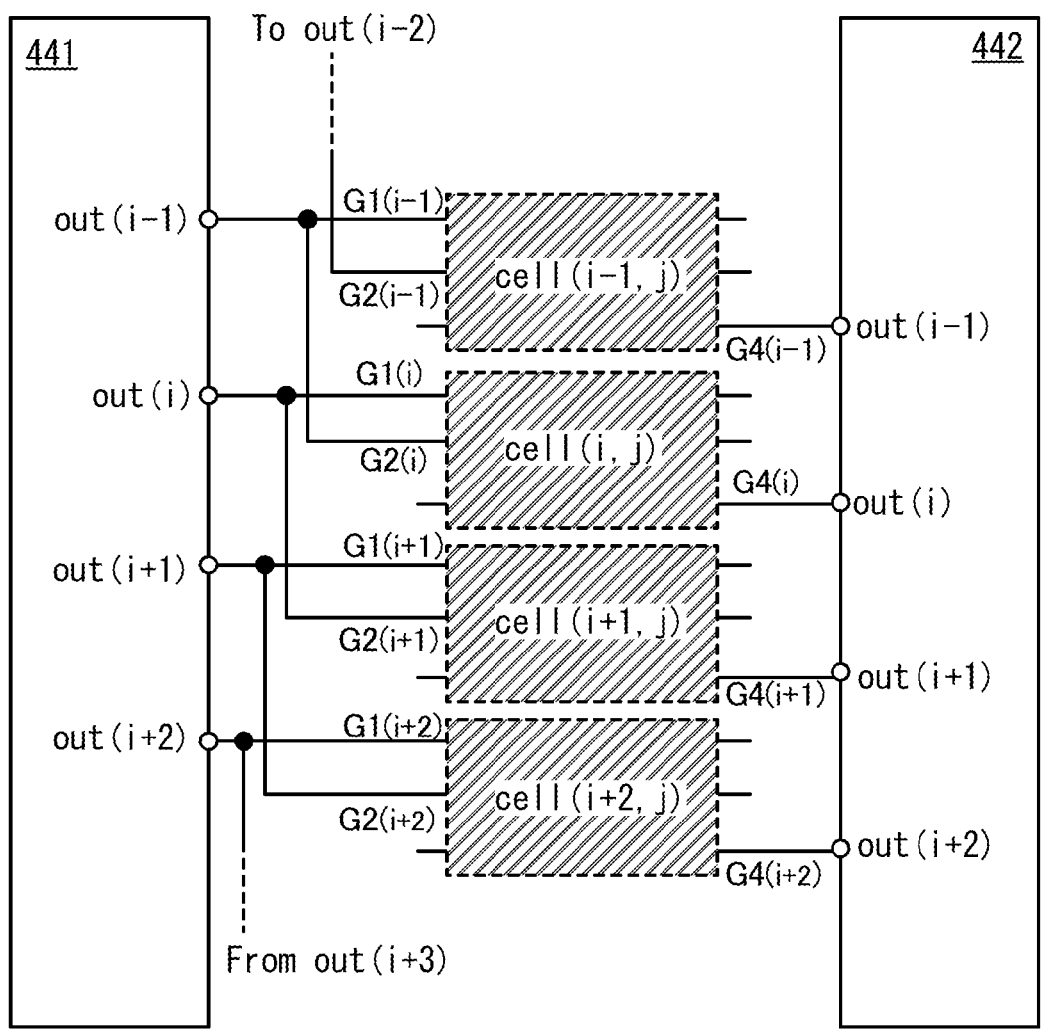
FIG. 44 is a block diagram illustrating the structure of a semiconductor device.

FIG. 44 illustrates an example of a semiconductor device including a plurality of basic circuits (cells) having the configuration illustrated in FIG. 22B. The semiconductor device can include a unit 441 (e.g., a scan line driver circuit) having a function of inputting signals to the wirings G1 and G2 of the basic circuits, and a unit 442 (e.g., a scan line driver circuit) having a function of inputting signals to the wirings G4 of the basic circuits. Here, when an output out(i) of the unit 441 is input to both the wiring G2(i) and the wiring G1(i−1), a signal input to the wiring G2 of each basic circuit can be the same as a signal input to the wiring G1 of the basic circuit (cell) in the previous row. Note that the transistors 12 and 13 have the same conductivity type as the transistor 11.

Figures 42A, 42B:
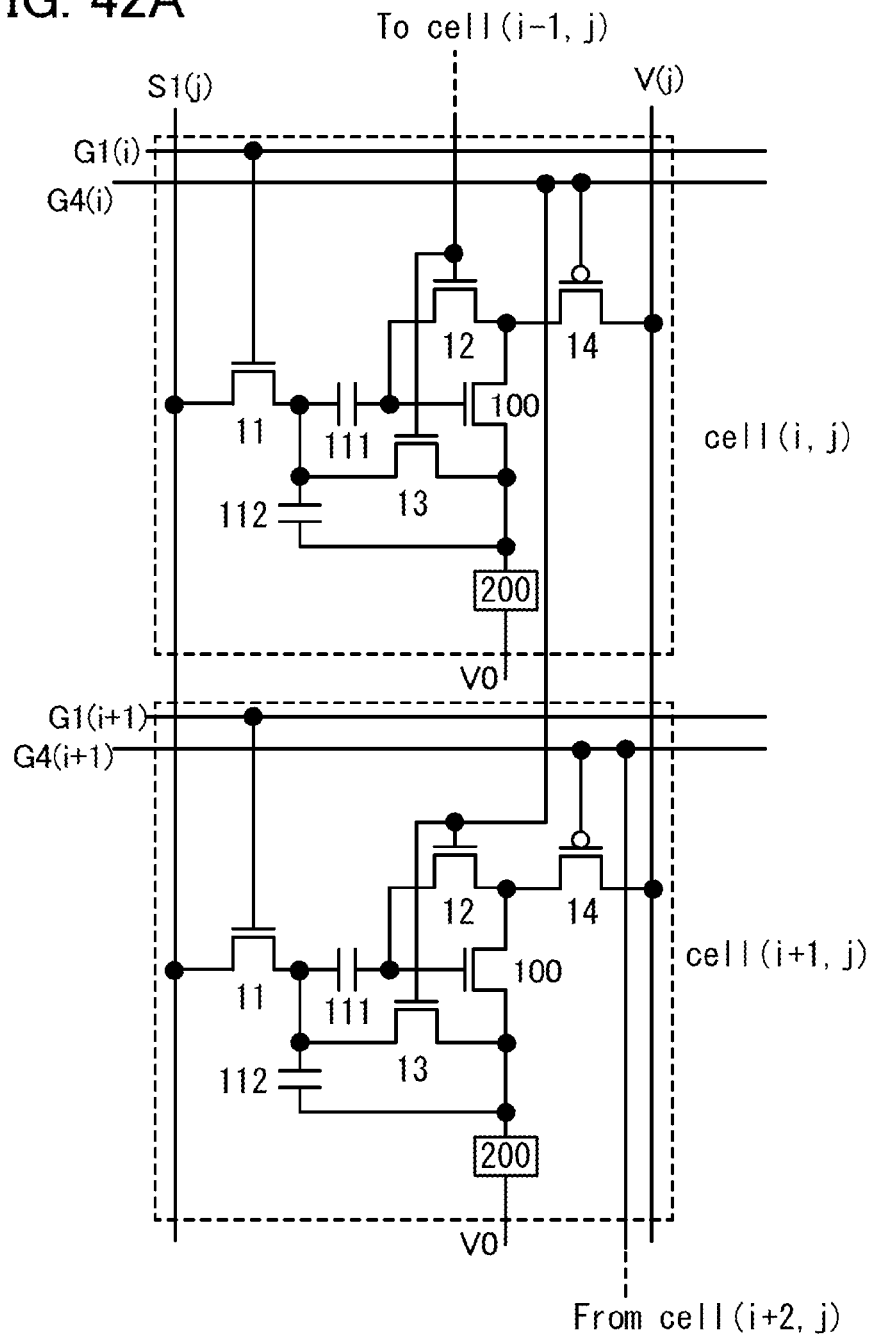
FIG. 42A is a circuit diagram illustrating the configuration of a semiconductor device including transistors as switches.
FIG. 42B is a timing chart illustrating a method for driving the semiconductor device.

FIG. 42A illustrates another example of a semiconductor device including a plurality of basic circuits (cells) having the configuration illustrated in FIG. 22A. The wiring G4 of the basic circuit (cell) in the previous row can be used without the provision of the wirings G2 and G3. Note that the conductivity types of the transistors 12 and 13 are different from that of the transistor 14. An example of a method for driving the semiconductor device having this structure is illustrated in FIG. 42B. FIG. 42B illustrates the timing relationships between the periods T11, T12, T13, and T14 in the cell(i,j) and the periods T11, T12, T13, and T14 in the cell(i+1,j). The operation in each period is the same as that described in Embodiments 1 and 2, and the description thereof is omitted.

Figures 43A, 43B:
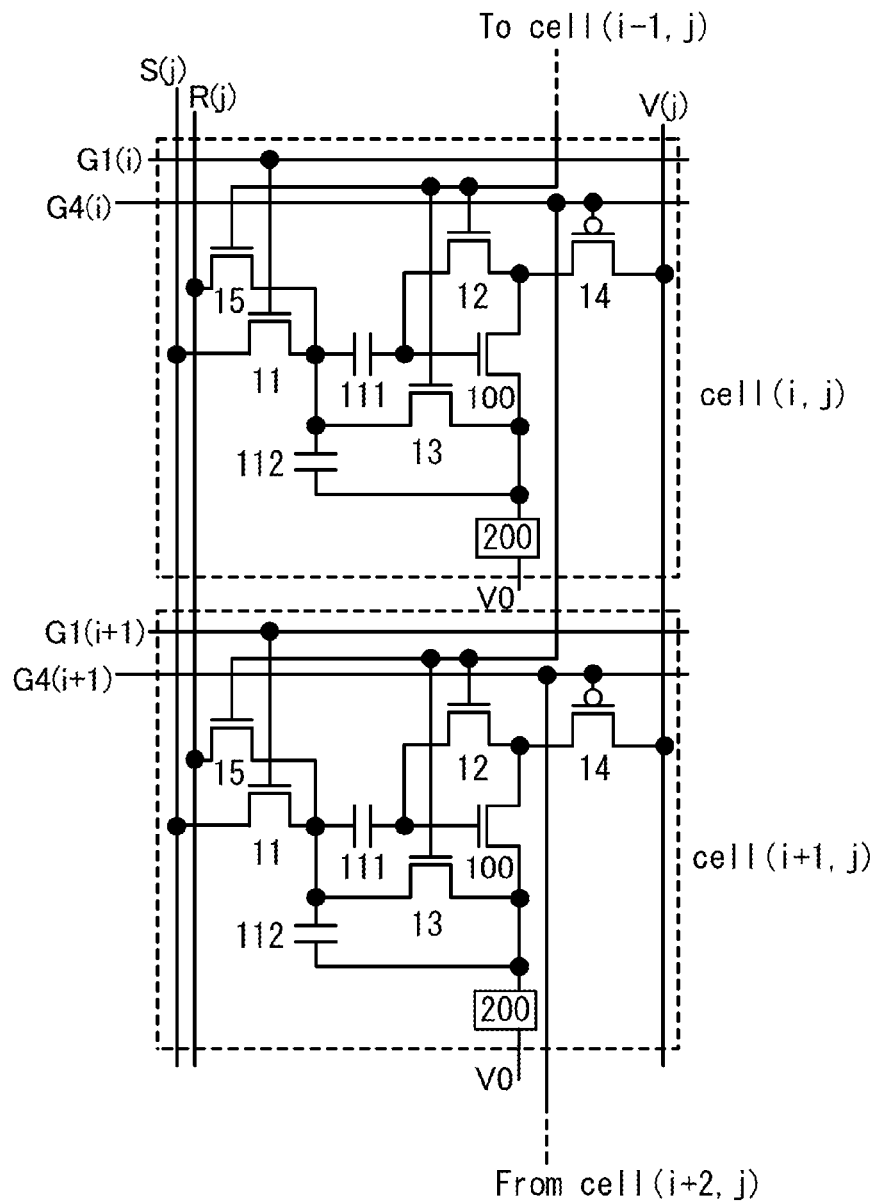
FIG. 43A is a circuit diagram illustrating the configuration of a semiconductor device including transistors as switches.
FIG. 43B is a timing chart illustrating a method for driving the semiconductor device.

FIG. 43A illustrates an example of a semiconductor device including a plurality of basic circuits (cells) having the configuration illustrated in FIG. 23A. The wiring G4 of the basic circuit (cell) in the previous row can be used without the provision of the wirings G2, G3, and G5. Note that the conductivity types of the transistors 12, 13, and 15 are different from that of the transistor 14. An example of a method for driving the semiconductor device having this structure is illustrated in FIG. 43B. FIG. 43B illustrates the timing relationships between the periods T11, T12, T13, and T14 in the cell(i,j) and the periods T11, T12, T13, and T14 in the cell(i+1,j). The operation in each period is the same as that described in Embodiments 1 and 2, and the description thereof is omitted.

Figure 45A:
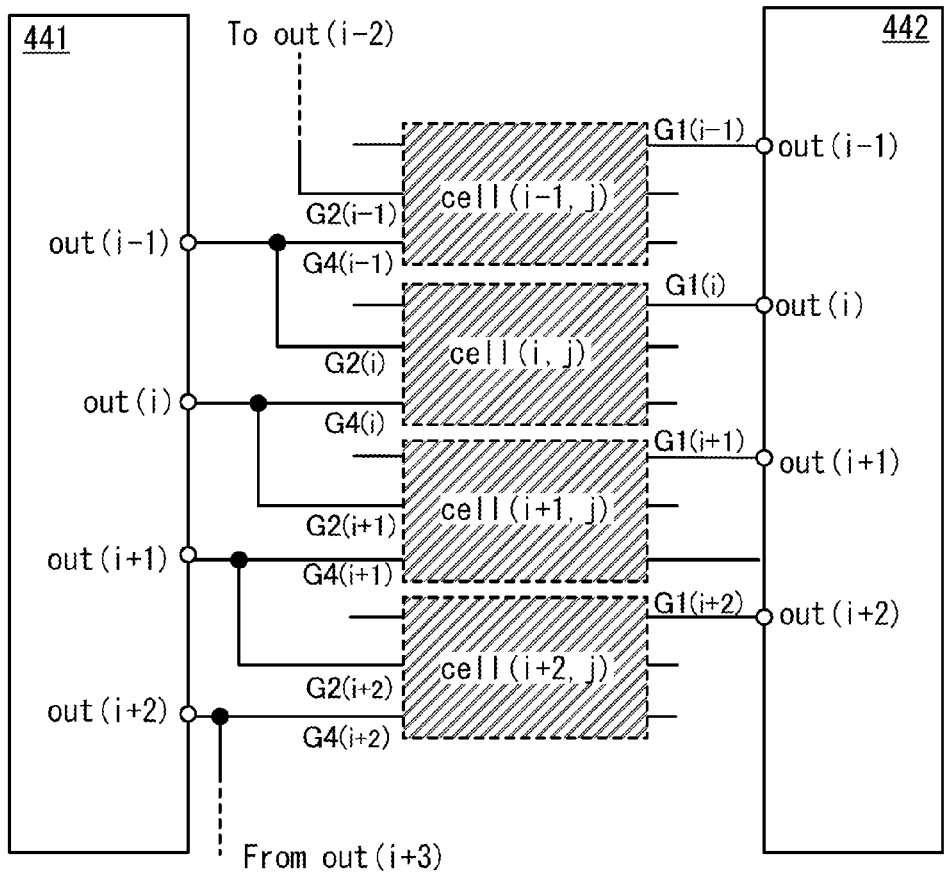
FIG. 45A is a block diagram illustrating the structure of a semiconductor device.
Figure 45B:
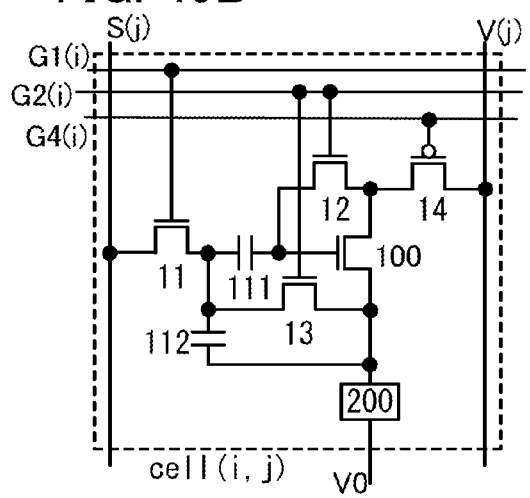
FIGS. 45B and 45C are circuit diagrams each illustrating the configuration of a semiconductor device.
Figure 45C:
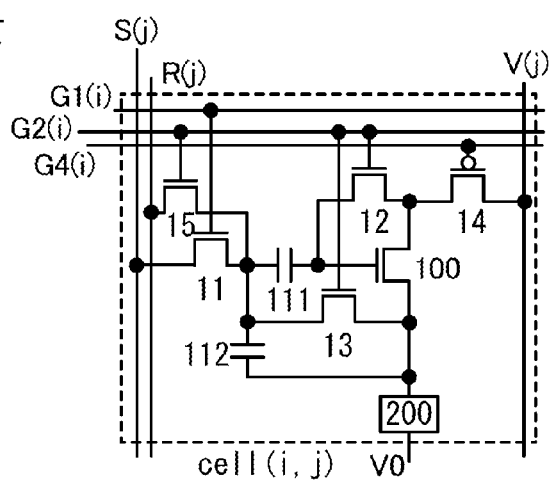

FIG. 45A illustrates an example of a semiconductor device including a plurality of basic circuits (cells) having the configuration illustrated in FIG. 45B or FIG. 45C. The semiconductor device can include the unit 441 (e.g., a scan line driver circuit) having a function of inputting signals to the wirings G2 and G4 of the basic circuits, and the unit 442 (e.g., a scan line driver circuit) having a function of inputting signals to the wirings G1 of the basic circuits. Here, when the output out(i) of the unit 441 is input to both the wiring G2(i) and the wiring G4(i−1), a signal input to the wiring G2 of each basic circuit can be the same as a signal input to the wiring G4 of the basic circuit (cell) in the previous row. Note that as illustrated in FIGS. 45B and 45C, the conductivity types of the transistors 12 and 13 are different from that of the transistor 14.

Although not shown, in the semiconductor device including a plurality of basic circuits (cells) having the configuration illustrated in FIG. 23A, the wiring G1 of the basic circuit (cell) in the previous row can be used without the provision of the wirings G2, G3, and G5. In that case, the transistors 12, 13, and 15 have the same conductivity type as the transistor 11.

FIGS. 22A to 22C, FIGS. 23A to 23C, FIGS. 24 to 29, FIG. 41A, FIG. 42A, FIG. 43A, and FIGS. 45B and 45C each illustrate the example in which one switch is composed of one transistor; however, the present invention is not limited thereto. One switch may be composed of a plurality of transistors, for example, transistors connected in series or transistors connected in parallel. Alternatively, one switch may be composed of an n-channel transistor and a p-channel transistor (i.e., a CMOS switch).

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

Embodiment 5

A capacitor 113 can be additionally provided in the basic circuit described in the above embodiment. Examples of such a configuration will be described below.

Figure 30A:
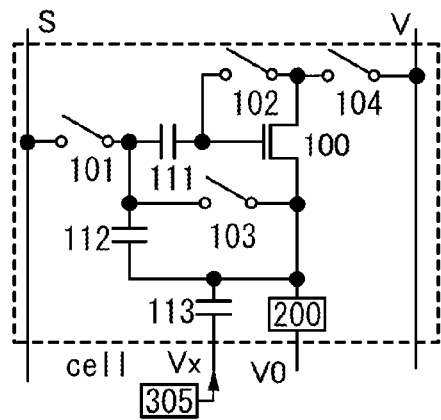
FIGS. 30A to 30F are circuit diagrams each illustrating the configuration of a semiconductor device.
Figure 30B:
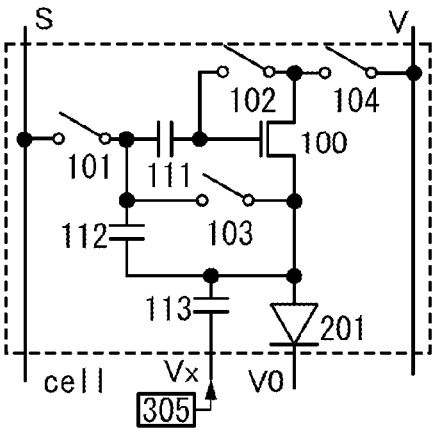
Figure 30C:
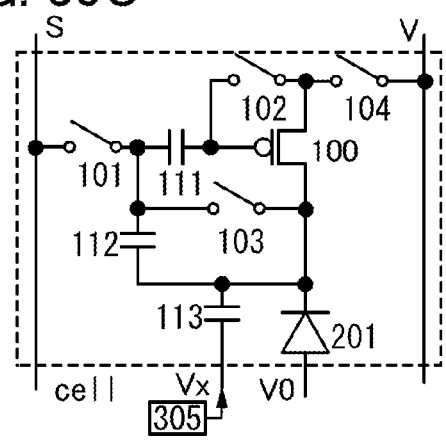

FIGS. 30A, 30B, and 30C illustrate configurations in which the capacitor 113 is provided in the basic circuits illustrated in FIGS. 1A, 1C, and 1E, respectively. In FIG. 30A, one of a pair of electrodes of the capacitor 113 is connected to the load 200 and the other thereof is connected to a wiring Vx. In FIG. 30B, one of the pair of electrodes of the capacitor 113 is connected to the anode of the light-emitting element 201 and the other thereof is connected to the wiring Vx. In FIG. 30C, one of the pair of electrodes of the capacitor 113 is connected to the cathode of the light-emitting element 201 and the other thereof is connected to the wiring Vx.

For example, the wiring Vx is connected to at least a circuit 305 that supplies a power supply potential (a low power supply potential or a high power supply potential) as illustrated in FIG. 30A. An example of the circuit 305 is a power supply circuit. Accordingly, the wiring Vx has a function of transmitting or supplying the power supply potential, a function of supplying electric charge to the capacitor 113, or a function of a power supply line or a capacitor line. Note that the potential of the wiring Vx is preferably constant; however, one aspect of the embodiment of the present invention is not limited thereto, and the potential of the wiring Vx may vary like a pulse signal.

Figure 30D:
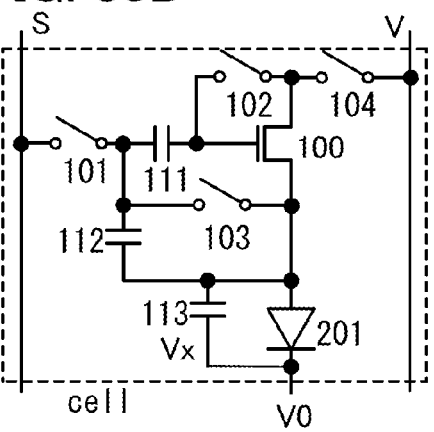
Figure 30E:
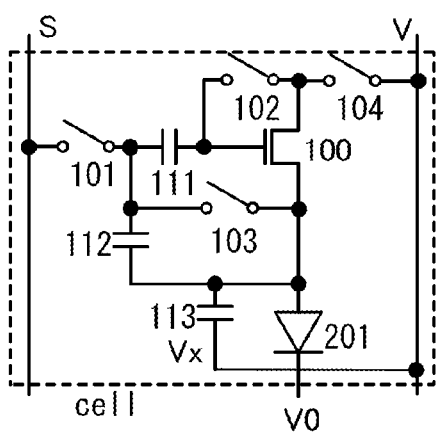
Figure 39:
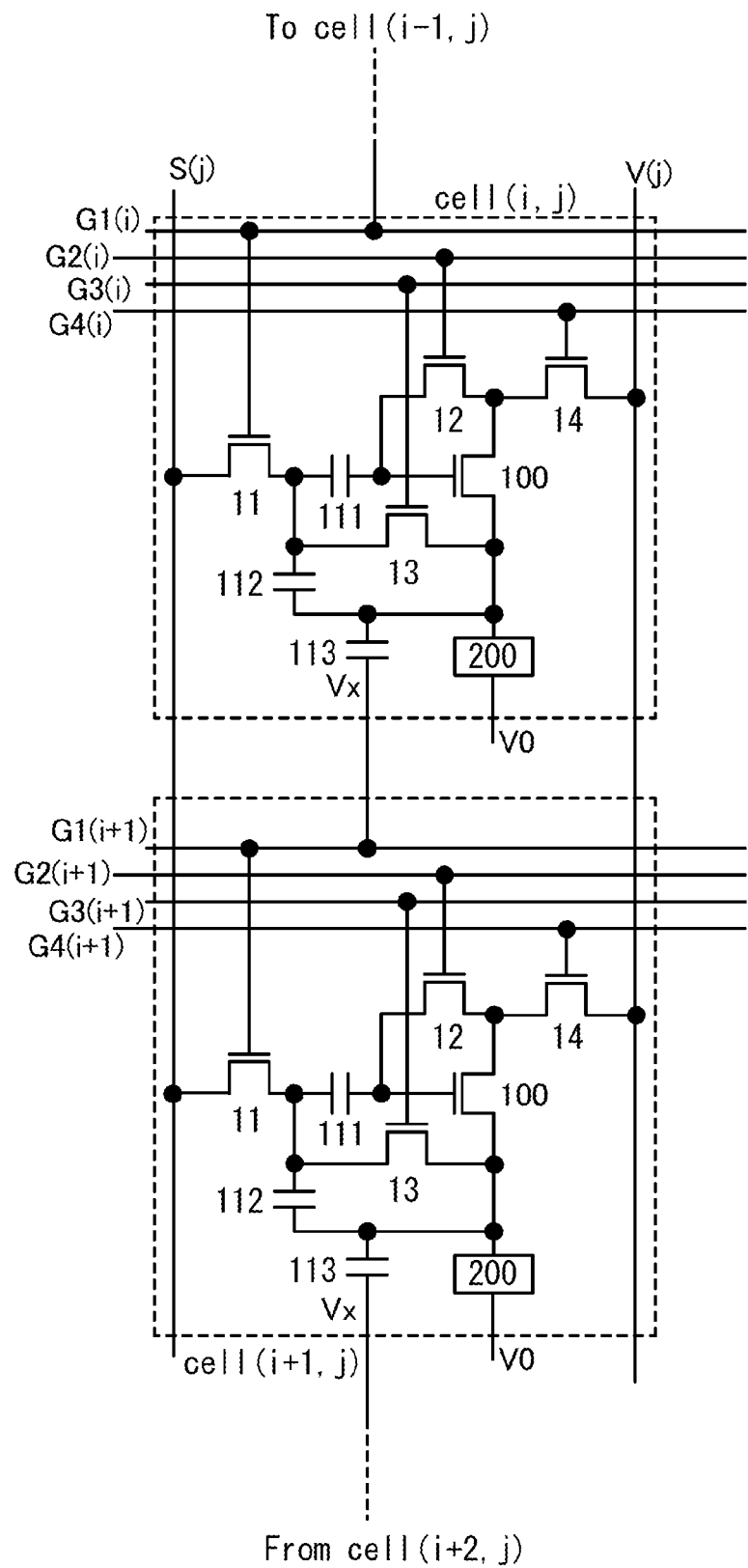
FIG. 39 is a circuit diagram illustrating the configuration of a semiconductor device including transistors as switches.

As illustrated in FIG. 30D, the wiring Vx in FIG. 30B may be connected to the wiring V0. As illustrated in FIG. 30E, the wiring Vx in FIG. 30B may be connected to the wiring V. In FIGS. 30A and 30C, the wiring Vx can be connected in a manner similar to those in FIGS. 30D and 30E. Without limitation to the above, the wiring Vx may be connected to another wiring or a terminal. For example, in a semiconductor device including a plurality of basic circuits (cells) having the configuration illustrated in any of FIGS. 30A to 30E, the wiring Vx can be connected to a wiring of another basic circuit. For instance, as illustrated in FIG. 39, the wiring Vx can be connected to the wiring G1, the wiring G2, the wiring G3, or the like of a basic circuit in the next row or the previous row.

Figure 30F:
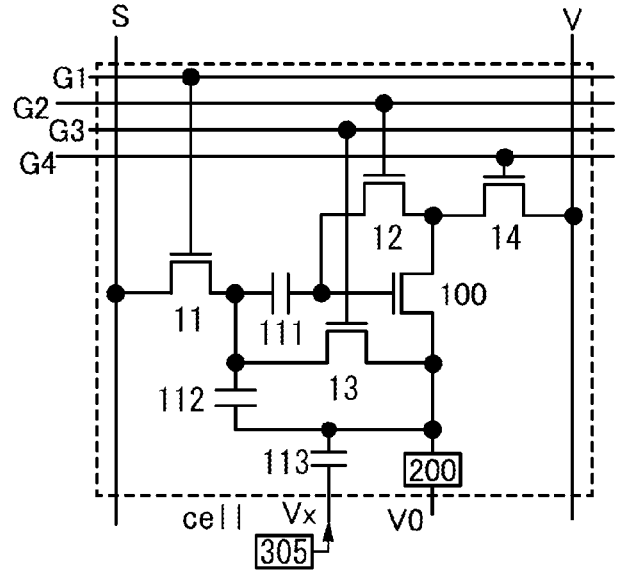

In FIGS. 30A to 30E, the switches 101 to 104 can be composed of transistors. FIG. 30F illustrates an example in which each of the switches in FIG. 30A is a transistor. Note that the same portions as those in FIG. 22A are denoted by the same reference numerals, and the description thereof is not repeated.

Figure 31A:
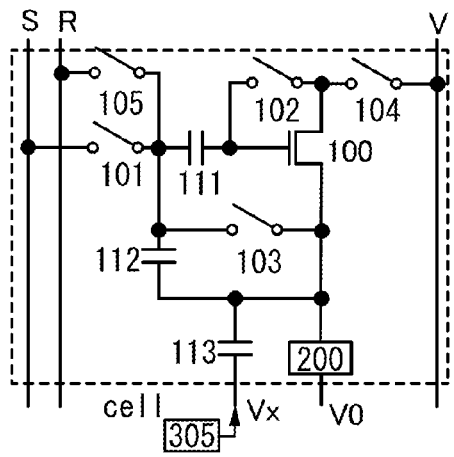
FIGS. 31A to 31F are circuit diagrams each illustrating the configuration of a semiconductor device.
Figure 31B:
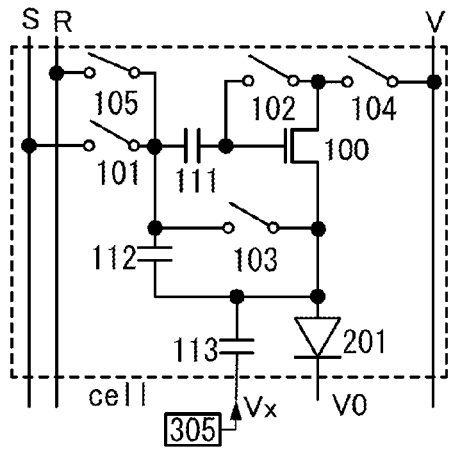
Figure 31C:
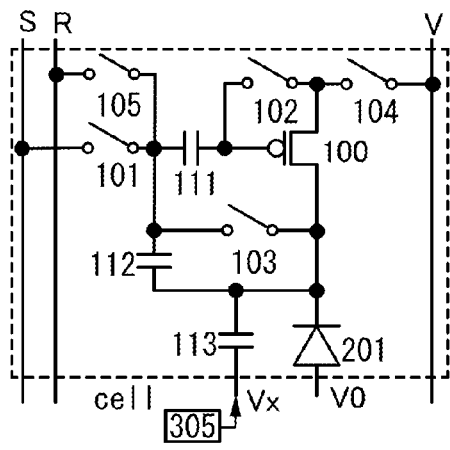

FIGS. 31A, 31B, and 31C illustrate configurations in which the capacitor 113 is provided in the basic circuits illustrated in FIGS. 7A, 7C, and 7E, respectively. In FIG. 31A, one of the pair of electrodes of the capacitor 113 is connected to the load 200 and the other thereof is connected to a wiring Vx. In FIG. 31B, one of the pair of electrodes of the capacitor 113 is connected to the anode of the light-emitting element 201 and the other thereof is connected to the wiring Vx. In FIG. 31C, one of the pair of electrodes of the capacitor 113 is connected to the cathode of the light-emitting element 201 and the other thereof is connected to the wiring Vx.

For example, the wiring Vx is connected to at least the circuit 305 that supplies a power supply potential (a low power supply potential or a high power supply potential) as illustrated in FIG. 31A. An example of the circuit 305 is a power supply circuit. Accordingly, the wiring Vx has a function of transmitting or supplying the power supply potential, a function of supplying electric charge to the capacitor 113, or a function of a power supply line or a capacitor line. Note that the potential of the wiring Vx is preferably constant; however, one aspect of the embodiment of the present invention is not limited thereto, and the potential of the wiring Vx may vary like a pulse signal.

Figure 31D:
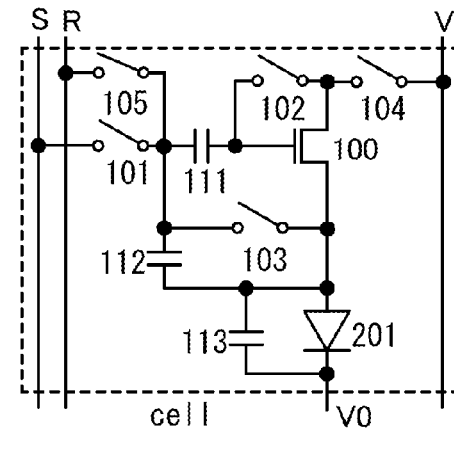
Figure 31E:
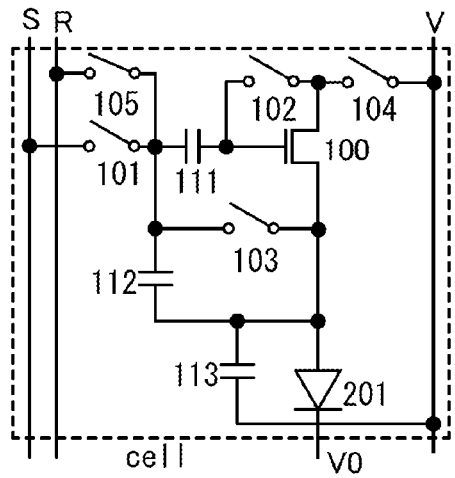
Figure 31F:
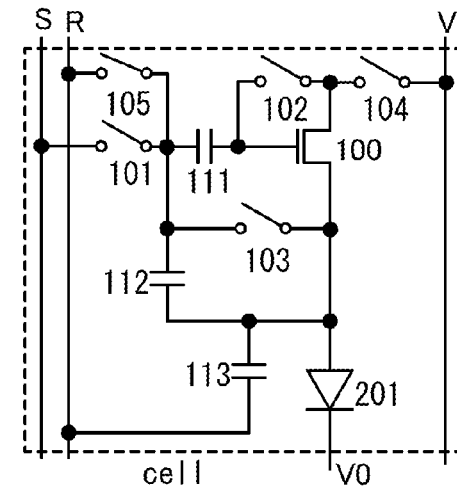
Figure 40:
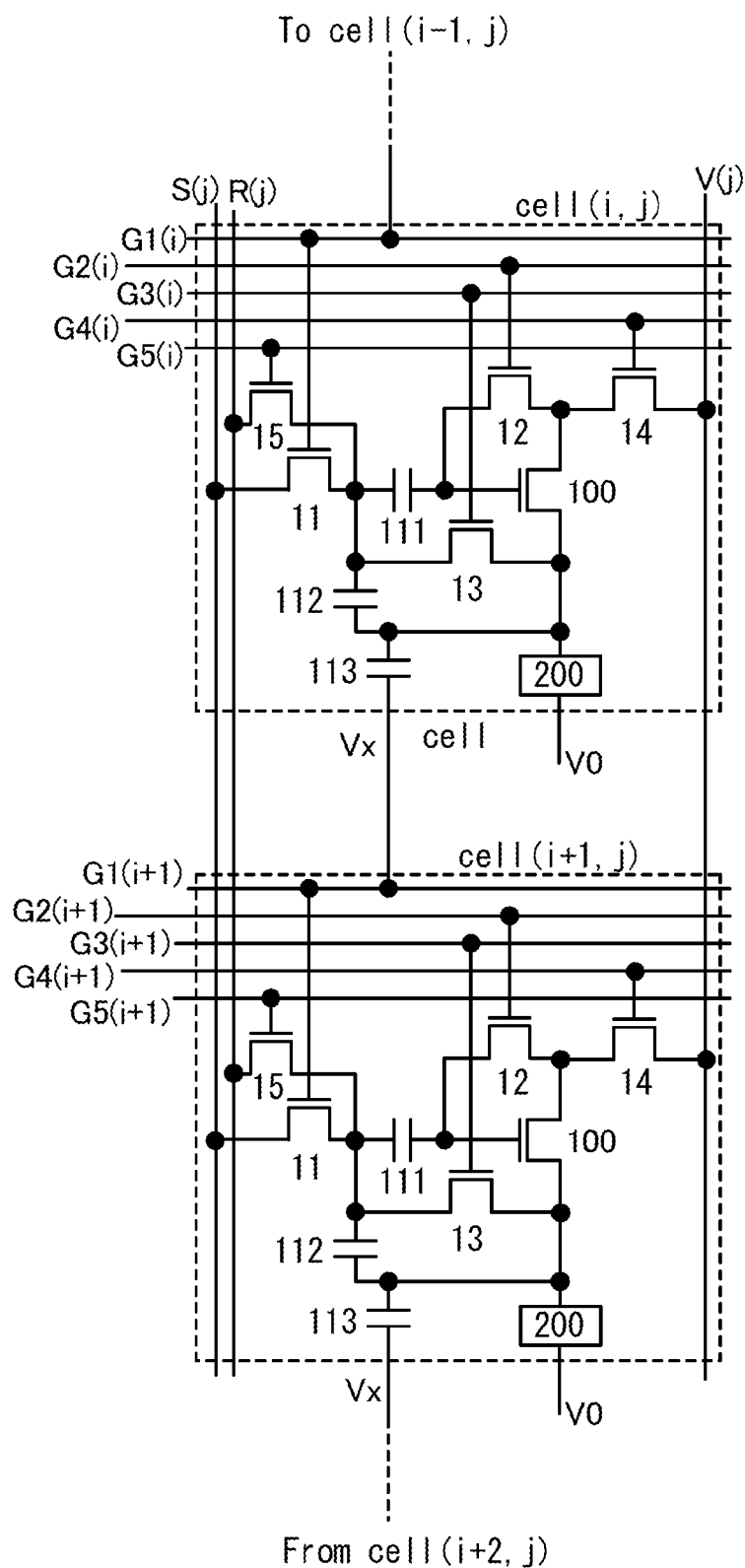
FIG. 40 is a circuit diagram illustrating the configuration of a semiconductor device including transistors as switches.
Figure 52A:
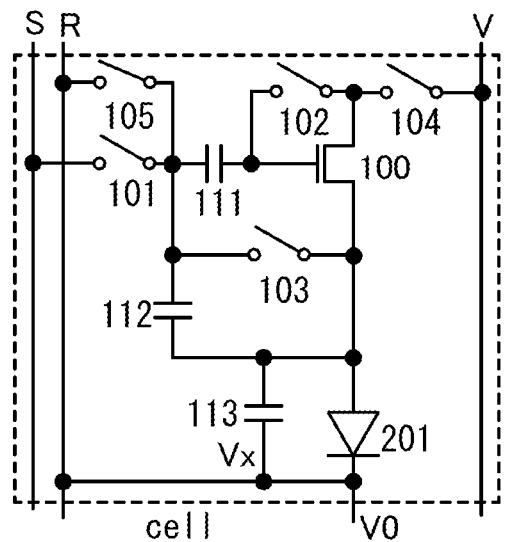
FIGS. 52A and 52B are circuit diagrams each illustrating the configuration of a semiconductor device.
Figure 53:
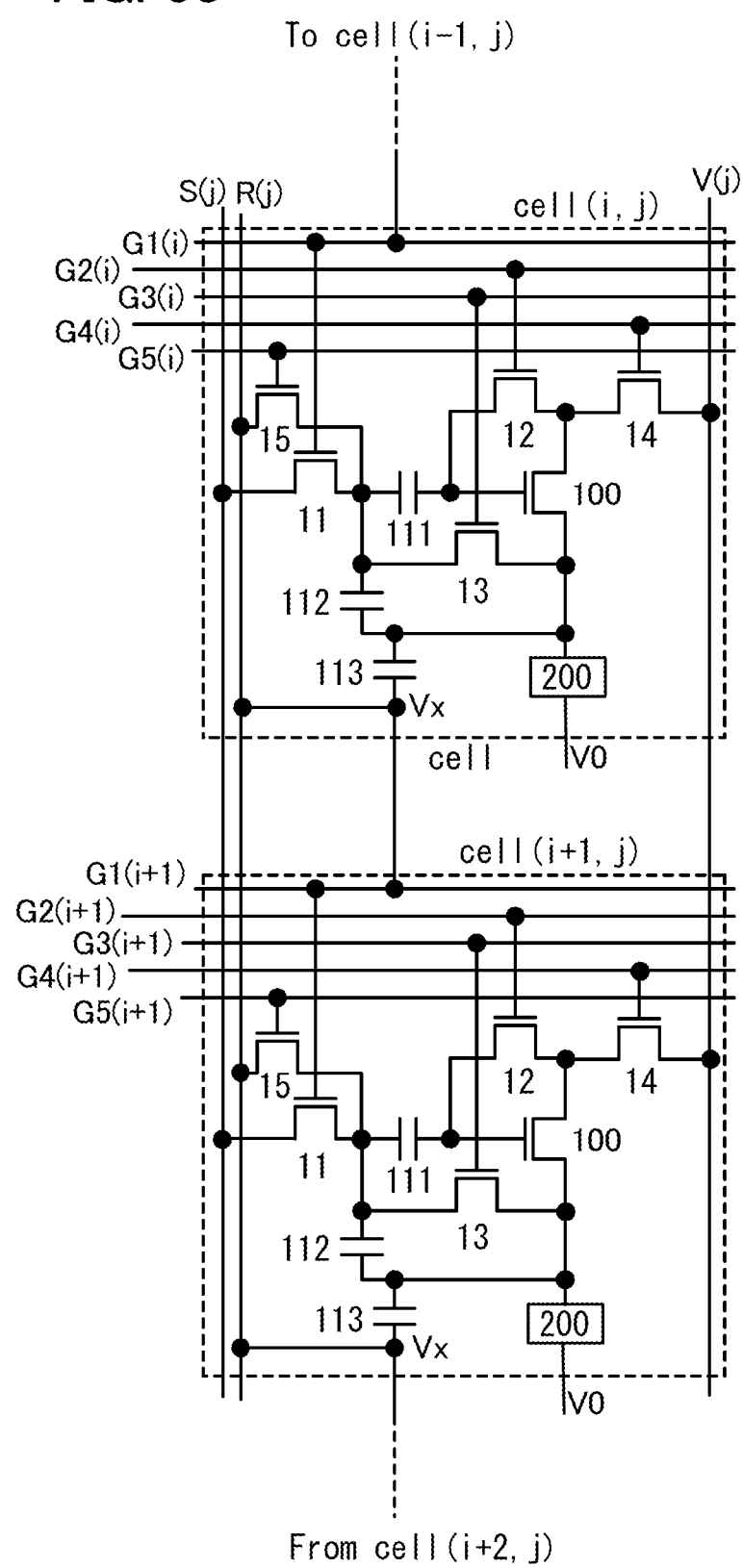
FIG. 53 is a circuit diagram illustrating the configuration of a semiconductor device including transistors as switches.

As illustrated in FIG. 31D, the wiring Vx in FIG. 31B may be connected to the wiring V0. As illustrated in FIG. 31E, the wiring Vx in FIG. 31B may be connected to the wiring V. As illustrated in FIG. 31F, the wiring Vx in FIG. 31B may be connected to the wiring R. In FIGS. 31A and 31C, the wiring Vx can be connected in a manner similar to those in FIGS. 31D to 31F. Without limitation to the above, the wiring Vx may be connected to another wiring or a terminal. For example, in a semiconductor device including a plurality of basic circuits (cells) having the configuration illustrated in any of FIGS. 31A to 31F, the wiring Vx can be connected to a wiring of another basic circuit. For instance, as illustrated in FIG. 40, the wiring Vx can be connected to the wiring G1 of the basic circuit in the next row. As illustrated in FIG. 53, the wiring Vx in FIG. 40 can also be connected to the wiring R, for example. Moreover, the configurations illustrated in FIGS. 31A to 31F and FIG. 40 can be combined with those illustrated in FIGS. 8A to 8C. That is, in FIGS. 31A to 31F and FIG. 40, the wiring V0 can be connected to the wiring R. For example, as illustrated in FIG. 52A, the wiring Vx in FIG. 31B may be connected to the wiring V0 and the wiring R.

Figure 52B:
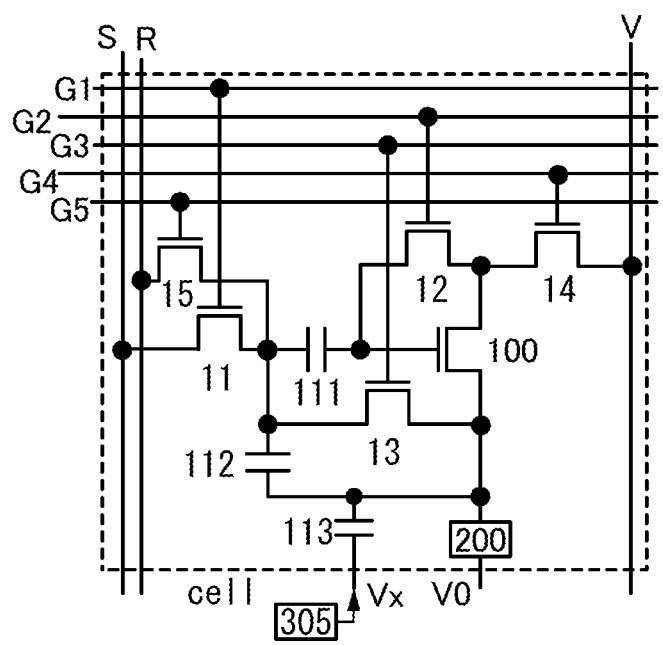

In FIGS. 31A to 31F, FIG. 40, FIG. 52A, ad the like, each of the switches (the switches 101 to 105) can be composed of a transistor. For example, as illustrated in FIG. 52B, the switches in FIG. 31A can be transistors. In FIG. 52B, the same portions as those in FIG. 23A are denoted by the same reference numerals, and the description thereof is omitted.

In the case of employing a driving method using the period T13' illustrated in FIG. 4A, FIG. 6A, FIG. 11A, and FIG. 13A, the provision of the capacitor 113 as in FIGS. 30A to 30E and FIGS. 31A to 31F facilitates adjustment of the amount of current flowing through the transistor 100 in the period T13; thus, the gate-source voltage of the transistor 100 can be corrected in accordance with the mobility of the transistor 100 more precisely. Alternatively, the provision of the capacitor 113 is equivalent to a substantial increase in the capacitance of the load 200, so that the level of $V\alpha$ in the period T13 can be decreased.

Note that in FIGS. 30A to 30F, FIGS. 31A to 31F, and the like, the area of the electrodes of the capacitor 113 is preferably smaller than the area of the electrodes of the load 200 (the light-emitting element 201), more preferably ½ or less, still more preferably ⅓ or less the area of the electrodes of the load 200 (the light-emitting element 201). Alternatively, the capacitance of the capacitor 113 is preferably lower than the capacitance of the load 200 (the light-emitting element 201), more preferably ½ or less, still more preferably ⅓ or less the capacitance of the load 200 (the light-emitting element 201). Accordingly, a semiconductor device can perform optimum operation without changing the layout area. Note that one aspect of the embodiment of the present invention is not limited thereto.

Note that in FIGS. 30A to 30F, FIGS. 31A to 31F, and the like, the total area of the electrodes of the capacitor 113 and the electrodes of the load 200 (the light-emitting element 201) is preferably larger than the area of the electrodes of the capacitor 112, more preferably 2 or more times, still more preferably 5 or more times the area of the electrodes of the capacitor 112. Alternatively, the total capacitance of the capacitor 113 and the load 200 (the light-emitting element 201) is preferably higher than the capacitance of the capacitor 112, more preferably 2 or more times, still more preferably 5 or more times the capacitance of the capacitor 112. Accordingly, when voltage is divided by the load 200 (the light-emitting element 201) and each of the capacitors 112 and 113, higher voltage can be applied to the capacitor 112. Note that one aspect of the embodiment of the present invention is not limited thereto.

Note that in FIGS. 30A to 30F, FIGS. 31A to 31F, and the like, the area of the electrodes of the capacitor 113 is preferably smaller than the area of the electrodes of the capacitor 112 or the capacitor 111, more preferably ½ or less, still more preferably ⅓ or less the area of the electrodes of the capacitor 112 or the capacitor 111. Alternatively, the capacitance of the capacitor 113 is preferably lower than the capacitance of the capacitor 112 or the capacitor 111, more preferably ½ or less, still more preferably ⅓ or less the capacitance of the capacitor 112 or the capacitor 111. Accordingly, a semiconductor device can perform optimum operation without changing the layout area. Note that one aspect of the embodiment of the present invention is not limited thereto.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

Embodiment 6

This embodiment shows examples of display devices and light-emitting devices each including the basic circuits (cells) described in any of the above embodiments as pixels.

Figure 32A:
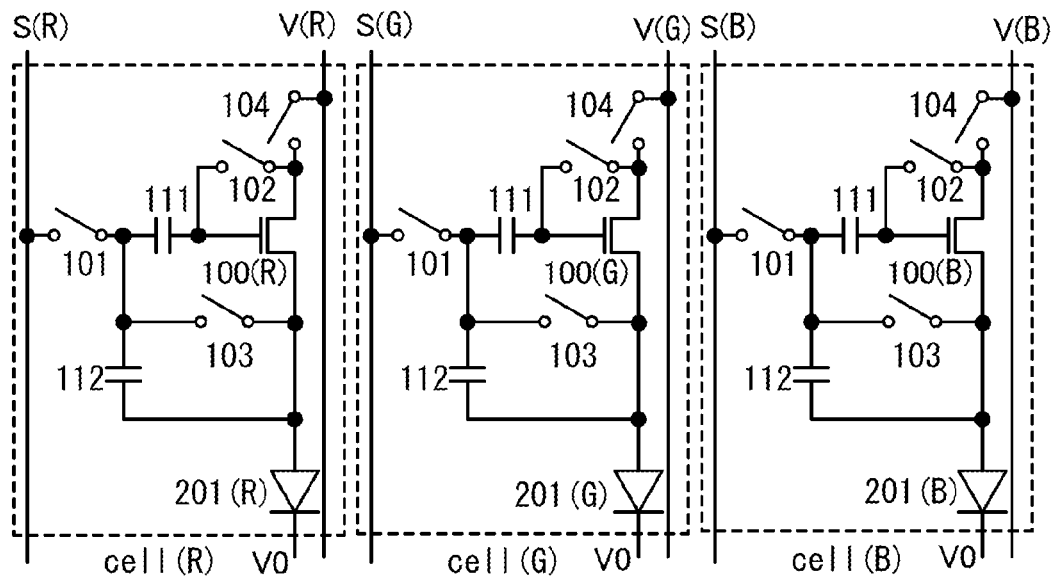
FIGS. 32A and 32B are circuit diagrams each illustrating the configuration of a semiconductor device including pixels corresponding to red, green, and blue.
Figure 33A:
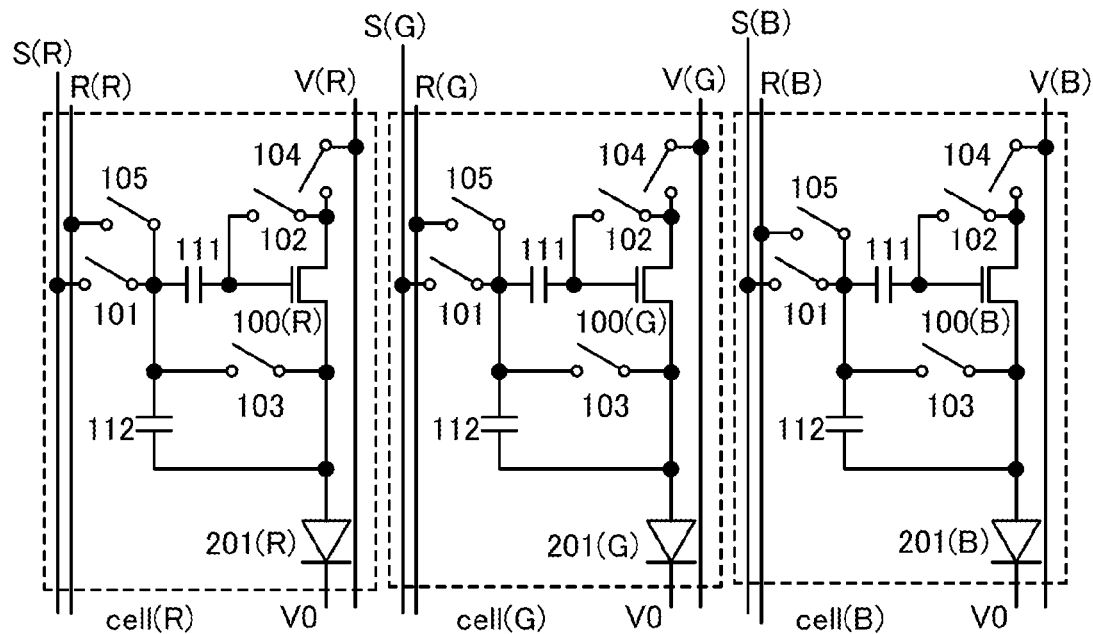
FIGS. 33A and 33B are circuit diagrams each illustrating the configuration of a semiconductor device including pixels corresponding to red, green, and blue.

FIG. 32A illustrates an example of a display device including the basic circuits (cells) illustrated in FIG. 1C of Embodiment 1 as pixels. FIG. 33A illustrates an example of a display device including the basic circuits (cells) illustrated in FIG. 7C of Embodiment 2 as pixels. A pixel corresponding to red is represented by cell(R), and "(R)" is added to the components (the wiring S, the wiring V, (the wiring R,) the light-emitting element 201, and the transistor 100) of the pixel to distinguish them from components of other pixels. A pixel corresponding to green is represented by cell(G), and "(G)" is added to the components (the wiring S, the wiring V, (the wiring R,) the light-emitting element 201, and the transistor 100) of the pixel to distinguish them from components of other pixels. A pixel corresponding to blue is represented by cell(B), and "(B)" is added to the components (the wiring S, the wiring V, (the wiring R,) the light-emitting element 201, and the transistor 100) of the pixel to distinguish them from components of other pixels. The configuration of the basic circuit (cell) is as described in Embodiments 1 and 2, and the description thereof is therefore omitted.

In FIGS. 32A and 33A, the ratio of channel width to channel length of the transistor 100 can vary depending on pixels corresponding to different colors, for example. That is, the ratio of channel width to channel length can vary between the transistors 100(R), 100(G), and 100(B). Further, for example, the width of the wiring V can vary depending on pixels corresponding to different colors. That is, the wirings V(R), V(G), and V(B) can vary in width. In such a manner, the color balance is maintained, and the quality of a display device and a light-emitting device can be improved.

Figure 32B:
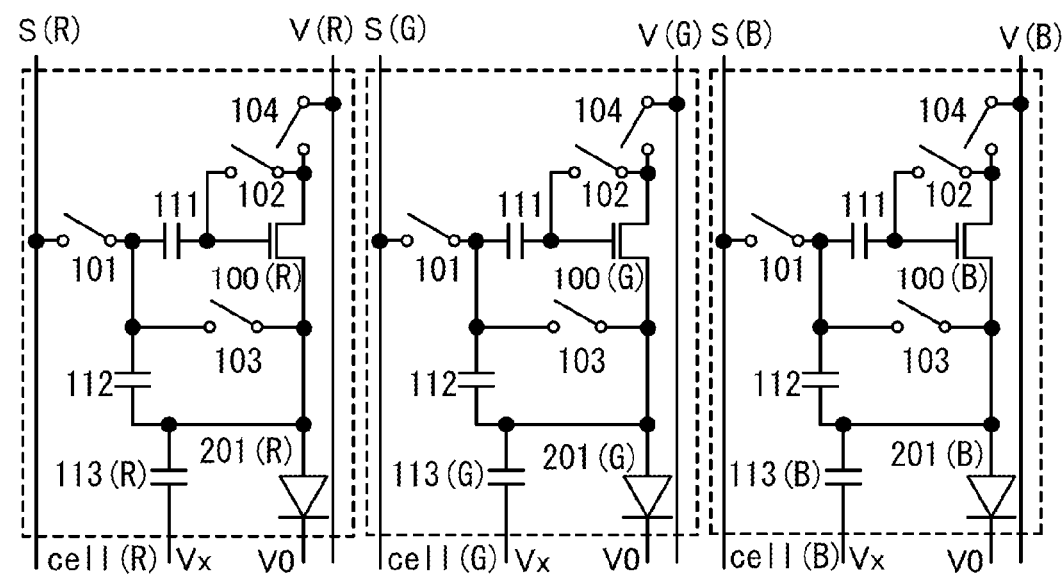
Figure 33B:
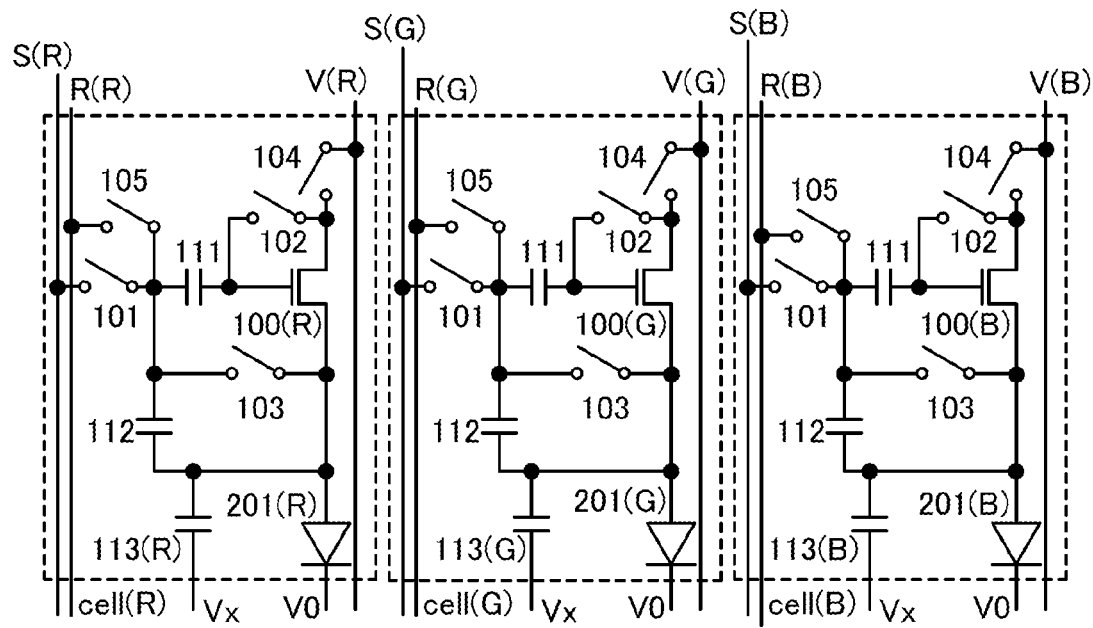

FIG. 32B illustrates an example of a display device including the basic circuits (cells) illustrated in FIG. 30B of Embodiment 5 as pixels. FIG. 33B illustrates an example of a display device including the basic circuits (cells) illustrated in FIG. 31B of Embodiment 5 as pixels. A pixel corresponding to red is represented by cell(R), and "(R)" is added to the components (the wiring S, the wiring V, (the wiring R,) the light-emitting element 201, the transistor 100, and the capacitor 113) of the pixel to distinguish them from components of other pixels. A pixel corresponding to green is represented by cell(G), and "(G)" is added to the components (the wiring S, the wiring V, (the wiring R,) the light-emitting element 201, the transistor 100, and the capacitor 113) of the pixel to distinguish them from components of other pixels. A pixel corresponding to blue is represented by cell(B), and "(B)" is added to the components (the wiring S, the wiring V, (the wiring R,) the light-emitting element 201, the transistor 100, and the capacitor 113) of the pixel to distinguish them from components of other pixels. The configuration of the basic circuit (cell) is as described in Embodiment 5, and the description thereof is therefore omitted.

In FIGS. 32B and 33B, the ratio of channel width to channel length of the transistor 100 can vary depending on pixels corresponding to different colors, for example. That is, the ratio of channel width to channel length can vary between the transistors 100(R), 100(G), and 100(B). Further, for example, the width of the wiring V can vary depending on pixels corresponding to different colors. That is, the wirings V(R), V(G), and V(B) can vary in width. Moreover, the capacitance of the capacitor 113 can vary depending on pixels corresponding to different colors, for instance. That is, the capacitors 113(R), 113(G), and 113(B) can vary in capacitance. In such a manner, the color balance is maintained, and the quality of a display device and a light-emitting device can be improved.

FIGS. 32A and 32B and FIGS. 33A and 33B illustrate the examples of display devices and light-emitting devices including pixels corresponding to red, green, and blue; however, the present invention is not limited to these examples. A display device and a light-emitting device that include pixels corresponding to given colors can have similar configurations.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

Embodiment 7

In this embodiment, one aspect of a detailed configuration of the basic circuit (cell) will be described.

Figure 34A:
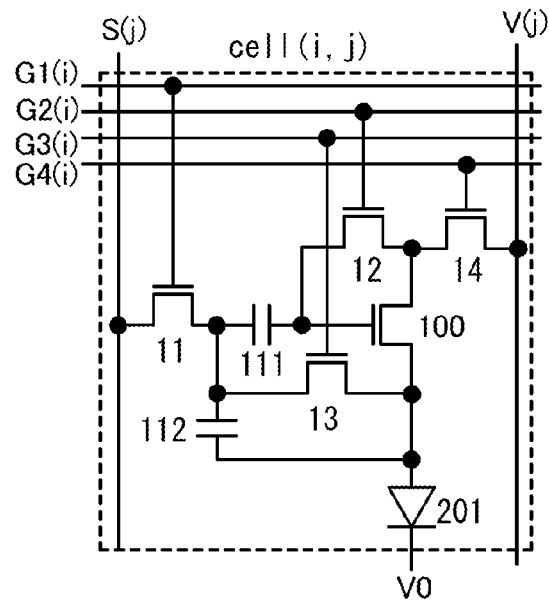
FIGS. 34A and 34B are a circuit diagram and a top view illustrating the configuration of a semiconductor device including transistors as switches.
Figure 34B:
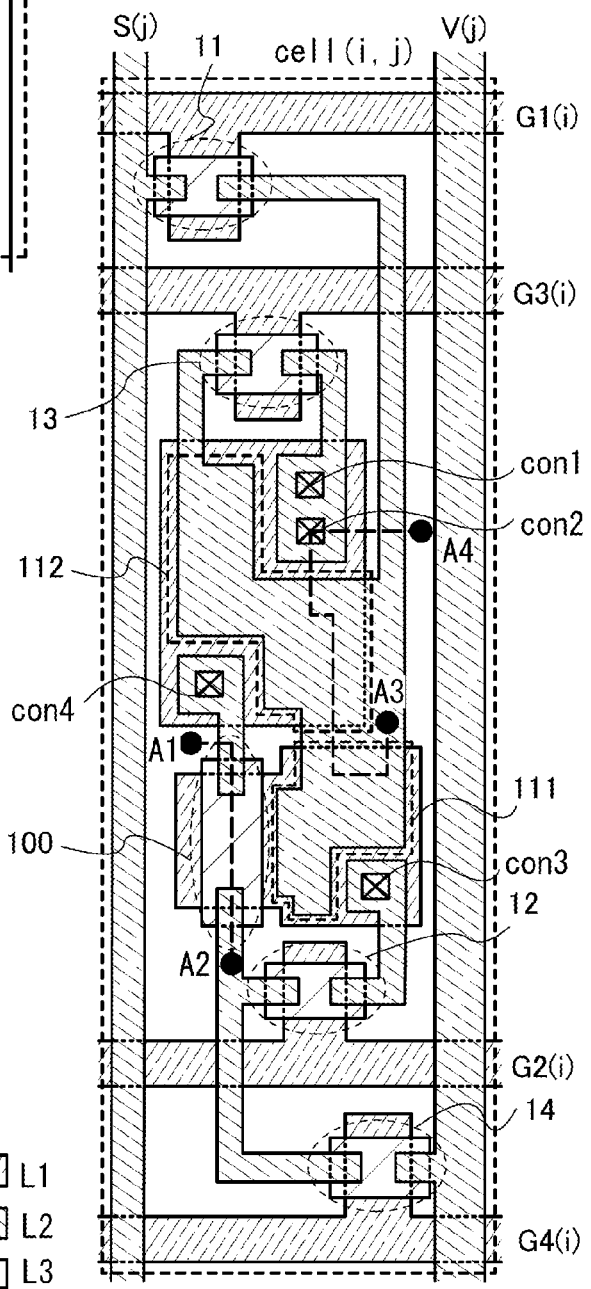

FIG. 34A illustrates a configuration in which the load 200 in the basic circuit illustrated in FIG. 22A is the light-emitting element 201. FIG. 34B illustrates an example of a top view of this basic circuit. Note that as shown at the lower left of FIG. 34B, portions with the same hatch pattern represent the same wiring layer. A wiring layer L1 forms the wirings G1(i), G2(i), G3(i), G4(i), and the like. A wiring layer L2 forms the wirings S(j) and V(j). A wiring layer L3 forms semiconductor layers of the transistors 11 to 14 and the transistor 100. In a contact hole con1, the wiring layer L2 is connected to the wiring layer L1. In a contact hole con2, the wiring layer L2 is connected to the anode of the light-emitting element 201. Note that the light-emitting element 201 is not illustrated in FIG. 34B. In a contact hole con3, the wiring layer L2 is connected to the wiring layer L1. In a contact hole con4, the wiring layer L2 is connected to the wiring layer L1.

Figure 35:
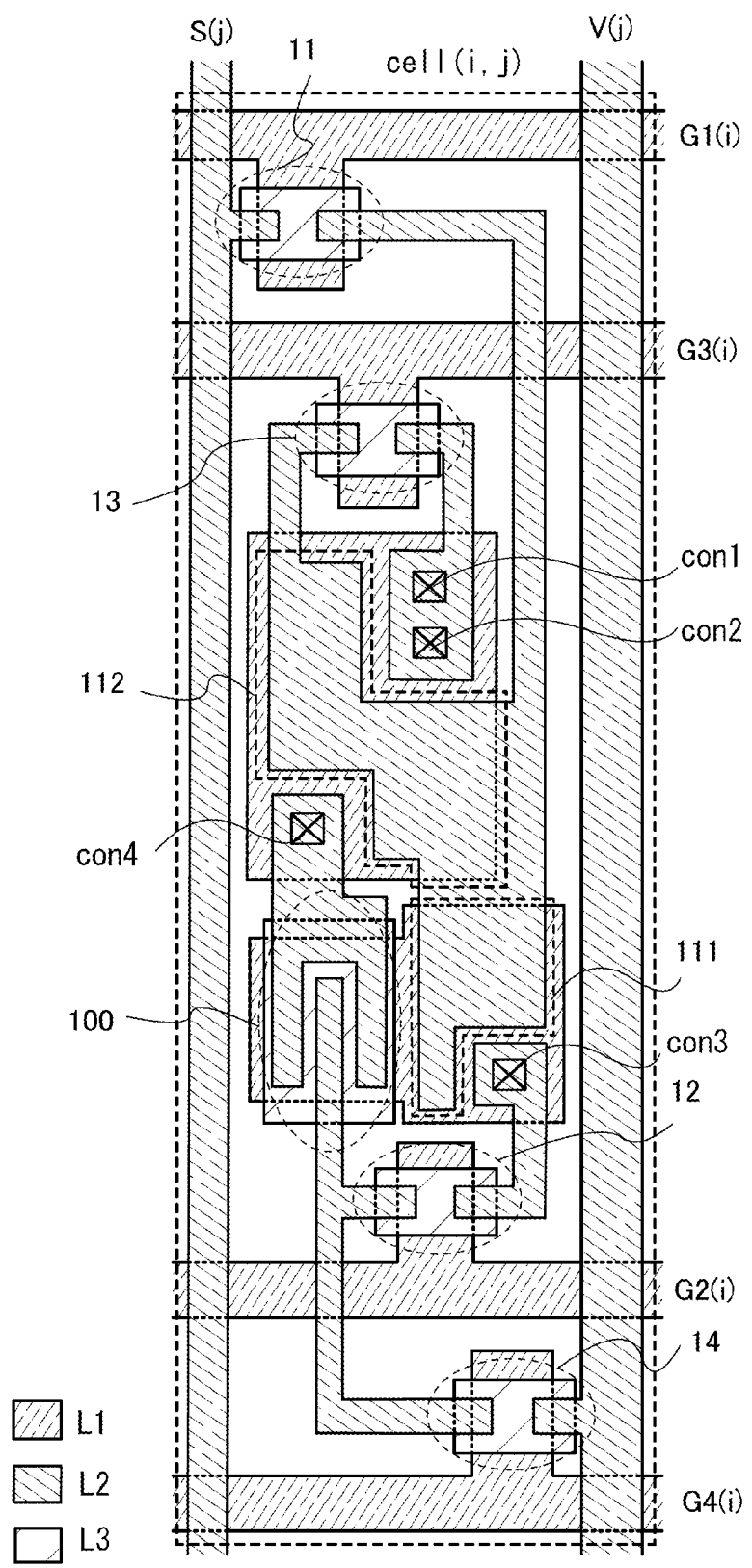
FIG. 35 is a top view illustrating the configuration of a semiconductor device including transistors as switches.
Figure 36:
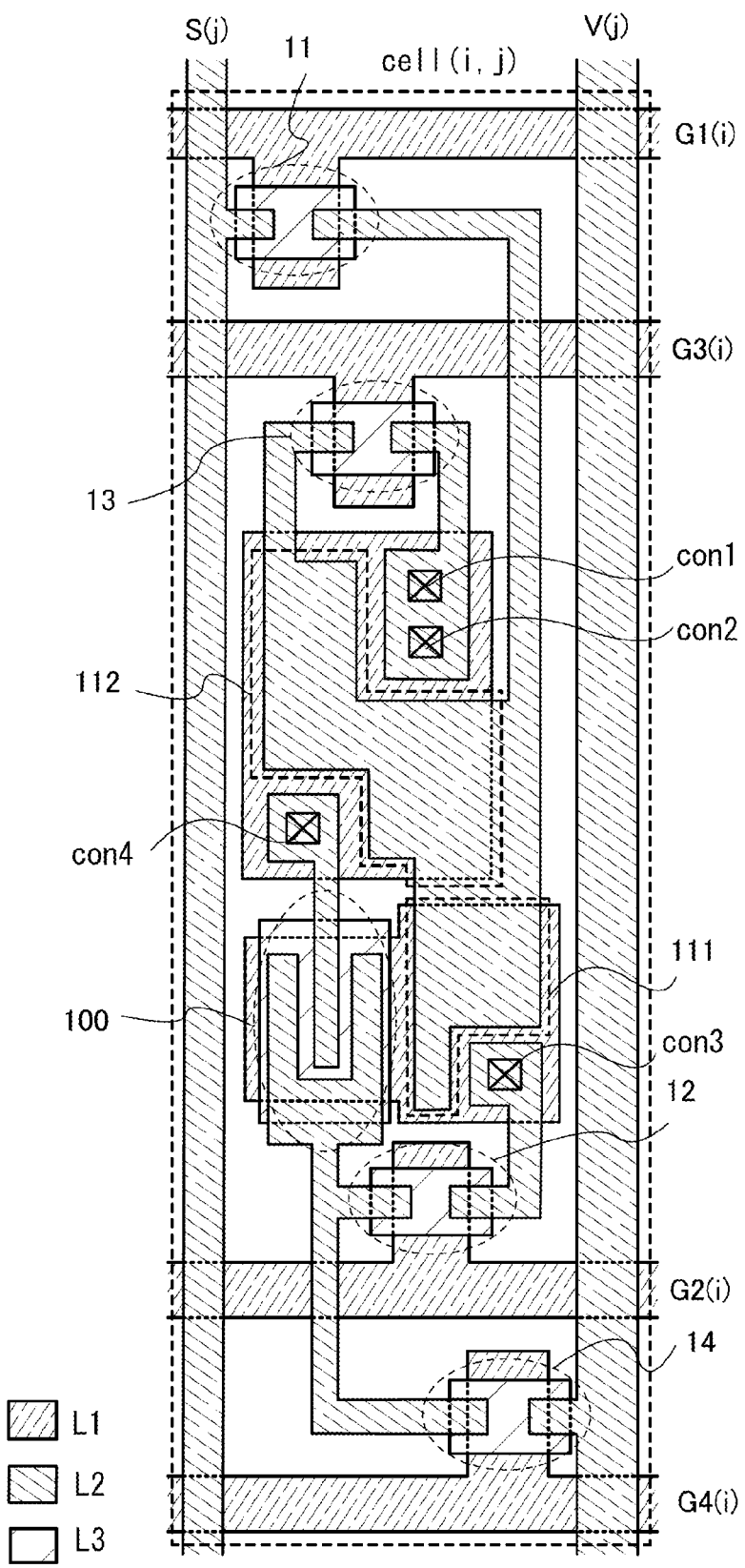
FIG. 36 is a top view illustrating the configuration of a semiconductor device including transistors as switches.

Note that in the structure shown in the top view in FIG. 34B, the structure of the transistor 100 can be changed. For example, as illustrated in FIG. 35, an electrode functioning as the drain of the transistor 100 can be placed to surround part of an electrode functioning as the source of the transistor 100. In other words, the electrode functioning as the drain of the transistor 100 can have a U-shape or a squared U-shape. In such a manner, the effective channel width of the transistor 100 can be increased, thereby increasing the reliability. Alternatively, for example, the electrode functioning as the source of the transistor 100 can be placed to surround part of the electrode functioning as the drain of the transistor 100 as illustrated in FIG. 36. In other words, the electrode functioning as the source of the transistor 100 can have a U-shape or a squared U-shape. Thus, the potential of the gate of the transistor 100 can be easily changed by bootstrap.

One example of the top view of the basic circuit illustrated in FIG. 22A is shown here; the basic circuits illustrated in other circuit diagrams can have a similar configuration. For example, in the basic circuit illustrated in FIG. 23A, the wiring R can be formed using the wiring layer L2 or the same layer as the anode of the light-emitting element 201.

Figure 37A:
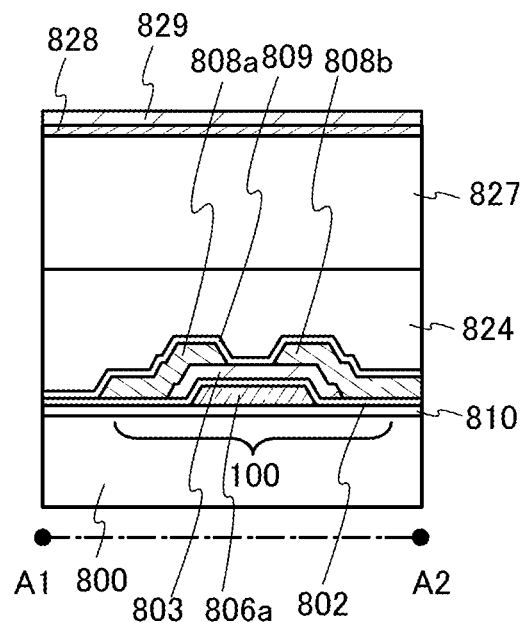
FIGS. 37A and 37B are cross-sectional views illustrating the structure of a semiconductor device.
Figure 37B:
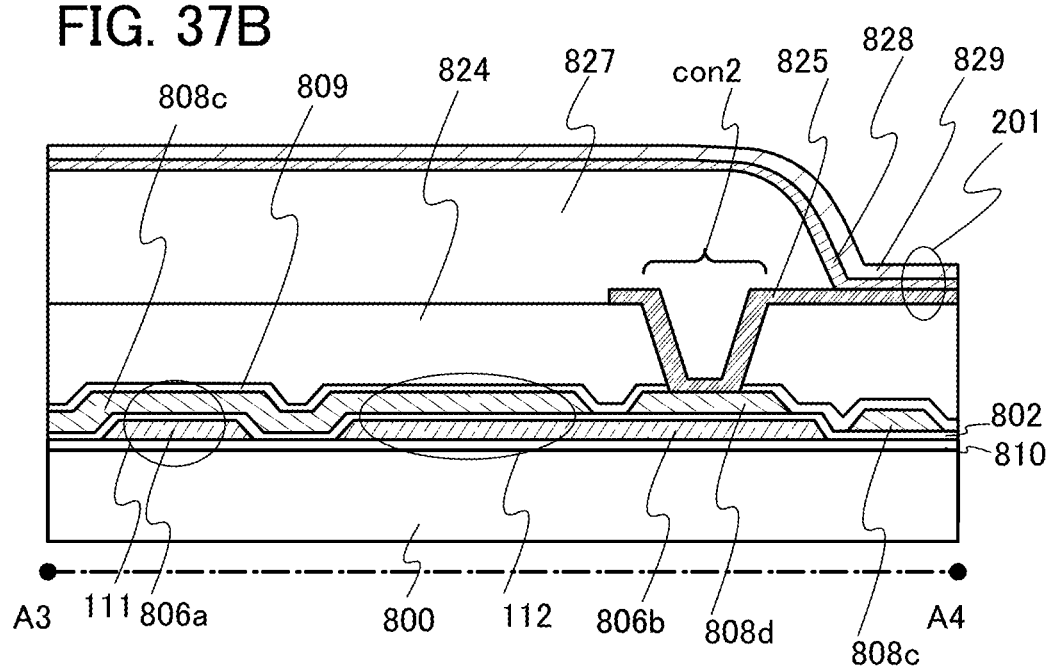

FIG. 37A is a cross-sectional view along line A1-A2 in FIG. 34B. FIG. 37B is a cross-sectional view along line A3-A4 in FIG. 34B.

In FIG. 37A, the transistor 100 is formed over a substrate 800 and an insulating film 810 provided over the substrate 800. The transistor 100 includes a conductive layer 806a functioning as the gate, an insulating layer 802 that is provided over the conductive layer 806a and functions as a gate insulating film, a semiconductor layer 803 that is provided over the insulating layer 802 and overlaps the conductive layer 806a, a conductive layer 808a that overlaps part of the semiconductor layer 803 and functions as one of the source and the drain, and a conductive layer 808b that overlaps part of the semiconductor layer 803 and functions as the other of the source and the drain. An insulating layer 809, an insulating layer 824, and an insulating layer 827 are provided over the transistor 100. A light-emitting layer 828 and a cathode 829, which are components of the light-emitting element 201, are provided over the insulating layer 827.

Here, the channel length of the transistor 100 is preferably larger than that of any other transistor included in the basic circuit. Thus, the reliability of the transistor 100 can be increased.

In FIG. 37B, the capacitor 111 and the capacitor 112 are formed over the substrate 800 and the insulating film 810 provided over the substrate 800. The capacitor 111 includes the conductive layer 806a functioning as one of a pair of electrodes, the insulating layer 802 functioning as a dielectric layer, and a conductive layer 808c functioning as the other of the pair of electrodes. The capacitor 112 includes a conductive layer 806b functioning as one of a pair of electrodes, the insulating layer 802 functioning as a dielectric layer, and the conductive layer 808c functioning as the other of the pair of electrodes. A conductive layer 808d is formed using the same layer as the conductive layer 808c. The insulating layers 809 and 824 are provided over the conductive layers 808c and 808d. An anode 825 of the light-emitting element 201 is provided over the insulating layer 824. The conductive layer 808d is connected to the anode 825 of the light-emitting element 201 in the contact hole con2 provided in the insulating layers 809 and 824. The insulating layer 827 is provided over the anode 825 of the light-emitting element 201 so as to expose part of the anode 825. The insulating layer 827 functions as a partition. The light-emitting layer 828 is provided in contact with the anode 825 of the light-emitting element 201, and the cathode 829 of the light-emitting element 201 is provided over the light-emitting layer 828.

Note that the structure of the transistor 100 is not limited to that illustrated in FIG. 37A and can be any of those illustrated in FIGS. 38A, 38B, 38D, and 38E, for example.

Figure 38A:
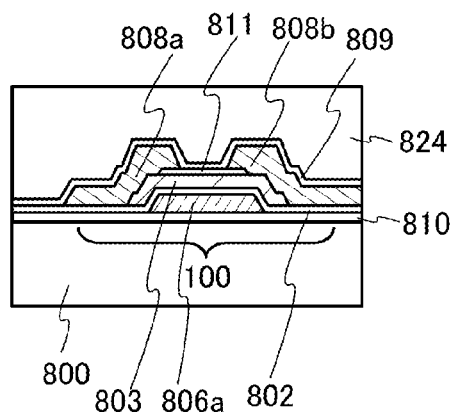
FIGS. 38A to 38F are cross-sectional views each illustrating the structure of a semiconductor device.

FIG. 38A illustrates an example in which an insulating layer 811 is provided between the semiconductor layer 803 and the conductive layers 808a and 808b in the transistor 100 having the structure in FIG. 37A. The insulating layer 811 can function as a channel protective film that prevents the semiconductor layer 803 from being etched away when the conductive layers 808a and 808b are processed into a predetermined shape by etching. The transistor 100 may be such a channel protective transistor.

Figure 38B:
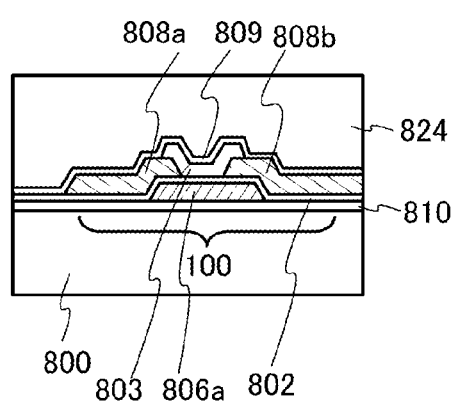

FIG. 38B illustrates an example in which the positions of the semiconductor layer 803 and the conductive layers 808a and 808b are changed in the transistor 100 having the structure in FIG. 37A so that the semiconductor layer 803 is provided over the conductive layers 808a and 808b.

Figure 38C:
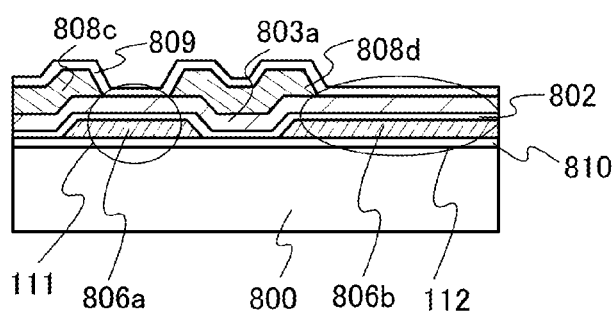
Figure 38D:
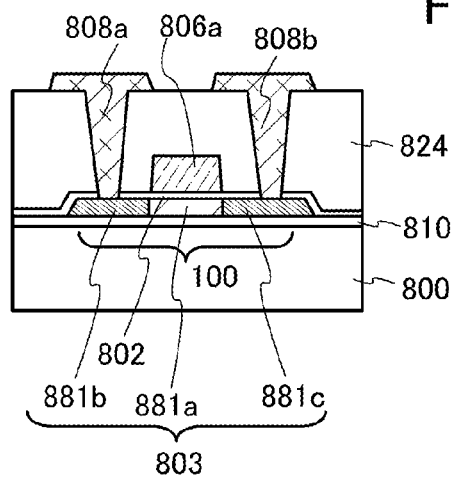

FIG. 38D illustrates an example in which the positions of the semiconductor layer 803 and the conductive layer 806a are changed in the transistor 100 having the structure in FIG. 37A so that the conductive layer 806a is provided over the semiconductor layer 803. The semiconductor layer 803 includes a channel formation region 881a overlapped with the conductive layer 806a functioning as the gate, and impurity regions 881b and 881c that contain an impurity element imparting conductivity with the channel formation region 881a placed therebetween. The conductive layer 808a functioning as one of the source and the drain and the conductive layer 808b functioning as the other of the source and the drain are provided over the insulating layer 824. In contact holes provided in the insulating layer 824, the conductive layer 808a is connected to the impurity region 881b and the conductive layer 808b is connected to the impurity region 881c.

Figure 38E:
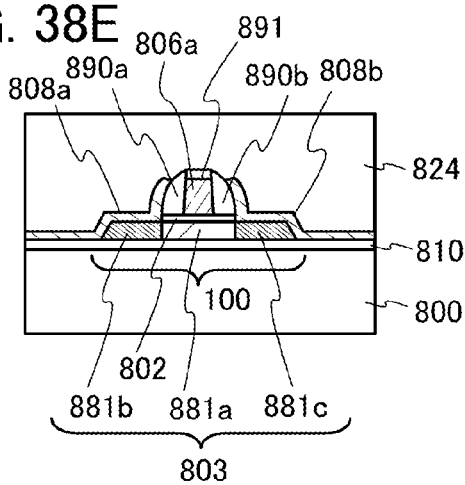

FIG. 38E illustrates an example in which insulators 890a and 890b functioning as sidewalls are provided around the conductive layer 806a functioning as the gate of the transistor 100 having the structure in FIG. 38D. An insulating layer 891 is provided above the conductive layer 806a here; alternatively, it is possible not to provide the insulating layer 891. The insulating layer 802 functioning as a gate insulating film is provided only in regions that are overlapped with the conductive layer 806a and the insulators 890a and 890b. The semiconductor layer 803 includes the channel formation region 881a overlapped with the conductive layer 806a functioning as the gate, and the impurity regions 881b and 881c that contain an impurity element imparting conductivity with the channel formation region 881a placed therebetween. The conductive layer 808a functioning as one of the source and the drain is in contact with the impurity region 881b. The conductive layer 808b functioning as the other of the source and the drain is in contact with the impurity region 881c.

Figure 38F:
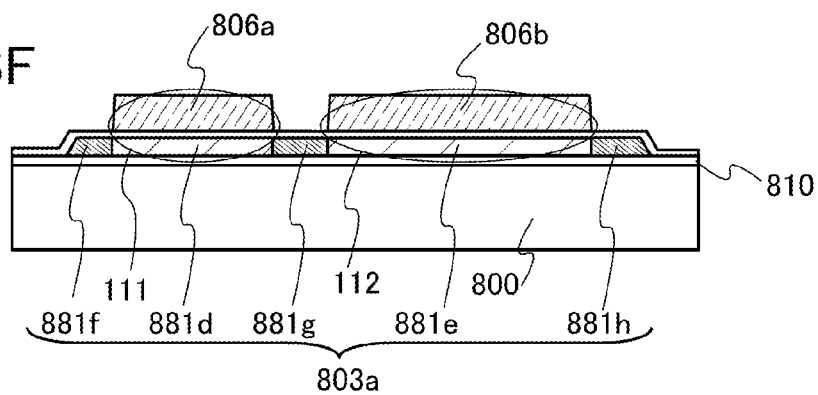

The structures of the capacitors 111 and 112 are not limited to those illustrated in FIG. 37B, and for example, can be those illustrated in FIGS. 38C and 38F.

In FIG. 38C, in the capacitor 111, the conductive layer 806a serves as one of a pair of electrodes, the semiconductor layer 803 serves as the other electrode, and the insulating layer 802 serves as a dielectric layer. In the capacitor 112, the conductive layer 806b serves as one of a pair of electrodes, the semiconductor layer 803 serves as the other electrode, and the insulating layer 802 serves as a dielectric layer.

In FIG. 38F, in the capacitor 111, the conductive layer 806a serves as one of a pair of electrodes, the semiconductor layer 803 serves as the other electrode, and the insulating layer 802 serves as a dielectric layer. In the capacitor 112, the conductive layer 806b serves as one of a pair of electrodes, the semiconductor layer 803 serves as the other electrode, and the insulating layer 802 serves as a dielectric layer. Note that a region 881d overlapped with the conductive layer 806a and a region 881e overlapped with the conductive layer 806b may or may not contain an impurity element imparting conductivity. In the semiconductor layer 803, regions that are not overlapped with the conductive layers 806a and 806b can be impurity regions 881f, 881g, and 881h that contain an impurity element imparting conductivity.

Semiconductor layers in which channels are formed in the transistors 11 to 14, the transistor 100, and the like and the semiconductor layer serving as one of a pair of electrodes of each of the capacitors 111 and 112 may be formed using an oxide semiconductor, single crystal silicon, polycrystalline silicon, amorphous silicon, an organic semiconductor, or a carbon nanotube.

For example, a transistor with a multi-gate structure having two or more gate electrodes can be used. With the multi-gate structure, channel regions are connected in series; accordingly, a plurality of transistors are connected in series. Thus, with the multi-gate structure, the amount of off-state current can be reduced and the withstand voltage (reliability) of the transistor can be increased. Alternatively, a transistor with the multi-gate structure can have a flat slope of voltage-current characteristics (which is the slope of the curve with drain-source voltage on the horizontal axis and drain-source current on the vertical axis) such that drain-source current does not change much even if drain-source voltage changes when the transistor operates in a saturation region. By utilizing the flat slope of the voltage-current characteristics, an ideal current source circuit or an active load with extremely high resistance can be achieved. Consequently, a differential circuit, a current mirror circuit, or the like having excellent properties can be fabricated.

For example, it is possible to use a transistor in which gate electrodes are provided above and below a channel region, that is, a transistor in which a channel region is sandwiched between gate electrodes. The structure where the gate electrodes are provided above and below the channel region is substantially equivalent to a circuit configuration in which a plurality of transistors are connected in parallel. Thus, the area of the channel region is increased, so that the amount of current flowing through the transistor can be increased. Alternatively, by employing the structure where gate electrodes are provided above and below the channel region, a depletion layer is easily formed; thus, the subthreshold swing (S value) can be reduced.

For example, it is possible to use a transistor with a structure where a gate electrode is formed above or below a channel region, a staggered structure, an inverted staggered structure, a structure where a channel region is divided into a plurality of regions, a structure where channel regions are connected in parallel or in series, or the like.

For example, a transistor can be formed using a variety of substrates, without limitation to a certain type. Examples of substrates are a semiconductor substrate (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate are a barium borosilicate glass substrate, an aluminoborosilicate glass substrate, and a soda lime glass substrate. For a flexible substrate, a flexible synthetic resin such as plastics typified by polyethylene terephthalate (PET), polyethylene naphthalate (PEN), and polyethersulfone (PES) or acrylic can be used, for example. Examples of an attachment film are attachment films formed using polypropylene, polyester, polyvinyl fluoride, polyvinyl chloride, and the like. Examples of a base material film are films formed using polyester, polyamide, and polyimide, an inorganic vapor deposition film, and paper. Specifically, when transistors are formed using a semiconductor substrate, a single crystal substrate, an SOI substrate, or the like, small-sized transistors with few variations in characteristics, size, shape, or the like and high current supply capability can be formed. By constituting a circuit using such transistors, power consumption of the circuit can be reduced or the circuit can be highly integrated.

Note that a transistor may be formed using one substrate and then transferred to another substrate. Example of a substrate to which a transistor is transferred are, in addition to the above-described substrates over which the transistor can be formed, a paper substrate, a cellophane substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and the like), a leather substrate, and a rubber substrate. By using such a substrate, transistors with excellent properties or transistors with low power consumption can be formed, a device with high durability or high heat resistance can be formed, or reduction in weight or thickness can be achieved.

An oxide semiconductor preferably contains at least indium (In) or zinc (Zn). In particular, an oxide semiconductor preferably contains In and Zn. In addition, as a stabilizer for reducing variations in electric characteristics of transistors using the oxide semiconductor, the oxide semiconductor preferably contains gallium (Ga), tin (Sn), hafnium (Hf), and/or aluminum (Al).

As another stabilizer, the oxide semiconductor may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and/or lutetium (Lu).

As the oxide semiconductor, any of the following oxides can be used, for example: indium oxide, tin oxide, zinc oxide, two-component metal oxides such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxides such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component oxides such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Here, for example, an In—Ga—Zn-based oxide refers to an oxide containing In, Ga, and Zn, and there is no limitation on the composition ratio of In, Ga, and Zn. The In—Ga—Zn-based oxide may contain a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

Without limitation to the materials given above, a material with an appropriate composition can be used depending on needed semiconductor characteristics (e.g., mobility, threshold voltage, and variation). In order to obtain needed semiconductor characteristics, it is preferable that the carrier density, impurity concentration, defect density, atomic ratio between a metal element and oxygen, interatomic distance, density, and the like be set to appropriate values.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

Embodiment 8

Figure 48A:
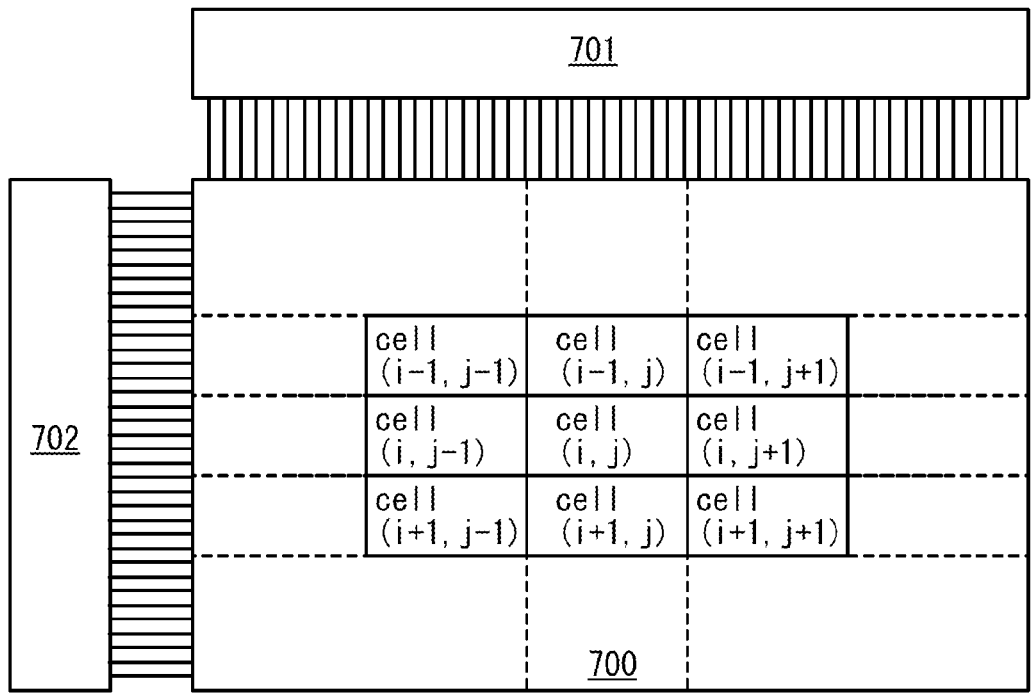
FIGS. 48A and 48B are block diagrams each illustrating the structure of a semiconductor device.

The basic circuit described in the above embodiment can be used as a pixel in a semiconductor device such as a light-emitting device or a display device. One example is illustrated in FIG. 48A.

A semiconductor device can include a pixel portion 700 including a plurality of pixels and driver circuits 701 and 702 for driving the pixel portion. The driver circuits 701 and 702 have a function of outputting signals to wirings included in the basic circuits constituting the pixels. As each of the driver circuits 701 and 702, a driver circuit with a known configuration can be freely used.

Figure 48B:
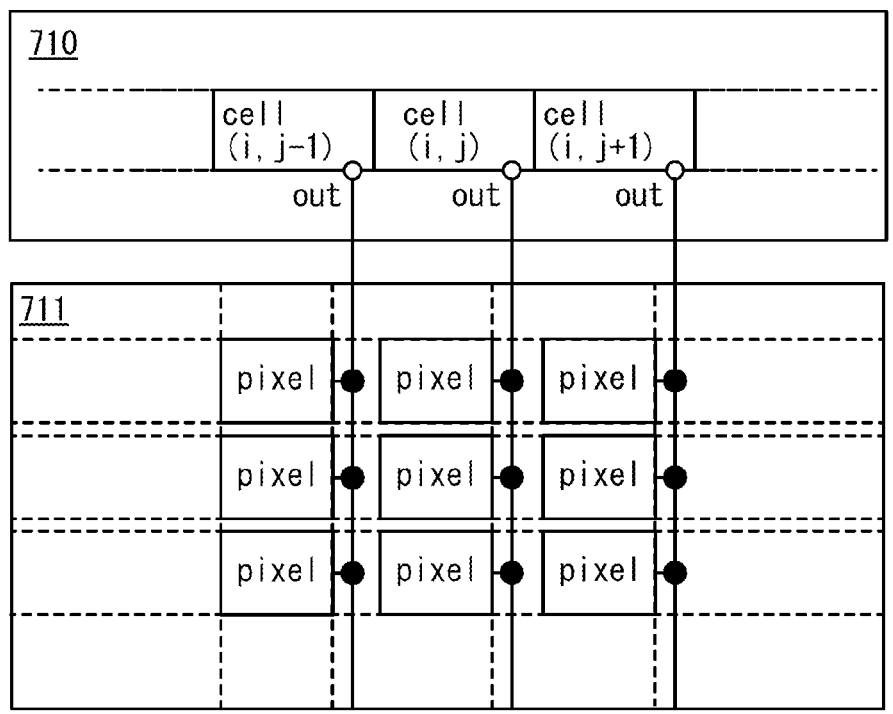

The basic circuit described in the above embodiment can be used in a driver circuit (or part thereof) for driving pixels in a semiconductor device such as a light-emitting device or a display device. One example is illustrated in FIG. 48B.

A semiconductor device can include a pixel portion 711 including a plurality of pixels (each represented by "pixel" in FIG. 48B) and a driver circuit 710 for driving the pixel portion. The driver circuit 710 can include a plurality of basic circuits (cells). Note that the basic circuit (cell) in FIG. 48B does not include the load 200 or the light-emitting element 201 shown in the above embodiments, and the pixel can be considered to correspond to the load 200 or the light-emitting element 201. In other words, an output "out" of the driver circuit 710 corresponds to the source of the transistor 100 in the basic circuit (cell).

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

Embodiment 9

Figure 49A:
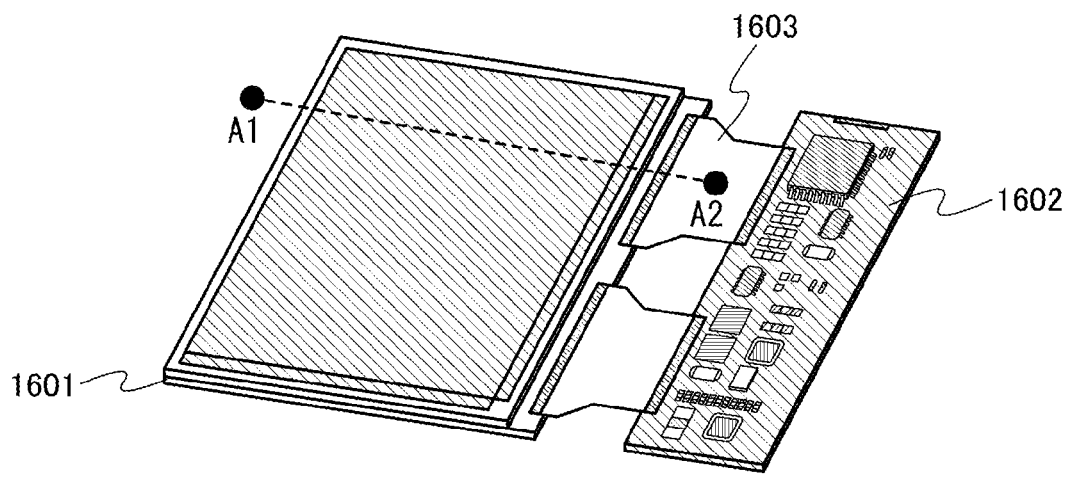
FIGS. 49A and 49B are a perspective view and a cross-sectional view illustrating the structure of a semiconductor device.

FIG. 49A is an example of a perspective view of a semiconductor device according to one embodiment of the present invention.

The semiconductor device illustrated in FIG. 49A includes a display portion 1601, a circuit board 1602, and connection units 1603. The basic circuit described in the above embodiment can be used in the display portion 1601.

The circuit board 1602 is provided with an image processing unit, from which various signals and power supply potentials are input to the display portion 1601 through the connection units 1603. As the connection unit 1603, a flexible printed circuit (FPC) can be used, for example. Alternatively, a COF tape can be used as the connection unit 1603, in which case part of circuits in the image processing unit or part of driver circuits included in the display portion 1601 may be formed over a separately prepared chip and the chip may be electrically connected to the COF tape by a chip on film (COF) method.

Figure 49B:
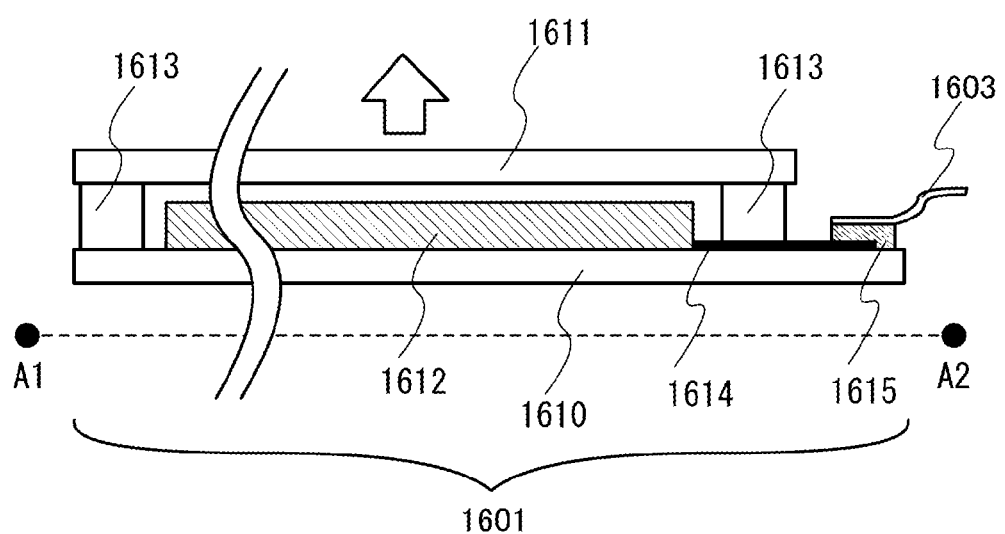

FIG. 49B is a cross-sectional view along line A1-A2 in FIG. 49A. The display portion 1601 can include a substrate 1610, a substrate 1611, a sealant 1613 for bonding the substrates 1610 and 1611 together, a pixel portion 1612 including a plurality of pixels, a wiring 1614 for transmitting signals to the pixel portion 1612, and an anisotropic conductive resin 1615 for connecting the wiring 1614 and the connection unit 1603. Light generated from the pixel portion 1612 can be emitted in the direction indicated by an arrow in FIG. 49B, for example.

This embodiment is obtained by performing change, addition, modification, removal, application, superordinate conceptualization, or subordinate conceptualization on part or all of another embodiment. Thus, part or all of this embodiment can be freely combined with, applied to, or replaced with part or all of another embodiment.

EXAMPLE

Figure 50A:
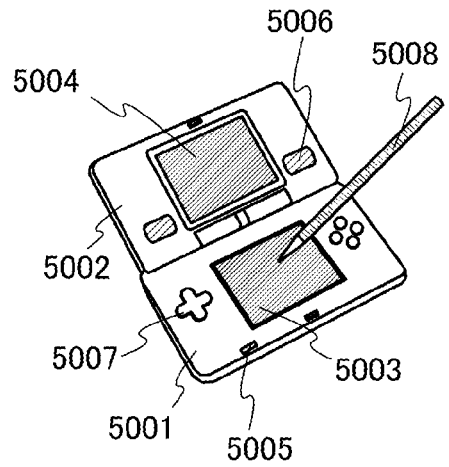
FIGS. 50A to 50C each illustrate the structure of an electronic device.
Figure 50B:
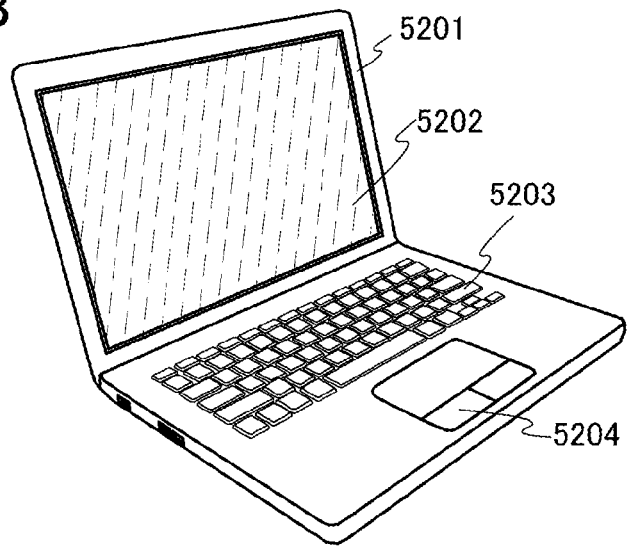
Figure 50C:
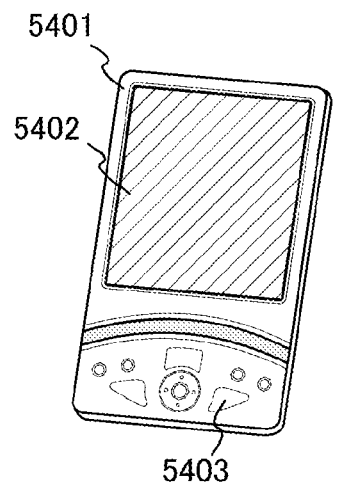

The semiconductor device according to one embodiment of the present invention can be used for a variety of electronic devices. Examples of electronic devices are personal computers (e.g., laptop computers and desktop computers), image reproducing devices provided with recording media (typically, devices that reproduce the content of recording media such as digital versatile discs (DVDs) and have displays for displaying the reproduced images), mobile phones, portable game consoles, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 50A to 50C illustrate some specific examples of these electronic devices.

FIG. 50A illustrates a portable game console including a housing 5001, a housing 5002, an image display portion 5003, an image display portion 5004, a microphone 5005, a speaker 5006, an operation key 5007, a stylus 5008, and the like. The semiconductor device according to one embodiment of the present invention can be used in the image display portion 5003 or the image display portion 5004. The use of the semiconductor device according to one embodiment of the present invention in the image display portion 5003 or the image display portion 5004 can achieve a portable game console with high image quality. Note that although the portable game console in FIG. 50A includes the two image display portions 5003 and 5004, the number of image display portions included in the portable game console is not limited to two.

FIG. 50B illustrates a laptop personal computer including a housing 5201, an image display portion 5202, a keyboard 5203, a pointing device 5204, and the like. The semiconductor device according to one embodiment of the present invention can be used in the image display portion 5202. The use of the semiconductor device according to one embodiment of the present invention in the image display portion 5202 can achieve a laptop personal computer with high image quality.

FIG. 50C illustrates a personal digital assistant including a housing 5401, an image display portion 5402, operation keys 5403, and the like. The semiconductor device according to one embodiment of the present invention can be used in the image display portion 5402. The use of the semiconductor device according to one embodiment of the present invention in the image display portion 5402 can achieve a personal digital assistant with high image quality.

As described above, the applicable range of the present invention is so wide that the present invention can be applied to electronic devices in a variety of fields.

This example is obtained by performing change, addition, modification, removal, application, superordinate conceptualization, or subordinate conceptualization on part or all of another embodiment. Thus, part or all of this example can be freely combined with, applied to, or replaced with part or all of another embodiment.

Note that in this specification and the like, in a diagram or a text described in one embodiment (or example), it is possible to take out part of the diagram or the text and construct an embodiment of the invention. Thus, the context taken out from part of a diagram or a text related to a certain portion is also disclosed as an embodiment of the invention, and one embodiment of the invention can be constructed. Consequently, for example, in a diagram or a text including one or more of active elements (e.g., transistors and diodes), wirings, passive elements (e.g., capacitors and resistors), conductive layers, insulating layers, semiconductor layers, organic materials, inorganic materials, components, devices, operation methods, fabrication methods, and/or the like, it is possible to take out part of the diagram or the text and construct one embodiment of the invention. For example, from a circuit diagram in which N circuit elements (such as transistors or capacitors, where N is an integer) are provided, M circuit elements (such as transistors or capacitors, where M is an integer smaller than N) can be taken out to construct one embodiment of the invention. As another example, from a cross-sectional view in which N layers (N is an integer) are provided, M layers (M is an integer, where M<N) can be taken out to construct one embodiment of the invention. As another example, from a flow chart in which N elements (N is an integer) are provided, M elements (M is an integer, where M<N) can be taken out to construct one embodiment of the invention.

Note that in the case where at least one specific example is described in a diagram or a text described in one embodiment (or example) in this specification and the like, it will be readily appreciated by those skilled in the art that a broader concept of the specific example can be derived. Therefore, in the case where at least one specific example is described in the diagram or the text described in one embodiment (or example), a broader concept of the specific example is disclosed as an embodiment of the invention, and one embodiment of the invention can be constituted.

Note that in this specification and the like, a content described in at least a diagram (which may be part of the diagram) is disclosed as an embodiment of the invention, and one embodiment of the invention can be constituted. Therefore, when a certain content is described in a diagram, the content is disclosed as an embodiment of the invention even when the content is not described with a text, and one embodiment of the invention can be constituted. In a similar manner, part of a diagram, which is taken out from the diagram, is disclosed as an embodiment of the invention, and one embodiment of the invention can be constituted.

This application is based on Japanese Patent Applications serial No. 2011-196863 filed with Japan Patent Office on Sep. 9, 2011, the entire contents of which are hereby incorporated by reference.

What is claimed is:

1. A semiconductor device comprising:
a first transistor;
a load;
a first wiring;
a second wiring;
a first switch;
a second switch;
a third switch;
a fourth switch;
a first capacitor; and
a second capacitor,
wherein the first switch is configured to select conduction or non-conduction between the first wiring and one of a pair of electrodes of the first capacitor,
wherein the one of the pair of electrodes of the first capacitor is electrically connected to one of a pair of electrodes of the second capacitor,
wherein the second switch is configured to select conduction or non-conduction between the other of the pair of electrodes of the first capacitor and one of a source and a drain of the first transistor,
wherein the other of the pair of electrodes of the first capacitor is electrically connected to a gate of the first transistor,
wherein the third switch is configured to select conduction or non-conduction between the one of the pair of electrodes of the first capacitor and the other of the source and the drain of the first transistor,
wherein the other of the pair of electrodes of the second capacitor is electrically connected to the load,
wherein the other of the source and the drain of the first transistor is electrically connected to the load, and
wherein the fourth switch is configured to select conduction or non-conduction between the second wiring and the one of the source and the drain of the first transistor.

2. The semiconductor device according to claim 1, wherein the load is an EL element.

3. The semiconductor device according to claim 1, wherein a channel of the first transistor is formed using an oxide semiconductor layer.

4. The semiconductor device according to claim 1, wherein any one of the first switch, the second switch, the third switch, and the fourth switch is an electrical switch or a mechanical switch.

5. The semiconductor device according to claim 4, wherein the electrical switch is a second transistor.

6. The semiconductor device according to claim 5, wherein a channel of the second transistor is formed using an oxide semiconductor layer.

7. An electronic device comprising the semiconductor device according to claim 1.

8. A semiconductor device comprising:
an n-channel transistor;
a light-emitting element;
a first wiring;
a driver circuit configured to control a potential of the first wiring;
a second wiring;
a first switch;
a second switch;
a third switch;
a fourth switch;
a first capacitor; and
a second capacitor,
wherein the first switch is configured to select conduction or non-conduction between the first wiring and one of a pair of electrodes of the first capacitor,
wherein the one of the pair of electrodes of the first capacitor is electrically connected to one of a pair of electrodes of the second capacitor,
wherein the second switch is configured to select conduction or non-conduction between the other of the pair of electrodes of the first capacitor and one of a source and a drain of the n-channel transistor,
wherein the other of the pair of electrodes of the first capacitor is electrically connected to a gate of the n-channel transistor, wherein the third switch is configured to select conduction or non-conduction between the one of the pair of electrodes of the first capacitor and the other of the source and the drain of the n-channel transistor, wherein the other of the pair of electrodes of the second capacitor is electrically connected to an anode of the light-emitting element, wherein the other of the source and the drain of the n-channel transistor is electrically connected to the anode of the light-emitting element, wherein the fourth switch is configured to select conduction or non-conduction between the second wiring and the one of the source and the drain of the n-channel transistor, and wherein the driver circuit controls the potential of the first wiring so that a period during which the potential of the first wiring is equal to or lower than a potential of a cathode of the light-emitting element is provided.

9. The semiconductor device according to claim 8, wherein the load is an EL element.

10. The semiconductor device according to claim 8, wherein a channel of the n-channel transistor is formed using an oxide semiconductor layer.

11. The semiconductor device according to claim 8, wherein any one of the first switch, the second switch, the third switch, and the fourth switch is an electrical switch or a mechanical switch.

12. The semiconductor device according to claim 11, wherein the electrical switch is a transistor.

13. The semiconductor device according to claim 12, wherein a channel of the transistor is formed using an oxide semiconductor layer.

14. An electronic device comprising the semiconductor device according to claim 8.

15. A semiconductor device comprising:
a p-channel transistor;
a light-emitting element;
a first wiring;
a driver circuit configured to control a potential of the first wiring;
a second wiring;
a first switch;
a second switch;
a third switch;
a fourth switch;
a first capacitor; and
a second capacitor, wherein the first switch is configured to select conduction or non-conduction between the first wiring and one of a pair of electrodes of the first capacitor, wherein the one of the pair of electrodes of the first capacitor is electrically connected to one of a pair of electrodes of the second capacitor, wherein the second switch is configured to select conduction or non-conduction between the other of the pair of electrodes of the first capacitor and one of a source and a drain of the p-channel transistor, wherein the other of the pair of electrodes of the first capacitor is electrically connected to a gate of the p-channel transistor, wherein the third switch is configured to select conduction or non-conduction between the one of the pair of electrodes of the first capacitor and the other of the source and the drain of the p-channel transistor, wherein the other of the pair of electrodes of the second capacitor is electrically connected to a cathode of the light-emitting element, wherein the other of the source and the drain of the p-channel transistor is electrically connected to the cathode of the light-emitting element, wherein the fourth switch is configured to select conduction or non-conduction between the second wiring and the one of the source and the drain of the p-channel transistor, and wherein the driver circuit controls the potential of the first wiring so that a period during which the potential of the first wiring is equal to or higher than a potential of an anode of the light-emitting element is provided.

16. The semiconductor device according to claim 15, wherein the load is an EL element.

17. The semiconductor device according to claim 15, wherein any one of the first switch, the second switch, the third switch, and the fourth switch is an electrical switch or a mechanical switch.

18. The semiconductor device according to claim 17, wherein the electrical switch is a transistor.

19. The semiconductor device according to claim 18, wherein a channel of the transistor is formed using an oxide semiconductor layer.

20. An electronic device comprising the semiconductor device according to claim 15.

* * * * *

UNITED STATES PATENT AND TRADEMARK OFFICE
CERTIFICATE OF CORRECTION

PATENT NO. : 8,710,749 B2
APPLICATION NO. : 13/603908
DATED : April 29, 2014
INVENTOR(S) : Hajime Kimura Page 1 of 1

It is certified that error appears in the above-identified patent and that said Letters Patent is hereby corrected as shown below:

In the Specification,

Column 29, line 55, after "columns" insert --.--;

Column 30, line 5, replace "171" with --17I--;

Column 30, line 12, after "columns" insert --.--;

Column 38, line 15, replace "T13" with --T13'--.

Signed and Sealed this
Twenty-fifth Day of November, 2014

Michelle K. Lee
*Deputy Director of the United States Patent and Trademark Office*